(12) United States Patent
Chiruvolu et al.

(10) Patent No.: US 7,491,431 B2
(45) Date of Patent: Feb. 17, 2009

(54) DENSE COATING FORMATION BY REACTIVE DEPOSITION

(75) Inventors: Shivkumar Chiruvolu, San Jose, CA (US); Michael Edward Chapin, Sunnyvale, CA (US)

(73) Assignee: NanoGram Corporation, Miltipas, CA (US)

( * ) Notice: Subject to any disclaimer, the term of this patent is extended or adjusted under 35 U.S.C. 154(b) by 297 days.

(21) Appl. No.: 11/017,214

(22) Filed: Dec. 20, 2004

(65) Prior Publication Data

US 2006/0134347 A1 Jun. 22, 2006

(51) Int. Cl.
  *C23C 16/48* (2006.01)
  *C23C 16/448* (2006.01)
  *C23C 16/06* (2006.01)
  *C23C 16/22* (2006.01)
  *C23C 16/30* (2006.01)

(52) U.S. Cl. .................. 427/582; 427/583; 427/584; 427/586; 427/597

(58) Field of Classification Search .............. None
  See application file for complete search history.

(56) References Cited

U.S. PATENT DOCUMENTS

| | | | |
|---|---|---|---|
| 3,806,570 A | 4/1974 | Flamenbaum et al. |
| 3,883,336 A | 5/1975 | Randall |
| 3,923,484 A | 12/1975 | Randall |
| 3,932,162 A | 1/1976 | Blankenship |
| 3,934,061 A | 1/1976 | Keck et al. |
| 4,011,067 A | 3/1977 | Carey, Jr. |
| 4,038,370 A | 7/1977 | Tokimoto et al. |
| 4,113,844 A | 9/1978 | Tokimoto et al. |
| 4,119,509 A | 10/1978 | Szoke |
| 4,140,912 A | 2/1979 | Bressan et al. |
| 4,581,248 A | 4/1986 | Roche |
| 4,681,640 A | 7/1987 | Stanley |
| 4,735,677 A | 4/1988 | Kawachi et al. |
| 4,782,787 A | 11/1988 | Roche |
| 4,814,289 A | 3/1989 | Baeuerle |

(Continued)

FOREIGN PATENT DOCUMENTS

GB 2185494 A 7/1987

(Continued)

OTHER PUBLICATIONS

Barbarossa et al., "Effect of temperature gradient on sintering kinetics of doped silica waveguides by flame hydrolysis deposition", SPIE vol. 1794 Integrated Optical Circuits II, pp. 191-197, 1992, no month.

(Continued)

*Primary Examiner*—Marianne L Padgett
(74) *Attorney, Agent, or Firm*—Dardi & Associates, PLLC; Peter S. Dardi

(57) ABSTRACT

Methods for forming coated substrates can be based on depositing material from a flow onto a substrate in which the coating material is formed by a reaction within the flow. In some embodiments, the product materials are formed in a reaction driven by photon energy absorbed from a radiation beam. In additional or alternative embodiments, the flow with the product stream is directed at the substrate. The substrate may be moved relative to the flow. Coating materials can be formed with densities of 65 percent to 95 percent of the fully densified coating material with a very high level of coating uniformity.

24 Claims, 16 Drawing Sheets

U.S. PATENT DOCUMENTS

| | | | |
|---|---|---|---|
| 4,868,005 | A | 9/1989 | Ehrlich et al. |
| 4,986,214 | A * | 1/1991 | Zumoto et al. ............... 118/722 |
| 5,043,548 | A | 8/1991 | Whitney |
| 5,060,595 | A | 10/1991 | Ziv et al. |
| 5,085,166 | A | 2/1992 | Oka et al. |
| 5,108,952 | A | 4/1992 | Matsuhashi |
| 5,174,826 | A | 12/1992 | Mannava et al. |
| 5,246,745 | A | 9/1993 | Baum et al. |
| 5,276,012 | A | 1/1994 | Ushida et al. |
| 5,306,447 | A | 4/1994 | Marcus et al. |
| 5,328,514 | A * | 7/1994 | Inoue et al. ................. 118/722 |
| 5,385,594 | A | 1/1995 | Kanamori et al. |
| 5,514,350 | A | 5/1996 | Kear et al. |
| 5,547,716 | A | 8/1996 | Thaler |
| 5,551,966 | A | 9/1996 | Hirose et al. |
| 5,556,442 | A | 9/1996 | Kanamori et al. |
| 5,622,750 | A | 4/1997 | Kilian et al. |
| 5,652,021 | A | 7/1997 | Hunt et al. |
| 5,744,777 | A | 4/1998 | Bernecki et al. |
| 5,770,126 | A | 6/1998 | Singh et al. |
| 5,858,465 | A | 1/1999 | Hunt et al. |
| 5,863,604 | A | 1/1999 | Hunt et al. |
| 5,874,134 | A | 2/1999 | Rao et al. |
| 5,885,904 | A | 3/1999 | Mehta et al. |
| 5,938,979 | A | 8/1999 | Kambe et al. |
| 5,958,348 | A | 9/1999 | Bi et al. |
| 5,997,956 | A | 12/1999 | Hunt et al. |
| 6,011,981 | A | 1/2000 | Alvarez et al. |
| 6,013,318 | A | 1/2000 | Hunt et al. |
| 6,032,871 | A | 3/2000 | Borner et al. |
| 6,074,888 | A | 6/2000 | Tran et al. |
| 6,097,144 | A | 8/2000 | Lehman |
| 6,254,928 | B1 | 7/2001 | Doan |
| 6,280,802 | B1 | 8/2001 | Akedo et al. |
| 7,108,894 | B2 * | 9/2006 | Renn .......................... 427/596 |
| 7,311,947 | B2 * | 12/2007 | Dando et al. ................ 427/596 |
| 2002/0179564 | A1 * | 12/2002 | Geobegan et al. ............. 216/7 |
| 2003/0228415 | A1 * | 12/2003 | Bi et al. ...................... 427/180 |

FOREIGN PATENT DOCUMENTS

| | | |
|---|---|---|
| JP | 02088775 | 3/1990 |
| JP | 5313221 | 11/1993 |
| JP | 6116743 | 4/1994 |
| JP | 10-280152 | 10/1998 |
| JP | 2000-212766 | 8/2000 |
| WO | WO 99/23189 | 5/1999 |
| WO | WO 99/61244 | 12/1999 |
| WO | WO 00/26151 | 5/2000 |
| WO | WO 02/32588 | 4/2002 |

OTHER PUBLICATIONS

Barbarossa et al., "High-silica cascaded three-waveguide couplers for wideband filtering by Flam Hydrolysis on Si", SPIE vol. 1583 Integrated Optical Circuits, pp. 122-128, 1991, no month.

Barbarossa et al., "Optical damage threshold of $P_2O_5$ and $GeO_2$-$P_2O_5$-doped silica waveguides", SPIE vol. 1794 Integrated Optical Circuits II, pp. 185-190, 1992, no month.

Barbarossa et al., "High-silica low-loss three waveguide couplers on Si by Flame Hydrolysis Deposition", SPIE vol. 1513 Glasses for Optoelectronics II, pp. 37-43, 1991, no month.

Besling et al., Laser-Induced Chemical Vapor Deposition of Nanostructured Silicon Carbonitride Thin Films, pp. 544-553, Laboratory for Applied Inorganic Chemistry, Delft University of Technology, Julianalaan 136, 2628 BL Delft, The Netherlands. J. Appl. Phys.83(1), Jan. 1, 1998.

Bilenchi et al., $CO_2$ Laser-Assisted Deposition of Boron and Phosphorus-Doped Hydrogenated Amorphous Silicon, American Institute of Physics 1985, pp. 279-281, Appl. Phys. Lett.47(3) Aug. 1.

Bilenchi et al., Hydrogenated Amorphous Silicon Growth by $CO_2$ Laser Photodissociation of Silane, American Institute of Physics 1982, pp. 6479-6481, J.Appl.Phys.53(9) September.

Bornard et al., $LiNbO_3$ Thin Films Deposited on Si Substrates: a Morphological Development Study, Materials Chemistry and Physics, pp. 571-577, Elsevier Science B.V. 2002, no month vol. 77.

Center for Nano Particle Control, Website Mansoo CHOI, Associate Professor of Mechanized Engineering, Seoul National University, Jun. 2000.

Ichinose et al., Deposition of $LaMO_3$ (M=Co, Cr, Al) Films by Spray Pyrolysis in Inductively Coupled Plasma, Journal of Crystal Growth, pp. 59-64, Elsevier Science B.V. 1994, no month.

Ichinose et al., Deposition of $LaMO_3$ (M=Co, Cr, Al)-Oriented Films by Spray Combustion Flame Technique, Jpn. J. Appl. Phys. vol. 33 (1994), pp. 5907-5910, part 1,No. 10 October.

Jervis, Metal Film Deposition by Gas-Phase Laser Pyrolysis of Nickel Tetracarbonyl, American Institute of Physics 1985, pp. 1400-1401, J.Appl.Phys.58(3) , Aug. 1.

Kim et al., Deposition of MgO Thin Films by Modified Electrostatic Spray Pyrolysis Method, Thin Solid Films 376 (2000), pp. 110-114, Elsevier Science S.A. 2000, no month.

Lebedev et al., "Laser distillation-deposition synthesis of silica glasses with variable concentrations of oxygen deficient centers", SPIE vol. 2498, pp. 65-71, 1995, no month.

Liang et al., "Laser synthesize silicon-based and ferro-based nano powders", SPIE vol. 3862, pp. 17-21, 1999, no month.

Magee et al., Laser-Induced Conversion of Molecular Precursors to Thin Films and Deposited Layers, American Chemical Society 1990, pp. 232-235, Chem.Mater. vol. 2, no month.

Maric et al., Electrolyte Materials for Intermediate Temperature Fuel Cells Produced via Combustion Chemical Vapor Condensation, Electrochemical and Solid-State Letters, 6(5) 2003, pp. A91-A95, no month.

Maxwell, "Photosensitivity & rare-earth doping in flame hydrolysis deposited planar silica waveguides", SPIE vol. 2695, pp. 16-29, 1996, no month.

Meunier et al., Hydrogenated Amorphous Silicon Produced by Laser Induced Chemical Vapor Deposition of Silane, American Institute of Physics 1983, pp. 273-275, Appl.Phys.Lett.43(3) Aug. 1.

Meunier et al., Laser-Induced Chemical Vapor Deposition of Hydrogenated Amorphous Silicon. I. Gas-Phase Process Model, American Institute of Physics 1987, pp. 2812-2821, J.Appl.Phys.62(7),Oct. 1, 1987.

Meunier et al., Laser-Induced Chemical Vapor Deposition of Hydrogenated Silicon II. Film Properties, American Institute of Physics 1987, pp. 2822-2829, J.Appl. Phys. 62(7) Oct. 1, 1987.

Oljaca et al., Deposition of $Ba_xSr_{1-x}TiO_3$ in Atmospheric Pressure Flame: Combustion Monitoring and Optimization of Thin Film Properties, Surface Engineering, vol. 19, No. 1, 2003, pp. 51-57, no month.

Rabii et al., "Recent advances in the fabrication of hollow glass waveguides", SPIE vol. 3262, pp. 103-107, 1998, no month.

Sun et al., "Building passive components with silica waveguides", SPIE vol. 3795, pp. 313-319, 1999, July.

Vukasinovic et al., Closed Loop Controlled Deposition of $Ba_xSr_{1-x}TiO_3$ Thin Films in Spray Flames, Surface Engineering, vol. 19, No. 3, 2003, pp. 179-184, no month.

"A New Ceramic Coating Technique for SOFC Using the ETL Laser Spraying Process", Tsukamoto, et al., Solid State Ionics, 40/41 (1990), 1003-1006, no month.

* cited by examiner

DENSE COATING FORMATION BY REACTIVE DEPOSITION

FIELD OF THE INVENTION

The invention relates to the formation of a coating on the surface of a substrate, for example, for eventual formation of functional materials, such as dielectric materials, optical, electrical, electronic-devices or power cell components. In particular, the invention relates to highly uniform coatings on substrates and to efficient and rapid ways of forming highly uniform coatings.

BACKGROUND OF THE INVENTION

The incorporation or integration of mechanical, electrical and optical components into integral devices has created enormous demands on material processing. Furthermore, the individual components integrated in the devices are shrinking in size, for certain application. At the same time, performance expectations are increasing. Therefore, there is considerable interest in the formation of specific compositions applied to substrates with desired selected compositions and properties. Interest in forming highly uniform materials for these coatings has sparked the development of corresponding processes.

As a particular example, optical components can be integrated onto a planar chip-type base similar to an electronic integrated circuit. By placing the optical components onto an integrated chip such as a silicon wafer, many optical components can be squeezed into a very small footprint. For the mass production of these integrated optical chips, existing semiconductor technology, such as lithography and dry etching, can be involved advantageously in appropriate steps of the production process. Other optical applications include, for example, formation of displays and the like. Similarly, integrated electrical components can be formed along a substrate surface and may involve crystalline and/or amorphous materials. Certain dielectric materials can have electrical and/ or optical applications.

Electrochemical cells in general involve reduction-oxidation reactions in separated half-cells that are appropriately connected for ionic flow as well as electron flow across an external circuit. Batteries and fuel cell produce useful work in the form of the electron flow across a load generated from the reduction-oxidation reactions. In other electrochemical cells, a load is applied to the cell to induce desired chemical reactions at the electrodes to form desired chemical products. Fuel cells differ from batteries in that both the reducing agent and the oxidizing agent can be replenished without dismantling the cell. Fuel cells and in some cases batteries can comprise individual cells stacked in series to increase the resulting voltage. Adjacent cells connected in series can have an electrically conductive plate, e.g., a bipolar plate or electrical interconnect, linking adjacent cells. Since the reactants of a fuel cell can be replenished, appropriate flow paths can be integrated into the cell.

Several types of fuel cells have gained recognition as distinct classes of fuel cells that are distinguishable from each other due to the nature of their construction and the materials used in their construction. Particular fuel cell designs introduce specific challenges in material performances. Common features generally found in different fuel cell designs involve the flow of fuel and oxidizing agent for long-term performance with appropriate design consideration for heat management, electrical connection and ionic flow. Different fuel cell designs differ from each other in the construction of the electrodes and/or electrolyte, which separates the electrodes, and in some cases the particular fuel. Many fuel cell designs operate with hydrogen gas, $H_2$, although some fuel cells can operate with other fuels, such as methanol or methane. Coatings can be useful for the formation of functional and/or structure components of fuel cells.

Several approaches have been used and/or suggested for the commercial deposition of the functional coating materials. These approaches include, for example, flame hydrolysis deposition, chemical vapor deposition, physical vapor deposition, sol-gel chemical deposition and ion implantation. Flame hydrolysis deposition has become the leader for commercial implementation of planar optical waveguides. Flame hydrolysis and forms of chemical vapor deposition have also been successful in the production of glass fibers for use as fiber optic elements. Flame hydrolysis deposition involves the use of a hydrogen-oxygen flame to react gaseous precursors to form particles of the optical material as a coating on the surface of the substrate. Subsequent heat treatment of the coating can result in the formation of a uniform optical material, which generally is a glass material.

Flame hydrolysis deposition is efficient, but cannot be easily adapted to obtain more uniform coatings. Chemical vapor deposition involves the deposition of radicals, molecules and/or atoms onto the substrate surface rather than particles. Chemical vapor deposition can achieve very uniform materials, but the process is extremely slow. If attempts are made to increase the rates using chemical vapor deposition, the film quality is compromised, which reduces the advantage of the chemical vapor deposition process for applications in which uniformity is an important criterion.

At the same time, approaches have been developed using laser pyrolysis for the production of highly uniform submicron and nanoscale particles with a wide range of compositions. Highly uniform particles are desirable for the fabrication of a variety of devices including, for example, batteries, polishing compositions, catalysts, and phosphors for optical displays. Laser pyrolysis involves an intense light beam that drives the chemical reaction of a reactant stream to form highly uniform particles following the rapid quench of the stream after leaving the laser beam.

SUMMARY OF THE INVENTION

In a first aspect, the invention pertains to a method for coating a substrate, the method comprising the reacting a flowing reactant stream to produce a product stream and directing the product stream at a substrate. The reaction of the reactant stream is performed by directing a radiation beam at the reactant stream to produce a product stream downstream from the radiation beam within the flow. The reaction is driven by energy from the radiation beam. The substrate is selectively positioned in the flow such that the direction of the product stream coats the substrate with a coating material from the product stream at a density of at least about 65 percent of the density of the fully densified coating material.

In another aspect, the invention pertains to a method for coating a substrate in which the method comprises depositing a non-porous coating by directing flow of a product stream to a suitably positioned substrate to deposit the coating on the substrate. The product stream is formed by reacting a reactant stream within the flow in which the reaction is driven with photon energy absorbed from a radiation beam.

In a further aspect, the invention pertains to a method for coating a substrate, the method comprising depositing a coating material to form a coating having a density of at least about 65 percent of the density of the fully densified coating material. The coating deposition involves depositing a product composition in a reactor. The product stream is formed by reacting a reactant stream within the flow in which the reaction is driven with photon energy absorbed from a radiation beam. In some embodiments, the depositing of the coating comprises moving the product stream relative to the substrate.

In an additional aspect, the invention pertains to a method for coating a substrate, the method comprising the step of depositing a coating material to form a coating having a density of at least about 65 percent of the density of the fully densified coating material. The coating can be deposited from a product composition in a reactor, in which the product composition is within a product stream is formed by reacting a reactant stream. The resulting coating can have a thickness across the coating within at least about 10% of the average coating thickness with a one centimeter edge exclusion. In some embodiments, the coating is deposited at a rate of at least about 5 grams per hour.

In other aspects, the invention pertains to a method for forming a densified inorganic coating on a substrate, the method comprising depositing a coating comprising an inorganic coating material and densifying to coating material to at least about 90 percent of the density of the fully densified coating material. The deposition of the coating is from a product stream in which the product stream is formed by reacting a reactant stream. The reaction is driven with photon energy absorbed from a light beam, and the coating, as depositied, has a density of at least about 65 percent of the density of the fully densified coating material. The densification to coating material to increase the density of the coating material by at least about 10 percent. The coating material is heated at a temperature that is no more than about 70 percent of the flow temperature of coating composition.

Furthermore, the invention pertains to a coated substrate comprising a coating covering at least a portion of a surface of the substrate wherein the coating has a density from about 65 percent to about 95 percent of the fully densified material. The coating can have a standard deviation in thickness across the substrate of less than about 10 percent of the average coating thickness with a 1 centimeter edge exclusion.

DETAILED DESCRIPTION OF THE INVENTION

Figure 1:
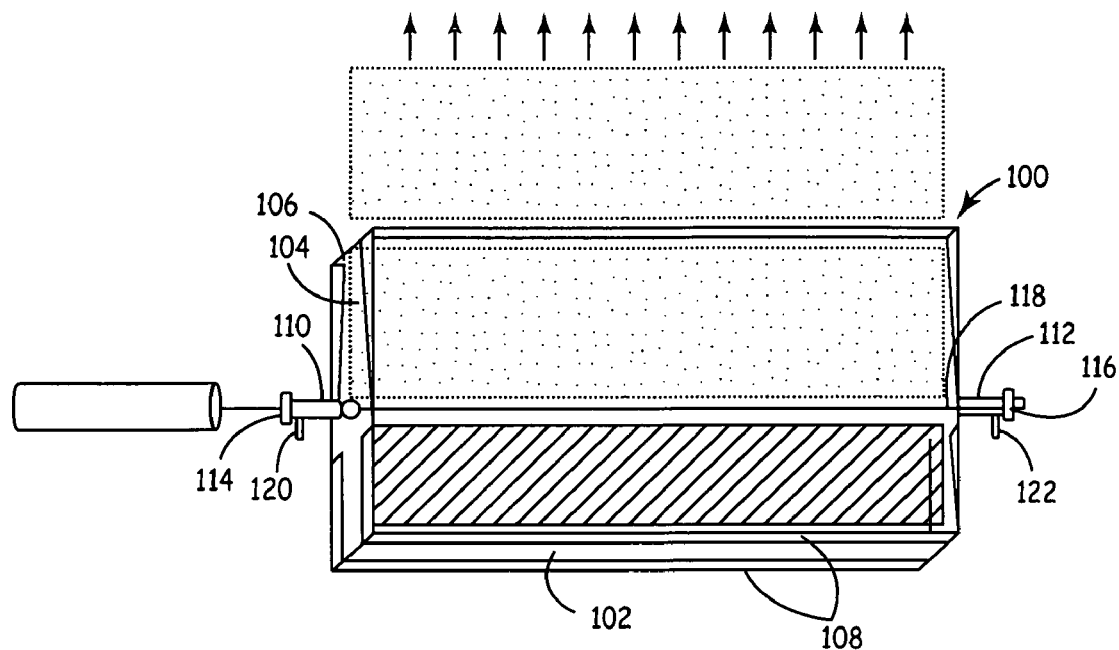
FIG. 1 is a side perspective view of a reaction chamber for performing laser pyrolysis synthesis of powders at high production rates.

A versatile coating approach described herein exploits advantages obtainable with using a reactive flow with the reaction driven with energy from a light beam in combination with the direct deposition of a relatively dense coating. In particular, reactive deposition from a flow with a reaction driven by a light beam have the capability of achieving high depositions rates for a wide range of compositions while having the capability of high uniformity with respect to both the coating morphology and material properties. Through the direct deposition of a relatively dense coating subsequent processing can be simplified and coating properties can be achieved that may be difficult to obtain through other processes. For example, direct deposition enables the deposition of coating of compounds with flow temperatures higher than the melting or deformation temperatures of the substrate. Achieving desired coating microstructural and other properties also becomes possible by direct deposition. In particular, the direct formation of a densified material provides for distinct advantages for the deposition of crystalline materials, where properties such as grain-size, grain-orientation, texture and epitaxy can be selected to meet specific desired properties for the coating. For coating with amorphous materials, a high degree of control of film density can be achieved. Due to the capability of high rate deposition and versatility with respect to composition, these coating approaches are suitable for a range of applications from fuel cell components to electronics while being cost effective. The capability of achieving high uniformity using the coating process provides for forming high quality structures that can be patterned to form, for example, complex structures and/or integrated devices. Through the direct high rate deposition of dense coating that involve less subsequent processing, the process can be made very efficient.

The present approach is based on the realization that product vapor or clusters can be deposited directly as a dense material onto a substrate surface to form a dense coating. Thus, the coating conditions can be selected to directly form a desired dense coating possibly without applying any further processing to densify/consolidate the coating, although additional processing can still be performed to obtain desired coating properties. In particular, a coating material can be deposited at a density from about 65 percent density up to the full density of the fully densified material. In some embodiments, the resulting dense coating is a non-porous material with respect to gas absorption/adsorption. This process is in contrast with light reactive deposition described in copending U.S. patent application Ser. No. 09/715,935 to Bi et al., entitled "Coating Formation By Reactive Deposition," and Ser. No. 10/414,443 to Bi et al., entitled "Coating Formation By Reactive Deposition," both of which are incorporated herein by reference. In light reactive deposition, particles are formed within a reactive flow that are deposited as a soot or snow, e.g., a powder coating, with a relatively low density relative to the fully densified material, onto the substrate surface. Nevertheless, light reactive dense deposition is able to deposit a wide range of chemical compositions as a dense coating using the reactant delivery techniques developed for light reactive deposition.

For the processes described herein, it was discovered that the reaction conditions within a reactive flow can be selected to deposit directly a product vapor or product clusters that do not deposit as a powder coating, but instead deposit as a denser material. As described more fully below, the reaction parameters can be adjusted to deposit the denser material coating, for example, through the appropriate selection of the reactant/product flow parameters, the position of the substrate relative to the light reaction zone, the relative concentration of inert diluent gas and other reaction parameters. While not wanting to be limited by theory, it is thought that the denser coatings can result from the direct deposition of product vapor or small product clusters that have not formed into stable particles. The substrate surface can provide the necessary conditions for nucleation and heterogeneous film growth. However, it cannot be ruled out that particles, perhaps metastable, have formed that due to high temperatures coalesce into a material upon contact with the substrate surface. The distinction between a particle and a cluster may be somewhat arbitrary, but generally a particle can be considered as a structure with an average diameter of at least about 1 nanometer such that particles contain at least on the order of 100 atoms. Regardless of the precise mechanism, the entities depositing onto the surface are coalescing in the sense that coalesce to form the dense coating without having identifiable features relating to a primary particle size.

Both the present approach (light reactive dense deposition) and light reactive deposition, differ from other light/laser based deposition approaches that have been termed laser-assisted chemical vapor deposition or the like. In laser-assisted chemical vapor deposition, the laser reacts a background gas within a chamber to form product composition that diffuses to the surface. Laser-assisted chemical vapor deposition is described further, for example, in U.S. Pat. No. 4,581,248 to Roche, entitled "Apparatus For Laser-Induced Chemical Vapor Deposition," incorporated herein by reference. In contrast, in light reactive dense deposition and light reactive deposition, the product is formed in a reactant stream, and the resulting product stream is directed to the substrate surface such that the flow intersects with the surface. By directing the flow to the substrate, significantly higher deposition rates can be achieved, and coating compositions, density and other properties can be controlled over a wide range of materials. Nevertheless, the coating properties can be comparable to chemical vapor deposition with respect to uniformity and smoothness. Also, in light reactive dense deposition, the substrate generally is moved relative to the flow during the deposition process to coat the entire substrate surface or a portion thereof from the product flow. The very high quality of coatings formed by light reactive deposition is described further in co-pending U.S. patent application Ser. No. 10/854,019 to Bi et al., entitled "High Rate Deposition of High Quality Optical Coatings," incorporated herein by reference, although in contrast with the present approaches for light reactive dense deposition, light reactive deposition involves a consolidation step following deposition of the coating, to form the dense coating.

In a flowing reaction system, reactive deposition driven by a radiation beam (e.g., a light beam) involves a reactor with a flowing reactant stream that intersects a radiation beam proximate a reaction zone to form a product stream configured for the deposition of product composition onto a surface. In some embodiments, the reactor apparatus, e.g., a light reactive deposition apparatus, includes an extended reactant inlet such that a stream of particles is generated within a flowing sheet forming a reactant/product stream. Generally, the reactant flow is oriented to intersect the radiation such that most or all of the reactant flow intersects with the radiation such that high yields are obtained. Using an extended reactant inlet, a line or stripe of particles at a high throughput can be, at least in part, simultaneously deposited onto a substrate. It has been discovered how to obtain high reactant throughput such that a high production rate can be maintained without sacrificing control of the product properties and/or corresponding uniformity of the deposited dense coating. However, in some embodiments lower deposition rates can be used in favor of obtaining desired coating forms on the surface since epitaxial growth or other processes may be favored by slower deposition rates.

More specifically, in a reactor with an elongated reactant inlet, production rates are readily achievable in the range(s) of at least about 50 grams per hour (g/h), as described further below. Corresponding high coating rates also can be achieved. These rates can be used to achieve dense coatings with a wide range of compositions and with high coating uniformity.

Light reactive dense deposition extends the capabilities of light reactive deposition into a domain in which dense coatings can be directly deposited from a reactive flow. Both light reactive dense deposition and light reactive deposition incorporate features of reactant delivery and a well defined and constrained light reaction zone that are common with laser pyrolysis. As described further below, the reactant delivery capabilities of laser pyrolysis provide for the synthesis of a wide range of material compositions. The constrained light reaction zone provides for a highly uniform product stream and for versatile control of reaction conditions.

For the production of particles, laser pyrolysis apparatuses have included a collector system to collect particles for subsequent use. The direct coating approach described herein is in contrast with collection on a porous filter for subsequent separation of the particles from the filter material. The present approaches for light reaction dense deposition, as with light reactive deposition, involve the direct coating onto a substrate without separate collection of the particles. Thus, the particles are never segregated as a particle collection prior to forming the coating on a substrate.

In light reactive dense deposition, reaction conditions and deposition parameters can be selected to deposit coalescing species onto the substrate. The coalescing species can be, for example, vapor reaction products, clusters, or meta-stable particles. The distinguishing feature of coalescing species is that they combine with like species on the surface of the substrate to form a relatively dense coating. The dense coating generally does not have features reflecting an underlying primary particle size. Thus, the coalescing species generally do not form a powder coating that manifests structure, such as particulate features or pores, corresponding to properties of particles that collect on the surface to form the powder coating. The substrate can be porous or non-porous, flexible or rigid, planar or curved. In some embodiments, the substrate can be heated during or prior to the deposition to reduce thermal stress of to stimulate compaction of the particles during the deposition prior to a subsequent melting process to facilitate coalescing of the particles into a dense layer. In contrast with light reactive dense deposition, light reactive deposition is directed to the formation of powder coatings.

The reactant flow generally is directed through a localized reaction zone to produce a product flow that is directed toward a substrate. The reaction zone includes the intersection of the reactant flow with a radiation, i.e., light, beam. In some embodiments of interest, the reactant inlet is elongated in one dimension to form a flowing sheet of reactants. The resulting product stream acts as a flat coating spray. Using an extended reactant inlet, a line of coating material can be simultaneously deposited. Also, a higher product production rate can be maintained without sacrificing control of the product properties or deposition uniformity. Thus, by depositing a line of material, the coating process can be performed more rapidly. The reaction zone can be enclosed in a coating chamber generally isolated from the ambient atmosphere. A pump can be connected to the coating chamber to maintain overall flow and an appropriate pressure through the system. The flow of reactants and inert diluents into the chamber establish the flow. While generally the coating chamber is isolated from the ambient environment, the coating environment can be open to the ambient environment is some embodiments.

To perform the coating process, the substrate is placed to intercept the product stream. Product species stick to the surface while the remaining flow and any remaining product species are carried away by the flow. The light beam can intersect with reactants at a reaction zone near the opening from the nozzle delivering the reactants. The substrate surface to be coated can be placed just beyond the reaction zone. The distance between the reaction zone and the nozzle and between the reaction zone and the substrate can be made adjustable. The appropriate distances can be evaluated empirically to form a desired dense coating with the particular reaction parameters. Generally, in these embodiments the product composition is deposited shortly after being produced and prior to the formation and quenching of product particles.

After the initial coating process, a relatively dense layer is located on the coated surface. If desired, additional layers of the same and/or a different coating material can be added sequentially. Also, as described further below, a particular layer or portion there of can be patterned. In some embodiments, the substrate with the dense coating can be heated to anneal and/or further densify the coating into a desired coating layer. Since the coating is formed relatively dense, the annealing and/or further densification can be performed at significantly lower temperatures than the melting, sintering or flow temperatures for the material and corresponding particles of the material. Similarly, the heating can be performed generally for less time than needed to consolidate a powder coating into a dense layer. Since the heating temperatures are low, generally a material deposited as an amorphous material remains amorphous and a material deposited as a crystalline material remains a polycrystalline material or a single crystal material following heating and cooling.

Light reactive flow processes, such as laser pyrolysis, light reactive deposition and light reactive dense deposition, share common features of a constrained flowing reactive stream that intersects a light beam at a light reaction zone to form a product stream downstream from the light reaction zone. In light reactive flow processes, a reactant stream is pyrolyzed by an intense light beam, such as a laser beam, which heats the reactants at a very rapid rate. While a laser beam is a convenient energy source, other intense, focused light sources can be used in light reactive deposition. The intense light source drives the reaction, in contrast with combustion reactions driven by heat from the chemical reaction itself. The energy from the light source drives the reaction even if the reaction is exothermic since the light energy results in completion of the reaction within a small reaction zone. Light reactive deposition can provide for formation of phases of materials that are difficult to form under thermodynamic equilibrium conditions.

Radiation-based reactive deposition incorporates features of a radiation-based process for driving the reaction of a flowing reactant stream to form product compositions into a direct coating process. When a reactive flow process incorporates an intense radiation, e.g., light, beam to drive the reaction for the production of particles rather than a coating, the radiation-based process for the production of powders, such as with submicron particles, in a flow is known as laser pyrolysis. In particular, a wide range of reaction precursors can be used to generate a reactant stream with compositions in gas, vapor and/or aerosol form, and a wide range of highly uniform product particles can be efficiently produced by laser pyrolysis.

A basic feature of successful application of light reactive dense deposition for the production of desired coating materials is production of a reactant stream containing appropriate chemical precursors and a radiation absorber. The chemical precursors can be sufficient radiation absorbers such that no separate radiation absorber is needed. The chemical precursors supply the atomic constituents for the product composition that is deposited as the coating material. The reaction conditions can be varied to produce product materials with a desired composition/stoichiometry and structure, for example, crystalline or amorphous. As described further below, laser pyrolysis has been successfully applied for the production of a wide variety of product particles. By analogy, these same compositions can be generated using light reactive dense deposition.

In particular, the reactant stream generally comprises appropriate relative amounts of precursor compositions to produce a coating with the desired composition(s). Other additional reactants can be used to adjust the oxidizing/reducing environment in the reactant stream. Similarly, for the formation of doped materials by light reactive dense deposition, the reactant stream can comprise precursors for forming a host composition, glass or crystalline, and, optionally, dopant precursors. Formation of doped materials with these reactive approaches can involve fewer processing steps than common commercial approaches for introducing dopants into materials.

Reactant delivery approaches developed for laser pyrolysis can be adapted for light reactive dense deposition. In particular, a wide range of reaction precursors can be used in gaseous/vapor and/or aerosol form, and a wide range of highly uniform product compositions can be efficiently produced for the deposition in the form of a dense coating. Specifically, light reactive dense deposition can be used to form highly uniform coatings of materials, optionally comprising dopant(s)/additive(s) and/or complex composition(s). For convenience, this application refers interchangeably to radiation-driven processes, light-driven processes and laser-driven process, such as laser pyrolysis. In other words, as used herein, laser pyrolysis, light reactive deposition and light reactive dense deposition refer generally to all corresponding radiation-based synthesis processes in a flow and radiation based coating approaches unless explicitly indicated otherwise.

Light reactive dense deposition has considerable advantage for the production of product compositions for coating substrate surfaces. First, light reactive dense deposition process can be used in the production of a large range of product compositions. Thus, the composition of the coating can be adjusted in a wide range of ways. Furthermore, light reactive dense deposition can produce coating material with a high production rate. While maintaining the high production rate, a smooth coating with a uniform thickness and uniform composition can be formed.

In some embodiments, the substrate, generally a non-porous substrate, and the product stream are moved relative to each other to generate the coating on the surface. The rate of the relative motion can be selected to provide a desired coating thickness. This relative motion can be accomplished by mounting the substrate on a stage, conveyor or the like. The stage or conveyor can be motorized and programmed to move at a selected rate. Movement of the stage or conveyor can sweep the product stream across the surface of the substrate, for example, to deposit a uniform dense coating across the surface. In alternatively or additional embodiments, the product stream is swept over a substrate, that may be fixed, such as by moving the reactant nozzle. The appropriate optical elements can be moved along with the nozzle to sweep the product stream. In some embodiments, both the product stream and the substrate can move, either sequentially or simultaneously.

In some embodiments, the system is configured for the coating of multiple substrates without opening the internal components of the apparatus to the ambient atmosphere. For example, a plurality of substrates can be mounted on a stage, conveyor or the like. Following completion of coating of one substrate, the stage advances the coated substrate out of the way and positions another substrate to be coated next. Reactant flow and/or the light beam can be momentarily stopped during the positioning of a subsequent substrate or product production can be continued with a modest amount of waste of the product composition that is generated when there is no substrate in position for deposition.

Due to the direct deposition of a densified coating, the coating may not be heated subsequent to deposition above the flow temperature of the material. Thus, lower post deposition processing temperatures can be used. Under these circumstances, substrates can be used that could not tolerate higher processing temperatures that would be used to flow the coating materials if they were deposited as powder coatings. Given the wider range of materials suitable for the substrate, the substrates can corresponding have a broader range of mechanical and/or physical properties. For example, the substrate can be an inorganic or silicon based material. In addition, the substrate can be flexible. Flexible substrates can be placed on a support during the coating process to hold them in a fixed configuration. As a particular example, a flexible polymer can be coated with a desirable material.

There are at least two mechanisms that can lead to surface roughness. First, turbulence or other variations in the flow can lead to non-uniformity in the deposition. In addition, fluctuations in the reaction parameters, such as reactant flow, chamber pressure or light intensity, can result in variation in coating properties across the substrate surface. These fluctuations can lead to systematic variation in uniformity or to surface roughness due to more random fluctuations. Therefore, it can be useful to control process stability to deposit coating material uniformly across the substrate surface.

Appropriate controls of the deposition process can result in very high uniformity of coating thickness across the surface of a substrate and with respect to average coating thickness between substrates coated under the equivalent conditions. Specifically, a substrate can have a coating thickness with a variation across the substrate of no more than about 20% with a one-centimeter edge exclusion. Similarly, a plurality of substrates can be coated with a standard deviation in average coating thickness among the plurality of substrates of no more than about 20% with a two-centimeter edge exclusion. In addition, the surface roughness of the coating can be evaluated to be less than about 10 nm Ra (root mean square) and less than about 10 nm Rq (average) when evaluated by interferometry over an area of about 480×736 microns. Thus, the coatings can be smoother than are thought to be obtained by flame hydrolysis deposition and roughly comparable to smoothness obtainable by chemical vapor deposition. The coatings applied by light reactive dense deposition can be deposited at relatively high deposition rates compared to other coating technologies used to form high quality coatings.

Light reactive dense deposition is able to produce quality coatings at very high rates. At the same time, light reactive dense deposition is able to generate coatings with an extremely broad range of compositions by controlling reactant composition, reaction chemistry and reaction conditions, such as light intensity which can be used to continuously control effective temperatures in the reaction zone over a wide range, such as in the range(s) from about room temperature (e.g., 20° C.) to about 3000° C.

For the production of discrete devices or structures on the substrate surface formed by the dense coating, various patterning approaches can be used. Patterning of the coating during the deposition is described further below. Furthermore, conventional approaches from integrated circuit manufacturing, such as photolithography and dry etching, can be used to pattern the coating following deposition. Before or after patterning, the coating can be heat processed to anneal the coating.

Dense coatings with various stoichiometries and/or non-stoichiometric compositions can be produced by light reactive dense deposition. Similarly, deposited materials can be formed with various crystal structure(s), including, for example, amorphous structures. Specifically, light reactive deposition can be used to form highly uniform coatings of glasses, i.e., amorphous materials, and crystalline materials (either single crystalline or polycrystalline), optionally with additive/dopants comprising, for example, complex blends of stoichiometric and/or additive/dopant components. Crystalline materials of interest include, for example, high dielectric materials. Suitable optical materials include, for example, silicon oxide, germanium oxide, aluminum oxide, titanium oxide, telluride glasses, phosphate ($P_2O_5$) glass, InP, lithium niobate, combinations thereof and doped compositions thereof Glasses have been generally used in optical applications, although crystalline aluminum oxide, e.g., sapphire, and crystalline $SiO_2$, e.g., quartz, may be suitable for optical applications at certain light wavelengths.

Coatings applied by light reactive dense deposition are useful for a variety of applications. For example, iron oxide coatings and/or iron carbide coatings can be effective for electromagnetic shielding. These materials are described in U.S. Pat. No. 5,938,979 to Kambe et al., entitled "Electromagnetic Shielding," incorporated herein by reference. Thin titanium oxide, zinc oxide and other metal compositions preferentially absorb ultraviolate light and can be photocatalytic. Thus, these UV absorbers can be useful in products, such as self-cleaning windows, and as UV filters. Photocatalytic coatings are described in copending and commonly assigned U.S. Pat. No. 6,099,798 to Kambe et al., entitled "Ultraviolet Light Block And Photocatalytic Materials," incorporated herein by reference.

In some applications, the particles are used to form optical devices on the surface of the substrate. For example, high-silica glass can be used to form optical waveguides, optical fiber guides and optical device guides on a silicon or other surface. The optical waveguides need to have a different index of refraction from the materials surrounding them. Layers with different compositions and corresponding indices-of-refraction can be deposited. Dopants can be introduced to effect the changes in index-of-refraction.

To form the particular optical devices, one or more layers of particles are deposited onto the surface. The layer contacting the surface is an undercladding layer. A core layer is placed onto the undercladding layer, and an over-cladding layer is placed onto the core layer. In one embodiment, the undercladding layer and the over-cladding layer are formed from $SiO_2$ and the core layer is formed from doped $SiO_2$. The composite of the layers can be referred to as a film. The core layer can be etched to form the desired optical devices using, for example, photolithography and other appropriate patterning approaches. See also, U.S. Pat. No. 4,735,677 to Kawachi et al., entitled "Method For Fabricating Hybrid Optical Integrated Circuit," incorporated herein by reference.

In fuel cell applications, light reactive dense deposition can be used to form portions of fuel cell components, particular fuel cell components, such as bipolar plates/interconnects, glass/glass-ceramic seals, electrodes or electrolytes, or plurality of fuel cell component and/or fuel cell stacks. Appropriate materials for fuel cell applications may be crystalline or amorphous depending on the particular function. Coating processes for the formation of fuel cell components is described further in copending U.S. patent application Ser. No. 10/854,931 to Horne et al., entitled "Reactive Deposition for Electrochemical Cell Production," incorporated herein by reference.

Multiple layers can be formed by additional sweeps of the substrate through the product stream. Since each coating layer can have high uniformity and smoothness, a large number of layers can be stacked while maintaining appropriate control on the layered structure such that, in some embodiments, devices can be formed throughout the layered structure without structural variation adversely affecting the ability to form a well controlled structure. Composition can be varied between layers, i.e., perpendicular to the plane of the structure, and/or portions of layers, within the plane of the structure, to form desired structures. Thus, using light reactive dense deposition possibly with other patterning approaches, it is possible to form complex structures with intricate variation of materials with selectively varying compositions. Furthermore, using the approaches described herein, these complex coating structures can be formed at high rates.

Efficient approaches have been developed for the patterning of coatings for the formation of desired structures. Patterning of coating materials with respect to composition or other property affecting the properties can be performed during deposition and/or following deposition, for example, by etching the coated substrate using photolitography and/or other etching approaches. In other embodiments, a discrete mask is used to control the deposition of coating material. A discrete mask can provide an efficient and precise approach for the patterning of the coating. With chemical vapor deposition and physical vapor deposition, a layer of material is built up from an atomic or molecular level with a diffusional mechanism, which requires binding of the mask at an atomic or molecular level to prevent migration of the material being deposited under the mask to blocked regions. Thus, the "masks" are a coating on the surface without an independent, self-supporting structure corresponding to the mask, and the "mask" is chemically or physically bonded to the surface with atomic level contact along the "mask". In contrast, with flow-based deposition, the flow builds up a coating structure more rapidly than surface diffusion such that a mask with a flat surface placed against another flat surface provides sufficient contact to prevent significant particle migration past the mask. The discrete masks have an intact self-supporting structure that is not bonded to the surface such that the mask can be removed intact from the surface that is coated. Therefore, the discrete mask approach herein is different from previous masking approaches adapted from photolithography for vapor deposition approaches.

Similar patterning approachs can also be used in light reactive deposition such that similar structures can be formed using the two approaches. Light reactive dense deposition has the advantage that consolidation generally is not performed on the coating. Based on light reactive deposition, multiple layered optical structures are described further in copending and commonly assigned PCT application PCT/US01/45762 designating the U.S. filed on Oct. 26, 2001 now U.S. Pat. No. 7,039,264 to Bi et at, entitled "Multilayered Optical Structures," incoxporated herein by reference. Furthermore, light reactive deposition can be adapted for full three-dimensional integration of optical structures to take advantage of composition variation in three dimensions. Thus, a monolithic optical structure can be formed with full integration within one or more layers and between layers to form a highly compact optical structure with the capability of complex functionality. The formation of three-.dimensional structures is described further in copending and commonly assigned U.S. patent application 10/027,906, now U.S. Pat. No. 6,952,504 to Hi et at, entitled "Three Dimensional Engineering of Optical Structures," incorporated herein by reference.

Product Synthesis within a Reactant Flow

Light reactive dense deposition provides for the direct deposition of a dense coating layer. Light reactive dense deposition is a light reactive flow process as are laser pyrolysis and light reactive deposition. These light reactive flow processes share common features with respect to product formation, although they differ in their handling of the reactive flow leaving the light reaction zone. Laser pyrolysis has been demonstrated to be a valuable tool for the production of submicron/nanoscale particles with a wide range of particle compositions and structures alone or with additional processing. Similarly, light reactive deposition has been shown to be effective for the deposition of particles onto a substrate as a coating. The reactant delivery approaches described in detail below can be adapted for producing dense coatings in flowing reactant systems, for example, with a radiation source, e.g., a light source.

Flowing reactant systems generally comprise a reactant delivery apparatus that directs a flow through a reaction chamber. The reaction of the reactant flow takes place in the reaction chamber. The reaction zone may or may not be localized in a narrow region within the reaction chamber. The use of a radiation beam, e.g., a light beam, to drive the reaction can result in a localized reaction zone that leads to high uniformity of the product stream. Beyond the reaction zone, the flow comprises a product composition, unreacted reactants, reaction by-products and inert gases. The product flow can continue to a deposition surface at which at least a portion of the product composition is harvested from the flow as a dense coating.

Continuous supply of reactants to the flow and removal of product composition from the flow during the course of the reaction characterizes the reaction process within the flowing reactant system, although the reaction and/or the deposition can be interrupted at appropriate intervals, for example, to position substrates, alter reactant compositions or for other processing considerations and the like. Thus, there is a flow that passes generally from an inlet nozzle connected to a reactant delivery apparatus to a vent generally connected through a pump. The flow can be conceptually divided into a light reaction zone, a reactant flow upstream from the light reaction zone and a product flow down-stream from the light reaction zone. These conceptual zones generally may not have sharply defined boundaries, although it is clear at some point that product is present to form a product stream/flow and that prior to reacting no product is present in the reactant flow/stream.

Light reactive dense deposition can incorporate some product composition features used for the particle production within laser pyrolysis and for the production of powder coatings within light reactive deposition. In particular, the versatility of forming particles with a range of particle compositions and structures can be adapted for the formation of dense coatings by light reactive dense deposition with a comparable range in compositions and structures. In general, product compositions within a flowing reactant system can be deposited onto a substrate as a dense coating within the reaction chamber.

Laser pyrolysis has become the standard terminology for flowing chemical reactions driven by an intense radiation, e.g., light, with rapid quenching of product particles after leaving a narrow reaction region defined by the radiation. The name, however, is a misnomer in the sense that radiation from non-laser sources, such as a strong, incoherent light or other radiation beam, can replace the laser. Also, the reaction is not a pyrolysis in the sense of a thermal pyrolysis. The laser pyrolysis reaction is not solely thermally driven by the exothermic combustion of the reactants. In fact, in some embodiments, laser pyrolysis reactions can be conducted under conditions where no visible light emissions are observed from the reaction, in stark contrast with pyrolytic flames. Light reactive dense deposition, as well as light reactive deposition, involves comparable processes as laser pyrolysis for the product composition synthesis, although some characteristics of the flow may be altered to accommodate the dense coating deposition.

The reaction conditions can determine the qualities of the particles produced by light reactive deposition, as in laser pyrolysis. Adjustment of the reaction conditions can similarly be used to adjust the product composition within light reactive dense deposition, although for these processes the product flow is directed to a substrate prior to particle generation. The reaction conditions for light reactive dense deposition can be controlled relatively precisely in order to produce compositions and corresponding dense coatings with desired properties. In particular, the product flow characteristics influence the properties of the dense coating formed from the flow, although other factors, such as temperature of the substrate and coating parameters also influence the dense coating properties.

For example, the reaction chamber pressure, flow rates, composition and concentration of reactants, radiation intensity, radiation energy/wavelength, type and concentration of inert diluent gas or gases in the reaction stream, temperature of the reactant flow can affect the composition and other properties of the product flow, for example, by altering the time of flight of the reactants/products in the reaction zone and the availability of atomic species that recombine into product compositions in the product flow. Thus, in a particular embodiment, the specific reaction conditions can be controlled to yield desired product flow properties. The appropriate reaction conditions to produce a certain type of product flow generally depend on the design of the particular apparatus. Specific conditions used to produce selected dense coatings in particular apparatuses can be determined based on the general principles outlined herein along with appropriate empirical adjustments. Furthermore, some general observations on the relationship between reaction conditions and the resulting compositions can be made.

Increasing the light power results in increased reaction temperatures in the reaction region. A higher temperature in the reaction region tends to favor production of higher energy phases, which may not be obtained with processes near thermal equilibrium. Similarly, increasing the chamber pressure also tends to favor the production of higher energy phases. Also, increasing the concentration of the reactant serving as the oxygen source or other secondary reactant source in the reactant stream favors the production of particles with increased amounts of oxygen or other secondary reactant.

The velocity of the reactant stream is inversely related to the time within which to direct the coating to the substrate surface to deposit a dense coating while avoiding particle formation. Thus, if the reactant stream velocity is greater, the substrate can be positioned further from the light reaction zone while still obtaining a dense coating. Another significant factor in determining the coating parameters is the concentration of product composition within the product stream. Reducing the total concentration as well as the relative concentration of condensing product composition within the product flow results in a longer period of time prior to particle formation such that the substrate can be placed somewhat further from the light reaction zone while still being able to obtain a dense coating. The relative concentration of condensing product can be controlled by dilution with non-condensing, e.g., inert, compositions or by changing the pressure with a fixed ratio of condensing product to non-condensing compositions, with a reduction in pressure generally leading to reduced total concentration. Also, different product compositions have a tendency to form particles at different rates within the product flow. In summary, the coating parameters can be selected to ensure coalescing species intersect with the substrate surface.

Materials of interest include amorphous materials, crystalline materials and combinations thereof. Amorphous materials possess short-range order that can be very similar to that found in crystalline materials. In crystalline materials, the short-range order comprises the building blocks of the long-range order that distinguishes crystalline and amorphous materials. In other words, translational symmetry of the short-range order building blocks found in amorphous materials creates long-range order that defines a crystalline lattice. For example, silica glass is an amorphous material comprised of $(SiO_4)^{4-}$ tetrahedra that are bonded together at irregular bond angles. The regularity of the tetrahedra provides short-range order but the irregularity of the bond angles prevents long-range order. In contrast, quartz is a crystalline silica material comprised of the same $(SiO_4)^{4-}$ tetrahedra that are bonded together at regular bond angles to form long-range order which results in a crystalline lattice. In general, the crystalline form is a lower energy state than the analogous amorphous form. This provides a driving force towards formation of long-range order. In other words, given sufficient atomic mobility and time, long-range order can form. In light reactive dense deposition, the coating parameters, for example including the nature of the substrate surface, can influence the crystalline or amorphous structure of the dense coating as well as the composition of the coating.

To form a desired composition in the reaction process, one or more precursors supply the one or more metal/metalloid elements as well as any secondary elements that form the desired composition. Secondary elements would include, for example, non-metal/metalloid elements, such as carbon, nitrogen, silicon, phosphorous, selenium and sulfur, that can be incorporated into the resulting product composition. The reactant stream generally would comprise the desired metal and, additionally or alternatively, metalloid elements as well as any selected secondary elements to form a host material and, optionally, dopant(s)/additive(s) in appropriate proportions to produce product particles with a desired composition. The composition of the reactant stream can be adjusted along with the reaction condition(s) to generate desired product materials with respect to composition and structure. Based on the particular reactants and reaction conditions, the product compositions may not have the same proportions of metal/metalloid elements as the reactant stream since the elements may have different efficiencies of incorporation into the product, i.e., yields with respect to unreacted materials. However, the amount of incorporation of each element is a function of the amount of that element in the reactant flow, and the efficiency of incorporation can be empirically evaluated based on the teachings herein to obtain desired compositions. The designs of the reactant nozzles for radiation driven reactions described herein are designed for high yields with high reactant flows. Furthermore, additional appropriate precursor(s) can supply any desired dopant/additive element(s).

Metalloids are elements that exhibit chemical properties intermediate between or inclusive of metals and nonmetals. Metalloid elements comprise silicon, boron, arsenic, antimony, and tellurium. Astatine perhaps can be considered a metalloid also, but it is highly radioactive with the longest lived isotopes having a half life of about 8 hours. Elements from the groups Ib, IIb, IIIb, IVb, Vb, VIb, VIIb and VIIIb are referred to as transition metals. In addition to the alkali metals of group I, the alkali earth metals of group II and the transition metals, other metals include, for example, aluminum, gallium, indium, thallium, germanium, tin, lead, bismuth and polonium. The non-metal/metalloid elements include hydrogen, the noble gases, carbon, nitrogen, oxygen, fluorine, phosphorous, sulfur, chlorine, selenium, bromine, and iodine.

Light reactive dense deposition can be performed with gas/vapor phase reactants. Many precursor compositions, such as metal/metalloid precursor compositions, can be delivered into the reaction chamber as a gas/vapor. Appropriate precursor compositions for gaseous delivery generally include compositions with reasonable vapor pressures, i.e., vapor pressures sufficient to get desired amounts of precursor gas/vapor into the reactant stream. The vessel holding liquid or solid precursor compositions can be heated (cooled) to increase (decrease) the vapor pressure of the precursor, if desired. Solid precursors generally are heated to produce a sufficient vapor pressure. A carrier gas can be bubbled through a liquid precursor to facilitate delivery of a desired amount of precursor vapor. Similarly, a carrier gas can be passed over the solid precursor to facilitate delivery of the precursor vapor. Alternatively or additionally, a liquid precursor can be directed to a flash evaporator to supply a composition at a selected vapor pressure. The use of a flash evaporator to control the flow of non-gaseous precursors provide a high level of control on the precursor delivery into the reaction chamber.

However, the use of exclusively gas/vapor phase reactants can be challenging with respect to the types of precursor compositions that can be used conveniently. Thus, techniques have been developed to introduce aerosols containing precursors, such as metal/metalloid precursors, into reaction chambers for flowing light driven reactions. Improved aerosol delivery apparatuses for flowing reaction systems are described further in U.S. Pat. No. 6,193,936 to Gardner et al., entitled "Reactant Delivery Apparatuses," incorporated herein by reference. These reactant delivery systems can be adapted for light reactive dense deposition. In some embodiments, the aerosol is entrained in a gas flow, which can comprise an inert gas(es) and/or a gaseous reactant(s).

Using aerosol delivery apparatuses, solid precursor compositions can be delivered by dissolving the compositions in a solvent. Alternatively, powdered precursor compositions can be dispersed in a liquid/solvent for aerosol delivery. Liquid precursor compositions can be delivered as an aerosol from a neat liquid, a multiple liquid dispersion or a liquid solution. Aerosol reactants can be used to obtain a significant reactant throughput. A solvent/dispersant can be selected to achieve desired properties of the resulting solution/dispersion. Suitable solvents/dispersants include water, methanol ethanol isopropyl alcohol other organic solvents and mixtures thereof. The solvent should have a desired level of purity such that the resulting coatings have a desired purity level. Some solvents, such as isopropyl alcohol are significant absorbers of infrared light from a $CO_2$ laser such that no additional light absorbing composition may be needed within the reactant stream if a $CO_2$ laser is used as a light source.

The precursor compositions for aerosol delivery are dissolved in a solution generally with a concentration in the range(s) greater than about 0.1 molar. Generally, increasing the concentration of precursor in the solution increases the throughput of reactant through the reaction chamber. As the concentration increases, however, the solution can become more viscous such that the aerosol may have droplets with larger sizes than desired. Thus, selection of solution concentration can involve a balance of factors in the selection of a suitable solution concentration.

If precursors are delivered as an aerosol with a solvent present, the solvent generally can be rapidly evaporated by the radiation (e.g., light) beam in the reaction chamber such that a gas phase reaction can take place. The resulting particles are not generally highly porous, in contrast to other approaches based on aerosols in which the solvent cannot be driven off rapidly. Thus, the fundamental features of the flowing reaction system can be unchanged by the presence of an aerosol as an alternative or an addition to reactions with exclusively vapor reactants. Nevertheless, the reaction conditions are affected by the presence of the aerosol The use of aerosol reactants for light reactive deposition is described in copending and commonly assigned U.S. patent application Ser. No. 10/099,597, now U.S. Pat. No. 6,849,334 to Horne et al., entitled "Optical Materials And Optical Structures," incorporated herein by referenc; and these approaches can be adapted for performing light reactive dense deposition.

For embodiments involving a plurality of metal/metalloid elements, the metal/metalloid elements can be delivered all as vapor, all as aerosol or as any combination thereof. If a plurality of metal/metalloid elements is delivered as an aerosol, the precursors can be dissolved/dispersed within a single solvent/dispersant for delivery into the reactant flow as a single aerosol. Alternatively, the plurality of metal/metalloid elements can be delivered within a plurality of solutions/dispersions that are separately formed into an aerosol. The generation of a plurality of aerosols can be helpful if convenient precursors are not readily soluble/dispersible in a common solvent/dispersant. The plurality of aerosols can be introduced into a common gas flow for delivery into the reaction chamber through a common nozzle. Alternatively, a plurality of reactant inlets can be used for the separate delivery of aerosol and/or vapor reactants into the reaction chamber such that the reactants mix within the reaction chamber prior to entry into the reaction zone.

In addition, for the production of highly pure materials, it may be desirable to use a combination of vapor and aerosol reactants. In some embodiments, vapor/gas reactants generally can be supplied at higher purity than is readily available at low cost for aerosol delivered compositions. For example, very pure silicon can be delivered in an easily vaporizable form, such as silicon tetrachloride. At the same time, some elements, especially rare earth metals, cannot be conveniently delivered in vapor form. Furthermore, in some embodiments, a majority of the material for the product compositions can be delivered in vapor/gas form while other elements are delivered in the form of an aerosol. The vapor and aerosol can be combined for reaction, among other ways, following delivery through a single reactant inlet or a plurality of inlets.

The product compositions, in some embodiments, can further comprise one or more non-(metal/metalloid) elements. For example, several compositions of interest are oxides. Thus, an oxygen source should also be present in the reactant stream. The oxygen source can be the metal/metalloid precursor itself if it comprises one or more oxygen atoms or a secondary reactant can supply the oxygen. The conditions in the reactor should be sufficiently oxidizing to produce the oxide materials.

In particular, secondary reactants can be used in some embodiments to alter the oxidizing/reducing conditions within the reaction chamber and/or to contribute non-metal/metalloid elements or a portion thereof to the reaction products. Suitable secondary reactants serving as an oxygen source for the formation of oxides include, for example, $O_2$, $CO$, $N_2O$, $H_2O$, $CO_2$, $O_3$ and the like and mixtures thereof. Molecular oxygen can be supplied as air. In some embodiments, the metal/metalloid precursor compositions comprise oxygen such that all or a portion of the oxygen in product particles is contributed by the metal/metalloid precursors. Similarly, liquids used as a solvent/dispersant for aerosol delivery can similarly contribute secondary reactants, e.g., oxygen, to the reaction. In other words, if one or more metal/metalloid precursors comprise oxygen and/or if a solvent/dispersant comprises oxygen, a separate secondary reactant, e.g., a vapor reactant, may not be needed to supply oxygen for product compositions.

In one embodiment, a secondary reactant composition should not react significantly with the metal/metalloid precursor(s) prior to entering the radiation reaction zone since this can result in the formation of particles, less uniform coating deposition, and/or damage the inlet nozzle. Similarly, if a plurality of metal/metalloid precursors is used, these precursors should not significantly react prior to entering the radiation reaction zone. If the reactants are spontaneously reactive, a metal/metalloid precursor and the secondary reactant and/or different metal/metalloid precursors can be delivered in separate reactant inlets into the reaction chamber such that they are combined just prior to reaching the light beam.

Light reactive dense deposition can be performed with radiation at a variety of optical frequencies, using either a laser or other intense radiation source. Convenient light sources operate in the infrared portion of the electromagnetic spectrum, although other wavelengths can be used, such as the visible and infrared regions of the spectrum. Excimer lasers can be used as ultraviolet sources. $CO_2$ lasers are particularly useful sources of infrared light. Infrared absorber(s) for inclusion in the reactant stream include, for example, $C_2H_4$, isopropyl alcohol, $NH_3$, $SF_6$, $SiH_4$ and $O_3$. $O_3$ can act as both an infrared absorber and as an oxygen source. The radiation absorber(s), such as the infrared absorber(s), can absorb energy from the radiation beam and distribute the energy to the other reactants to drive the pyrolysis.

Generally, the energy absorbed from the radiation beam, e.g., light beam, increases the temperature at a tremendous rate, many times the rate that heat generally would be produced by exothermic reactions under controlled condition(s). While the process generally involves nonequilibrium conditions, the temperature can be described approximately based on the energy in the absorbing region. The light reactive dense deposition process, similar to the laser pyrolysis process and the light reactive deposition process, is qualitatively different from the process in a combustion reactor where an energy source initiates a reaction, but the reaction is driven by energy given off by an exothermic reaction. Thus, while the light driven process for particle collection is referred to as laser pyrolysis, it is not a traditional pyrolysis since the reaction is not driven by energy given off by the reaction but by energy absorbed from a radiation beam. In particular, spontaneous reaction of the reactants generally does not proceed significantly, if at all, back down the reactant flow toward the nozzle from the intersection of the radiation beam with the reactant stream. If necessary, the flow can be modified such that the reaction zone remains confined.

An inert shielding gas can be used to reduce the amount of reactant and product molecules contacting the reactant chamber components. Inert gases can also be introduced into the reactant stream as a carrier gas and/or as a reaction moderator. Appropriate inert gases generally include, for example, Ar, He and $N_2$.

The product production rate based on reactant delivery configurations described herein can yield product production rates in the range(s) of at least about 50 g/h, in other embodiments in the range(s) of at least about 100 g/h, in further embodiments in the range(s) of at least about 250 g/h, in additional embodiments in the range(s) of at least about 1 kilogram per hour (kg/h) and in general up in the range(s) up to at least about 10 kg/h. In general, these high production rates can be achieved while obtaining relatively high reaction yields, as evaluated by the portion of metal/metalloid nuclei in the flow that are incorporated into the product composition, a portion of which are incorporated into the dense coating. In general, the reaction product yield can be in the range(s) of at least about 30 percent based on the limiting reactant, in other embodiments in the range(s) of at least about 50 percent, in further embodiments in the range(s) of at least about 65 percent, in other embodiments in the range(s) of at least about 80 percent and in additional embodiments in the range(s) of at least about 95 percent based on the limiting reactant, generally a metal/metalloid nuclei in the reactant flow. A person of ordinary skill in the art will recognize that additional values of product production rates and yields within these specific values are contemplated and are within the present disclosure.

Product Deposition

In light reactive dense deposition, a highly uniform flow of product composition is directed toward a substrate to be coated. The resulting coating can be formed as a dense coating across the substrate or patterned according to a selected structure. In addition, the dense coatings can be modified through subsequently processing, such as heat treatments or etching. The coating parameters can be varied to obtain the desired coating properties.

Light reactive dense deposition is a coating approach that uses an intense radiation source, e.g., light source, to drive synthesis of desired compositions from a flowing reactant stream. Light reactive dense deposition can result in deposition of a relatively dense coating layer in comparison with the density of a fully densified material of the same chemical composition and structure. Generally, product composition within the flow that reaches the substrate surface can be a vapor product, product clusters or metastable particles, which due to their metastable nature coalesce on the surface of the substrate. It is even possible that the product composition is not well formed prior to interacting with the surface such that the completion of the combination of reactive intermediates takes place in the environment of the substrate surface. Generally, the precise mechanism may not be well known since only the reactant properties and the character of the coating may be observed. Since a dense coating is formed, certain properties of the product flow can be inferred with respect to the coalescing nature of the product compositions upon interaction with the substrate surface.

Light reactive dense deposition has surprisingly spanned the gap between two different coating universes. In particular, light reactive dense deposition combines the advantages of chemical vapor deposition approaches with the advantages flowing reactor deposition approaches. Amazingly, the light reactive deposition approach can maintain a high quality and high uniformity of the resulting coating. In particular, light reactive dense deposition incorporates the simplified processing available with chemical vapor deposition from directly forming a dense coating. However, the light reactive dense deposition has the advantage over chemical vapor deposition in that the density can be controlled over a range of relatively high densities. Even more significantly, light reactive dense deposition can deliver product to the coating at very high rates without sacrificing the quality of the coating with respect to uniformity and properties.

On the other hand, light reactive dense deposition surprisingly extends flow approaches, such as light reactive deposition, into a regime of dense coating deposition. In light reactive deposition, flame hydrolysis, and the like particles are deposited as a soot or snow, which is a very porous structure with a relatively low density. The particles result from a nucleation and quenching process within the flow. For light reactive dense deposition, the particle formation process has been considered fundamental to the overall coating process. In contrast, chemical vapor deposition approaches rely on a diffusion-type or condensation process to deposit the product materials onto the coating surface. Thus, the various alternative conceptual models of coating processes do not lead to the concept of the direct deposition of a dense coating using light reactive dense deposition. Other approaches teach away from the present process. Nevertheless, such dense coatings have been observed in appropriately modified light reactive deposition apparatuses.

With respect to other flow methodologies, light reactive dense deposition offers additional advantages with respect to deposition of crystalline materials. With the deposition of particles, the short range order of the composition is fixed in the particle prior to interaction in the coating. Interactions between particles on the surface generally are not energetic enough to order the particles relative to their neighbors. So the overall structure does not possess any long range order, even with crystalline particles. The reaction parameters in the flow determine whether or not the particles are amorphous or crystalline. The consolidation process to density the powder coating formed by light reactive deposition may or may not be effective to alter the ordering of the material.

In light reactive dense deposition, the resulting coating can be amorphous (short range order only), polycrystalline (intermediate range order) or single cystalline (long range order). The parameters that influence the different coating materials that form in light reactive dense deposition are very different from the parameters in particle deposition. In light reactive dense deposition, the product composition reaches the substrate surface in a coalescing form, i.e., a form that interacts strongly with the surrounding composition. The ordering is significantly influenced by the chemical composition of the material itself since certain materials have a much stronger dynamic tendency to form crystalline materials over amorphous materials and visa versa, although crystalline materials may be the stable form at equilibrium. Furthermore, the substrate structure can influence the coating structure. In particular, kinks or other irregularities on the substrate surface, whether natural or artificially induced, can promote crystallization of the product material as it forms the coating. The coating process can be adjusted to promote epitaxial or other single crystal growth of the crystalline material. Since diffusional processes from the vapor phase generally are not involved in the deposition, deposition of appropriate materials under conditions suitable for crystal formation may be actually easier to achieve than with chemical vapor deposition or the like. In particular, deposition rate, product stream velocity, inert gas concentration, temperature of the substrate, temperature of the flow, relative orientation of the substrate with respect to the light reaction zone and other reaction parameters can be adjusted empirically to select the crystallinity properties of the resulting coating.

A significant issue involves the identification of the process features that distinguish light reactive deposition form processes that form un-dense coatings. In extending laser pyrolysis to light reactive deposition, it had been though that particle formation is relatively rapid, such that direct deposition of an un-dense coating was inherent to the process. However, it was discovered that the coating parameters could be adjusted to result in the direct deposition of a dense coating. In particular, one or more coating parameters could be adjusted to promote the direct coating of a dense coating. Specifically, the substrate can be placed closer to the light reaction zone, the light intensity can be increased, the flow velocity can be increased and/or the relative or total concentration of product within the product stream can be reduced. Other coating parameters may also affect the nature of the coating process. Along with these predictive trends with respect to coating parameters, for any particular reactor apparatus, the reaction parameters can be adjusted based on the teachings herein to perform dense coating deposition.

Light reactive dense deposition involves a flowing reactant stream that intersects with the radiation beam at a reaction zone where reaction products are subsequently deposited onto a substrate. While the particles produced in laser pyrolysis are collected for subsequent use, in light reactive dense deposition, the resulting product compositions are directed directly to a substrate surface where a dense coating is formed. In contrast with other light based dense coating approaches, light reactive dense deposition involves directing a confined flow to the substrate surface rather than relying on a diffusion or condensation process to carry out the coating process. The use of a confined flow provides for all or a significant proportion of the flow to pass through the light beam. This directed flow to the substrate can result in a dramatically increased deposition rate with a high yield while surprisingly allowing for improved uniformity of the resulting coating.

The characteristics of laser pyrolysis that can lead to the production of highly uniform particles can be correspondingly implemented in the production of coatings with high uniformity with appropriate attention to processing features relating to coating formation. In particular, a well-defined laser reaction zone can result in uniform product flow that results in uniform coating properties. The shape of the light beam can be controlled to produce product composition under very uniform heating and flow conditions. The uniform product composition formulation results in uniform deposition and reproducible deposition. The uniformity of the resulting coating can relate not only to the mechanical properties but also to the functional properties of the material, such as the catalytic properties. The use of a flash evaporator for reactant delivery can improve the uniformity of chemical delivery, which further improves the uniformity of the product flow and corresponding coating. Furthermore, in contrast with other methods that require the scanning of a substrate in two dimensions to form a layer, an elongated reactant inlet provides for the deposition of a uniform coating layer with one or few passes through the product stream such that a large number of stripes do not have to be stitched together.

In light reactive deposition, the coating of the substrate can be performed within the reaction chamber. The reactant delivery system can be configured for the production of coating material with various compositions. Thus, a wide range of coating materials can be formed on a substrate surface. A substrate intercepts flow from the reaction zone, directly capturing the product composition onto its surface. As noted above, coating parameters can be suitably adjusted to result in a dense coating.

A laser pyrolysis apparatus design incorporating an elongated reactant inlet has been developed that facilitates production of commercial quantities of particles. Specifically, the reaction chamber and reactant inlet are elongated significantly along the light beam to provide for an increase in the throughput of reactants and products. By orienting the light beam along the elongated reactant stream, a sheet of product particles is generated. This design has been described in U.S. Pat. No. 5,958,348 to Bi et al., entitled "Efficient Production of Particles by Chemical Reaction," incorporated herein by reference.

In adapting this reactant delivery apparatus design for a coating process, the size of the elongated reactant inlet can be selected based on the size of the substrate to be coated. In some embodiments, the reactant inlet is somewhat larger than the diameter or other dimension across the substrate, such as a width, such that the entire substrate can be coated in one pass through the product stream. In general a reactor apparatus with flowing reactants having the elongated reactant inlet is designed to reduce contamination of the chamber walls, to increase the production capacity and to make efficient use of resources. Due to the chamber design, the elongated reaction chamber can provide for an increased throughput of reactants and products without compromising other performance properties during deposition. Any dead volume of the chamber can become contaminated with unreacted compounds and/or reaction products. Furthermore, an appropriate flow of shielding gas can confine the reactants and products within a flow stream through the reaction chamber. The high throughput of reactants makes efficient use of the radiation (e.g., light) energy.

The delivery of gaseous/vapor reactants and/or aerosol reactants, as described further below, can be adapted for the elongated reaction chamber design. Additional embodiments and other appropriate features for commercial capacity laser pyrolysis apparatuses are described in copending and commonly assigned U.S. patent application Ser. No. 09/362,631 to Mosso et al., entitled "Particle Production Apparatus," incorporated herein by reference. These designs for commercial production of powders by laser pyrolysis can be adapted for rapid coating of high quality coating materials by light reactive dense deposition.

With light reactive dense deposition, the rate of production and/or deposition of the product composition can be varied substantially, depending on a number of factors (e.g., the starting materials being utilized, the desired reaction product, the reaction conditions, the deposition efficiency, and the like, and combinations thereof). Thus, in one embodiment, the rate of product production can vary in the range(s) from about 5 grams per hour of reaction product to about 10 kilograms per hour of desired reaction product. Specifically, using apparatuses described herein, coating can be accomplished at product production rates in the range(s) of up to at least about 10 kilograms per hour (kg/hr), in other embodiments in the range(s) of at least about 1 kg/hr, in further embodiments with lower production rates in the range(s) of at least about 250 grams per hour (g/hr) and in additional embodiments in the range(s) of at least about 50 g/hr. A person of ordinary skill in the art will recognize that production rates intermediate between these explicit production rates are contemplated and are within the present disclosure. Exemplary rates of product production (in units of grams produced per hour) include in the range(s) of not less than about 5, 10, 50, 100, 250, 500, 1000, 2500, 5000, or 10000.

Not all of the product composition generated is deposited on the substrate. In general the deposition efficiency depends on the relative speed of the substrate through the product stream, for embodiments based on moving the substrate relative to a sheet of product flow. Other factors affecting deposition efficiency include, for example, the product composition, temperature of the flow, substrate temperature and position and orientation of the substrate relative to the flow. At moderate rates of relative substrate motion, coating efficiencies in the range(s) of not less than about 15 to about 20 percent can be achieved, i.e. about 15 to about 20 percent of the produced product composition is deposited on the substrate surface. Routine optimization can increase this deposition efficiency further. At slower relative motion of the substrate through the product stream, deposition efficiencies in the range(s) of at least about 40 percent and in additional embodiments in the range(s) of as high as 80 percent or more can be achieved. In general, with the achievable product production rates and deposition efficiencies, deposition rates can be obtained in the range(s) of at least about 5 g/hr, in other embodiments in the range(s) of at least about 25 g/hr, in further embodiments in the range(s) of at least from about 100 g/hr to about 5 kg/hr and in still other embodiment in the range(s) from about 250 g/hr to about 2.5 kg/hr. A person of ordinary skill in the art will recognize that deposition rates between these explicit rates are contemplated and are within the present disclosure. Exemplary rates of product deposition (in units of grams deposited per hour) include in the range(s) of not less than about 0.1, 0.5, 1, 5, 10, 25, 50, 100, 250, 500, 1000, 2500, or 5000.

Alternatively or additionally, the invention provides that the rate of the movement of the substrate and the product flow relative to each other can vary substantially, depending on the desired specifications for the coated substrate. Thus, in one embodiment, the rate can be measured on an absolute scale, and can vary in the range(s) of at least about 0.001 inches per second, in other embodiments at least about 0.05 inches per second, in further embodiments, from about 1 inch per second to about 12 inches per second, or even more. A person of ordinary skill in the art will recognize that additional ranges and subranges within these explicit ranges are contemplated and are encompassed within the present disclosure. Further, in another embodiment, the rate can be measured on a scale relative to the substrate being coated, and can vary in the range(s) from about 0.05 substrates per minute to about 1 substrate per second.

For moderate wafer/substrate sizes, at least a substantial portion of the substrate surface can be coated with a sufficient thickness to form a dense coating at a rate in the range(s) of 2 microns per minute, in other embodiments in the range(s) of at least about 5 microns per minute, in some embodiments in the range(s) at least about 20 microns per minute, and in further embodiments in the range(s) at least about 100 microns per minute. A person or ordinary skill in the art will recognize that additional ranges within these explicit ranges are contemplated and are within the present disclosure.

A coating formed by light reactive dense deposition generally has a relatively high density. As used herein, a dense coating refers to a coating with a density that is at least about 65%, in further embodiments at least about 75%, in additional embodiments at least about 85%, and in other embodiments at least about 95% of the full density of the coating material in a fully densified bulk form. Also, in some embodiments the dense coating directly applied with light reactive dense deposition has approximately a full, i.e., 100%, density as deposited. The dense coating may or may not be porous. Generally, the presence of a porous character is correlated with the density of the coating. The coating porosity can be evaluated with a gas through determining if any gas is absorbed into the materials. The BET measurement process for particulates can be adapted for this purpose. Alternatively, another approach for the measurement of porosity of solid surfaces is described, for example, in U.S. Pat. No. 5,373,727 to Heller et al., entitled "Miniporopermeameter," incorporated herein by reference.

For appropriate embodiments using a sheet of product flow, a selected rate of relative substrate motion generally is a function of the selected deposition rate and the desired coating thickness as limited by the movement the substrate at the desired rate while obtaining desired coating uniformity. In embodiments in which the substrate is swept through the product stream, the substrate can be moved relative to a fixed nozzle, and/or the nozzle can be moved relative to a fixed substrate. Due to the high deposition rates achievable with light reactive dense deposition, extremely high coating rates are easily achievable. These coating rates by light reactive dense deposition are dramatically faster than rates that are achievable by competing methods at the same coating uniformity. In particular, at a product production rate of about 10 kg/hr, an eight-inch circular wafer can be coated with a thickness of about 5 microns of dense coating in approximately one second even at a deposition efficiency of only about 7.5 percent, assuming a powder density of about 60% of the bulk density. A person of ordinary skill in the art can calculate with simple geometric principles any one of the following variables based on one or more of the other variables from the group of a coating rate, the deposition rate, the desired thickness and the density of coating on the substrate.

In particular, apparatus designs based on an actuator arm moving a substrate through the product stream within a reaction chamber, as described herein, can straightforwardly move a substrate at rates to coat an entire eight-inch wafer in about 1 second or less. Generally, in embodiments of particular interest that take advantage of the rapid rates achievable, substrates are coated at rates in the range(s) of at least about 0.1 centimeters per second (cm/s), in additional embodiments in the range(s) at least about 0.5 cm/s, in other embodiments in the range(s) at least about 1 cm/s, in further embodiments in the range(s) from about 2 cm/s to about 30 cm/s, and in other embodiments in the range(s) from about 5 cm/s to about 30 cm/s. A person of ordinary skill in the art will recognize that coating rates intermediate between these explicit rates are contemplated and are within the present disclosure.

Furthermore, the rapid production rate can be advantageously used to form a plurality of coatings with or without additional treatments between coatings. Each coating can cover an entire layer or a portion of a layer. Compositions can be changed within a layer or between layers. When changing compositions significantly between layers, it may be desirable to wait a few seconds for the product stream to stabilize prior to initializing coating.

The design of the elongated reaction chamber 100 for generating a sheet of product flow is shown schematically in FIG. 1. This chamber is shown without displaying any coating components for simplicity with respect to other reactor components and can be adapted for coating as described further below with respect to related coating embodiments. A reactant inlet 102 leads to main chamber 104. Reactant inlet 102 conforms generally to the shape of main chamber 104. Main chamber 104 comprises an outlet 106 along the reactant/product stream for removal of undeposited product materials, any unreacted gases and inert gases. Shielding gas inlets 108 are located on both sides of reactant inlet 102. Shielding gas inlets are used to form a blanket of inert gases on the sides of the reactant stream to inhibit contact between the chamber walls and the reactants or products.

The dimensions of elongated reaction chamber 104 and reactant inlet 102 can be designed for highly efficiency product composition production. Reasonable dimensions for reactant inlet 102, when used with a $CO_2$ laser with a power in the several kilowatt range, are from about 5 mm to about 1 meter. The reaction zone is located within the reaction chamber in the vicinity of the intersection of the reactant flow with the light beam path.

Tubular sections 110, 112 extend from the main chamber 104. Tubular sections 110, 112 hold windows 114, 116, respectively, to define a light beam path 118 through the reaction chamber 100. Tubular sections 110, 112 can comprise inert gas inlets 120, 122 for the introduction of inert gas into tubular sections 110, 112.

Figure 2:
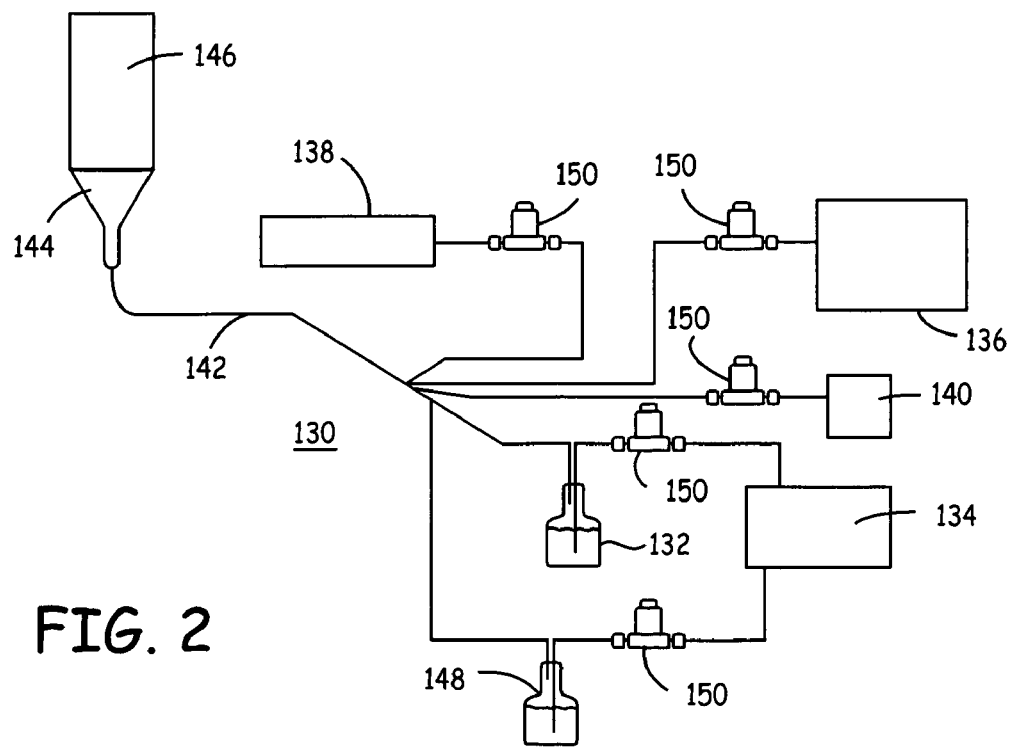
FIG. 2 is a schematic representation of a reactant delivery system for the delivery of vapor/gas reactants to a flowing reaction system, such as the laser pyrolysis reactor of FIG. 1.

Reactant inlet 102 is generally connected to a reactant delivery system. Referring to FIG. 2, an embodiment 130 of a reactant delivery apparatus comprises a source 132 of a precursor compound, which can be a liquid, solid or gas. For liquid or solid reactants, an optional carrier gas from one or more carrier gas sources 134 can be introduced into precursor source 132 to facilitate delivery of the reactant. Precursor source 132 can be a liquid holding container, a solid precursor delivery apparatus or other suitable container. The carrier gas from carrier gas source 134 can be, for example, an infrared absorber, an inert gas or mixtures thereof In alternative embodiments, precursor source 132 is a flash evaporator that can deliver a selected vapor pressure of precursor without necessarily using a carrier gas. A flash evaporator can deliver a selected partial pressure of a precursor vapor into the reaction chamber, and other components leading to the reaction chamber can be heated, if appropriate, to reduce or eliminate condensation of the vapor prior to entry into the reaction chamber. Thus, a plurality of flash evaporators can be used to deliver precisely a plurality of vapor reactants into the reaction chamber.

The gases/vapors from precursor source 132 can be mixed with gases from infrared absorber source 136, inert gas source 138 and/or gaseous reactant source 140 by combining the gases/vapors in a single portion of tubing 142. The gases/vapors are combined a sufficient distance from the reaction chamber such that the gases/vapors become well mixed prior to their entrance into the reaction chamber. The combined gas/vapor in tube 142 passes through a duct 144 into channel 146, which is in fluid communication with a reactant inlet, such as 102 in FIG. 1.

An additional reactant precursor can be supplied as a vapor/gas from second reactant source 148, which can be a liquid reactant delivery apparatus, a solid reactant delivery apparatus, a flash evaporator, a gas cylinder or other suitable container or containers. As shown in FIG. 2, second reactant source 148 delivers an additional reactant to duct 144 by way of tube 142. Alternatively, second reactant source can deliver the second reactant into a second duct such that the two reactants are delivered separately into the reaction chamber where the reactants combine at or near the reaction zone. Thus, for the formation of complex materials and/or doped materials, a significant number of reactant sources and, optionally, separate reactant ducts can be used for reactant/precursor delivery. For example, as many as 25 reactant sources and/or ducts are contemplated, although in principle, even larger numbers could be used. Mass flow controllers 150 can be used to regulate the flow of gases/vapors within the reactant delivery system of FIG. 2. Additional reactants/precursors can be provided similarly for the synthesis of complex materials.

As noted above, the reactant stream can comprise one or more aerosols. The aerosols can be formed within the reaction chamber or outside of the reaction chamber prior to injection into the reaction chamber. If the aerosols are produced prior to injection into the reaction chamber, the aerosols can be introduced through reactant inlets comparable to those used for gaseous reactants, such as reactant inlet 102 in FIG. 1. For the formation of complex material, additional aerosol generators and/or vapor/gas sources can be combined to supply the desired composition within the reactant stream.

Figure 3:
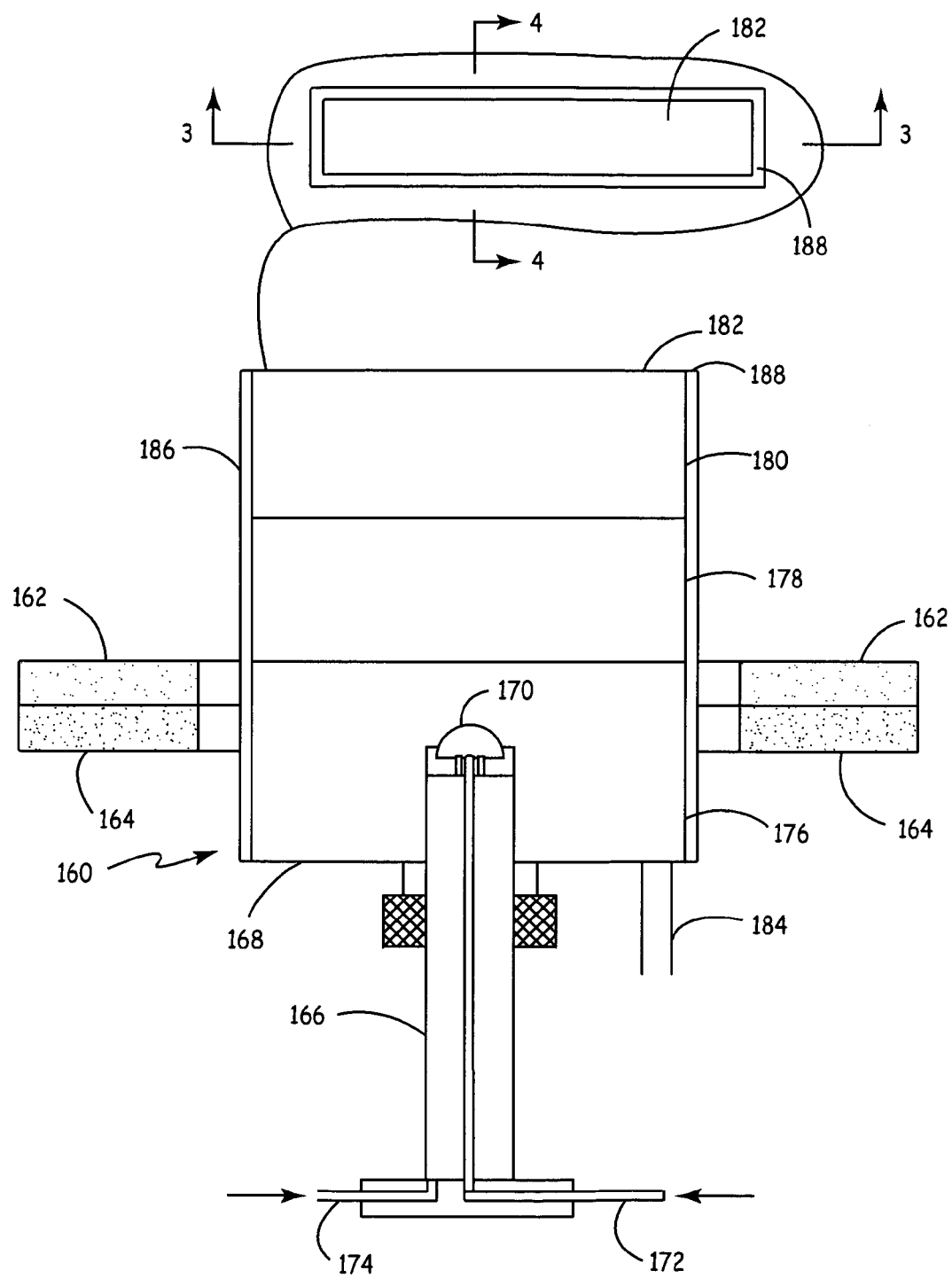
FIG. 3 is a sectional side view of a reactant inlet nozzle with an aerosol generator for the delivery of aerosol and gas/vapor compositions into a reaction chamber, wherein the cross section is taken along line 3-3 of the insert. The insert shows a top view of an elongated reactant inlet.
Figure 4:
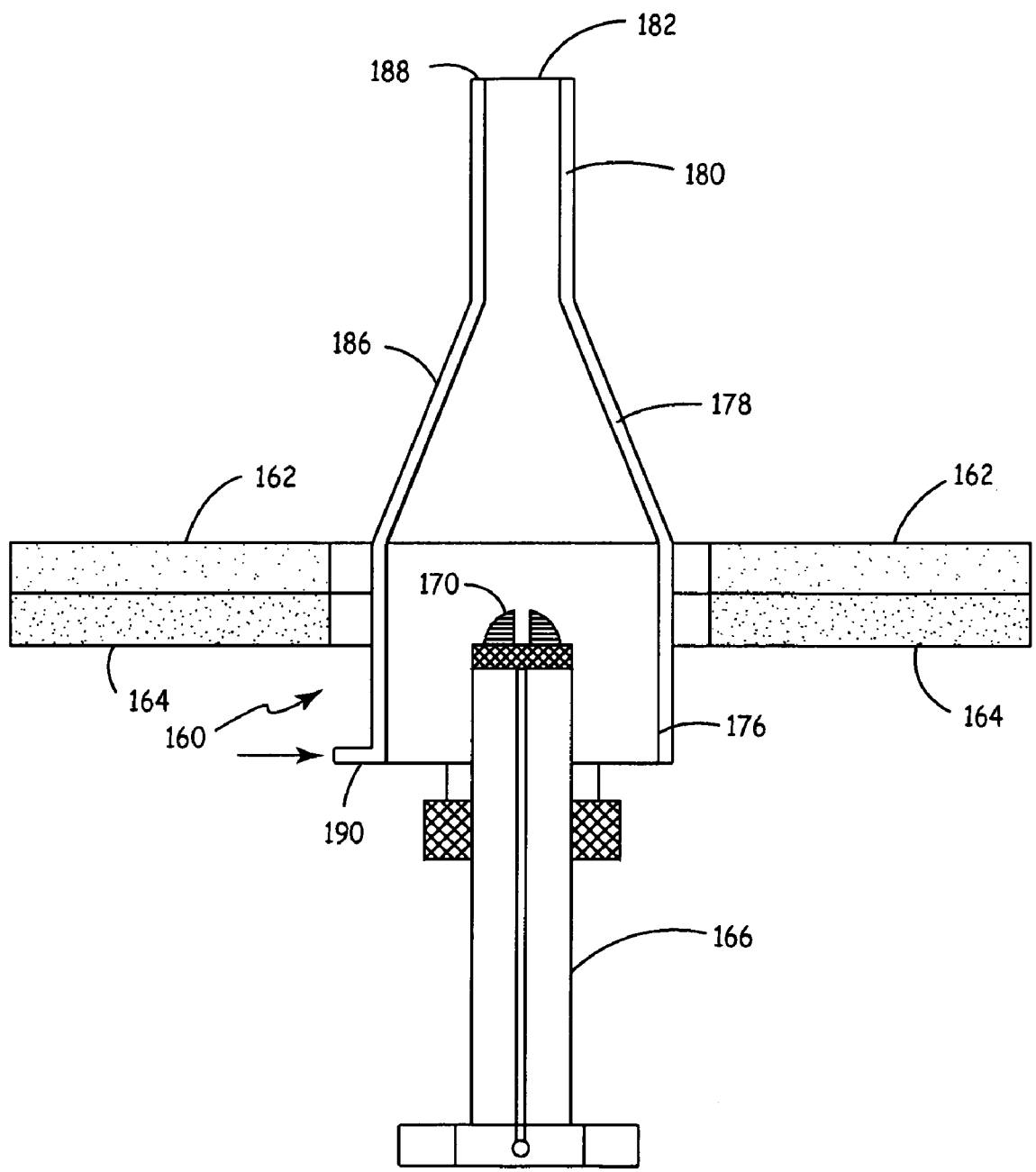
FIG. 4 is a sectional side view of the reactant inlet nozzle of FIG. 3 taken along the line 44 of the insert in FIG. 3.

An embodiment of a reactant delivery nozzle configured to deliver an aerosol reactant is shown in FIGS. 3 and 4. Inlet nozzle 160 connects with a reaction chamber at its lower surface 162. Inlet nozzle 160 comprises a plate 164 that bolts into lower surface 162 to secure inlet nozzle 160 to the reaction chamber. Inlet nozzle 160 comprises an inner nozzle 166 and an outer nozzle 168. Inner nozzle 166 can have, for example, a twin orifice internal mix atomizer 170 at the top of the nozzle. Suitable gas atomizers are available from Spraying Systems, Wheaton, Ill. The twin orifice internal mix atomizer 170 has a fan shape to produce a thin sheet of aerosol and gaseous compositions. Liquid is fed to the atomizer through tube 172, and gases for introduction into the reaction chamber are fed to the atomizer through tube 174. Interaction of the gas with the liquid assists with droplet formation.

Outer nozzle 168 comprises a chamber section 176, a funnel section 178 and a delivery section 180. Chamber section 176 holds the atomizer of inner nozzle 166. Funnel section 178 directs the aerosol and gaseous compositions into delivery section 180. Delivery section 180 leads to a rectangular reactant opening 182, shown in the insert of FIG. 3. Reactant opening 182 forms a reactant inlet into a reaction chamber for laser pyrolysis or light reactive deposition. Outer nozzle 168 comprises a drain 184 to remove any liquid that collects in the outer nozzle. Outer nozzle 168 is covered by an outer wall 186 that forms a shielding gas opening 188 surrounding reactant opening 182. Inert shielding gas is introduced through tube 190. Additional embodiments for the introduction of an aerosol with one or more aerosol generators into an elongated reaction chamber is described in U.S. Pat. No. 6,193,936 to Gardner et al., entitled "Reactant Delivery Apparatuses," incorporated herein by reference.

A secondary reactant compound such as an oxygen source, if present, should not react significantly with the metal/metalloid precursor prior to entering the reaction zone since this generally would result in loss of control of the product production. However, reacting precursors can be delivered into the reaction chamber through separate nozzles and/or separate inlets on a particular nozzle such that the reactant do not combine until they are near the reaction zone.

Light reactive dense deposition can be performed with a variety of optical frequencies, using either a laser or other strong focused radiation source, such as an arc lamp. Some desirable light sources operate in the infrared portion of the electromagnetic spectrum. $CO_2$ lasers are particularly convenient sources of light. Infrared absorbers for inclusion in the reactant stream comprise, for example, $C_2H_4$, water, isopropyl alcohol, $NH_3$, $SF_6$, $SiH_4$ and $O_3$. $O_3$ and isopropyl alcohol can act as both an infrared absorber and as an oxygen source. The radiation absorber, such as the infrared absorber, absorbs energy from the radiation beam and distributes the energy to the other reactants to drive the reaction.

Generally, the energy absorbed from the light beam increases the temperature at a tremendous rate, many times the rate that heat generally would be produced by exothermic reactions under controlled condition. While the process generally involves nonequilibrium conditions, the temperature can be described approximately based on the energy in the absorbing region. In light reactive dense deposition, the reaction process is qualitatively different from the process in a combustion reactor where an energy source initiates a reaction, but the reaction is driven by energy given off by an exothermic reaction. In a combustion reactor, there is generally no well-defined reaction zone with a boundary. The reaction zone is large and the residence time of the reactants is long. Lower thermal gradients are generally present in the combustion reactor.

In contrast, the laser/light driven reactions have extremely high heating rates. The product compositions generally depend on the radiation power in the reactions zone and the quantity of radiation absorbers in the flow. By controlling the composition of the reactant flow and the light intensity in the reaction zone, the reaction product can be reproducibly controlled. The effective temperature in the reaction zone can be controlled over a wide range, for example, in the range(s) from about room temperature (e.g., 20° C.) to about 3000° C.

In light reactive dense deposition, the reaction zone is primarily at the overlap of the light beam and the reactant stream, although the reaction zone may extend, for example, a few millimeters beyond the light beam, depending on the precise character of the reaction.

An inert shielding gas can be used to reduce the amount of reactant and product molecules contacting the reactant chamber components. Inert gases can also be introduced into the reactant stream as a carrier gas and/or as a reaction moderator. Appropriate inert shielding gases include, for example, Ar, He and $N_2$.

Reactant delivery apparatuses for flowing reactors can be adapted for light reactive dense deposition. The reactant delivery inlet into the reaction chamber generally is configured to deliver a reactant stream with dimensions that results in a product stream with desired dimensions for the deposition process. For example, in some embodiments, the reactant inlet has a length approximately the same size or slightly larger than the diameter of a substrate such that the substrate can be coated along an entire dimension of the substrate with one pass through the product stream without wasting excessive amount of product.

In general, the substrate is mounted to receive product compositions flowing from the reaction zone. The distance from the reaction zone to the substrate can be selected to yield desired coating results. In general, the substrate/wafer is placed in the range(s) from no more than about 15 centimeters (cm) coaxial to the reactant flow vector measured from the radiation beam edge, i.e., the downstream locus of points where the radiation intensity is a factor of $1/e^2$ of the maximum beam intensity, in other embodiments in the range(s) from about 0.5 mm to 10 cm, and in further embodiments in the range(s) from about 2 mm to about 8 cm. A person of ordinary skill in the art will understand that additional ranges within the explicit ranges of substrate distances are conceived and are within the present disclosure. The coating process generally is dynamic in the sense that a well defined product flow can be directed to desired substrate locations.

Figure 5:
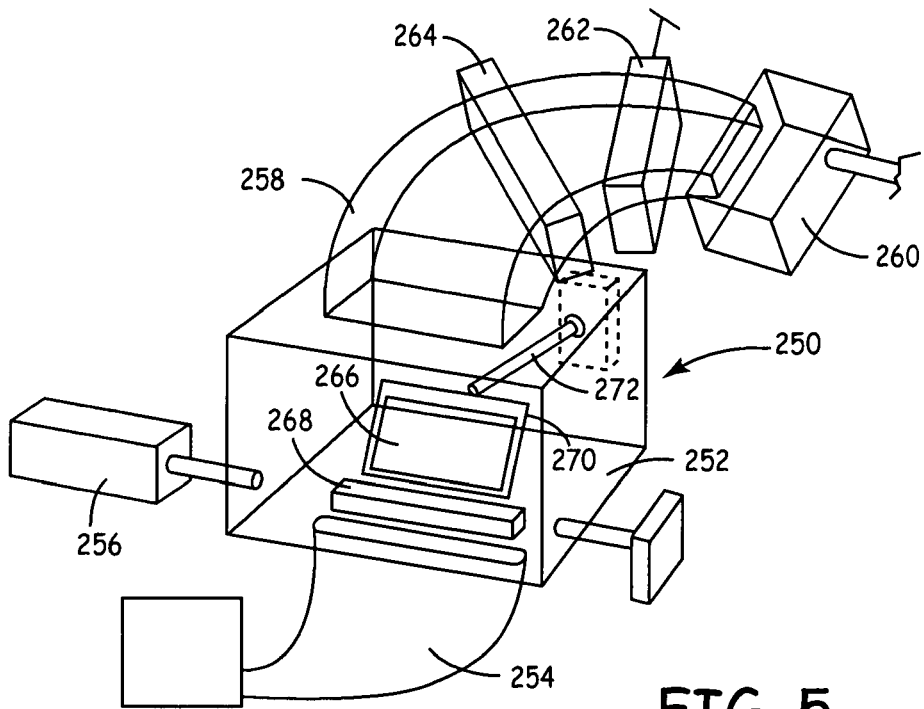
FIG. 5 is a schematic diagram of a light reactive dense deposition apparatus in which a dense coating is applied to a substrate within a reaction chamber.

An apparatus 250 to perform substrate coating within the reaction chamber is shown schematically in FIG. 5. The reaction/coating chamber 252 is connected to a reactant supply system 254, a radiation source 256 and an exhaust 258. Exhaust 258 can be connected to a pump 260, although the pressure from the reactant stream itself can maintain flow through the system. A valve 262 can be used to control the flow to pump 260. Valve 262 can be used to adjust the pumping rate and the corresponding chamber pressures. A collection system, filter, scrubber or the like 264 can be placed between chamber 252 and pump 260 to remove product compositions that did not get coated onto the substrate surface.

Substrate 266 can contact flow from a reaction zone 268 to coat the substrate with product compositions. Substrate 266 can be mounted on a stage, conveyor, or the like 270 to sweep substrate 266 through the flow. Specifically, stage 270 can be connected to an actuator arm 272 or other motorized apparatus to move stage 270 to sweep the substrate through the product stream. Various configurations can be used to sweep the coating across the substrate surface as the product leaves the reaction zone. A shown in FIG. 5, actuator arm 272 translates stage 270 to sweep substrate 266 through the product stream.

Figure 6:
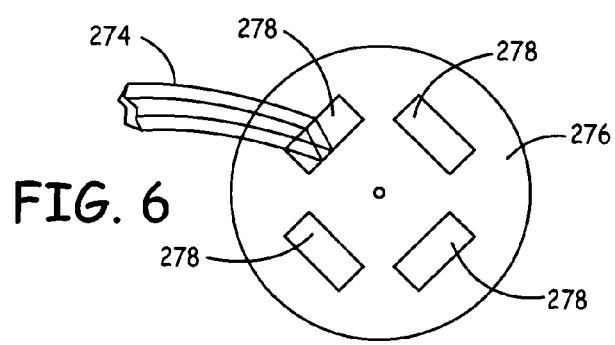
FIG. 6 is perspective view of a product flow directed at a substrate mounted on a rotating stage.

An embodiment of a stage to position a substrate relative to the conduit from the flowing reaction apparatus is shown in FIG. 6. A product stream 274 directs product composition toward a rotating stage 276. As shown in FIG 6, four substrates 278 are mounted on stage 276. More or fewer substrates can be mounted on a moveable stage with corresponding modifications to the stage and the chamber. A motor is used to rotate stage 276. Other designs for a stage, conveyor or the like can be used to sweep the substrate through the product flow.

Movement of stage 276 sweeps the product stream across a surface of one particular substrate 278 within the path of product stream 274. Stage 276 can be used to pass sequential substrates through the product stream for one or more coating applications to each substrate. Stage 276 can comprise thermal control features that provide for the control of the temperature of the substrates on stage 276. Alternative designs involve the linear movement of a stage or other motions.

Figure 7:
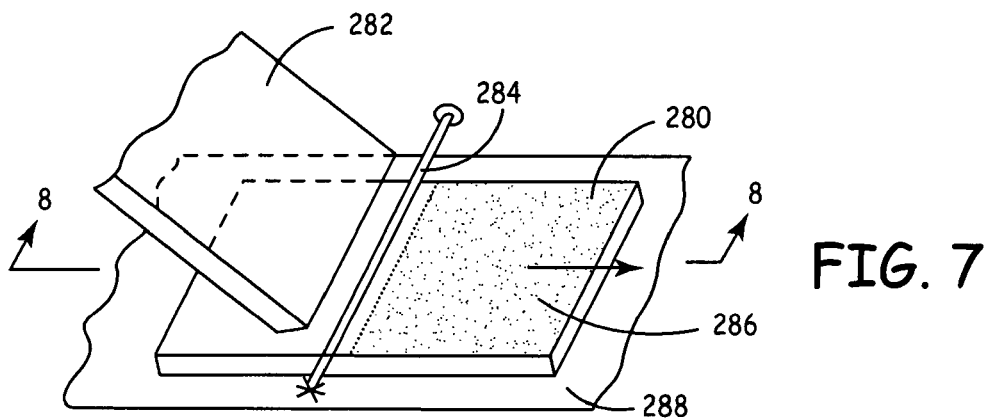
FIG. 7 is a perspective view of a reactant nozzle delivering reactants to a reaction zone positioned near a substrate.
Figure 8:
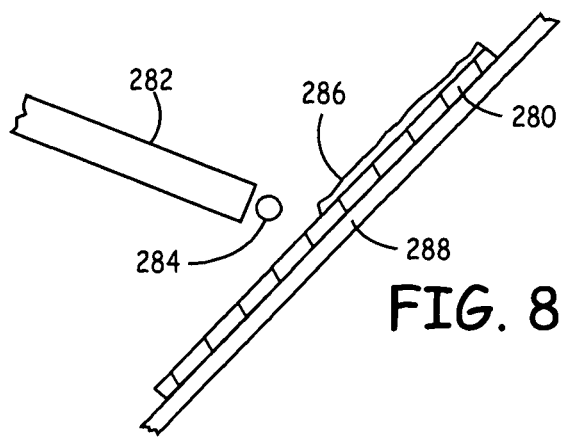
FIG. 8 is a sectional view of the apparatus of FIG. 7 taken along line 8-8.

Another embodiment is shown in an expanded view in FIGS. 7 and 8. A substrate 280 moves relative to a reactant nozzle 282, as indicated by the right directed arrow. Reactant nozzle 282 is located just above substrate 280. An optical path 284 is defined by suitable optical elements that direct a light beam along path 284. Optical path 284 is located between nozzle 282 and substrate 280 to define a reaction zone just above the surface of substrate 280.

Referring to FIGS. 7 and 8, a dense coating 286 is formed as the substrate is scanned past the reaction zone. In general, substrate 280 can be carried on a conveyor/stage 288. Conveyor/stage 288 can be connected to an actuator arm, as shown in FIG. 5. In alternative embodiments, rollers and a motor, a continuous belt conveyor, or any of a variety of design, comprising known designs, for translating a substrate can be used to carry the substrate.

In some embodiments, the position of conveyor 288 can be adjusted to alter the distance from substrate 286 to the reaction zone. Changes in the distance from substrate to the reaction zone correspondingly alter the temperature of the product stream striking the substrate. The temperature of the product flow striking the substrate generally alters the properties of the resulting coating. The distance between the substrate and the reaction zone can be adjusted empirically to produce desired coating properties, such as coating density. In addition, the stage/conveyor supporting the substrate can comprise thermal control features such that the temperature of the substrate can be adjusted to higher or lower temperatures, as desired.

Figure 9:
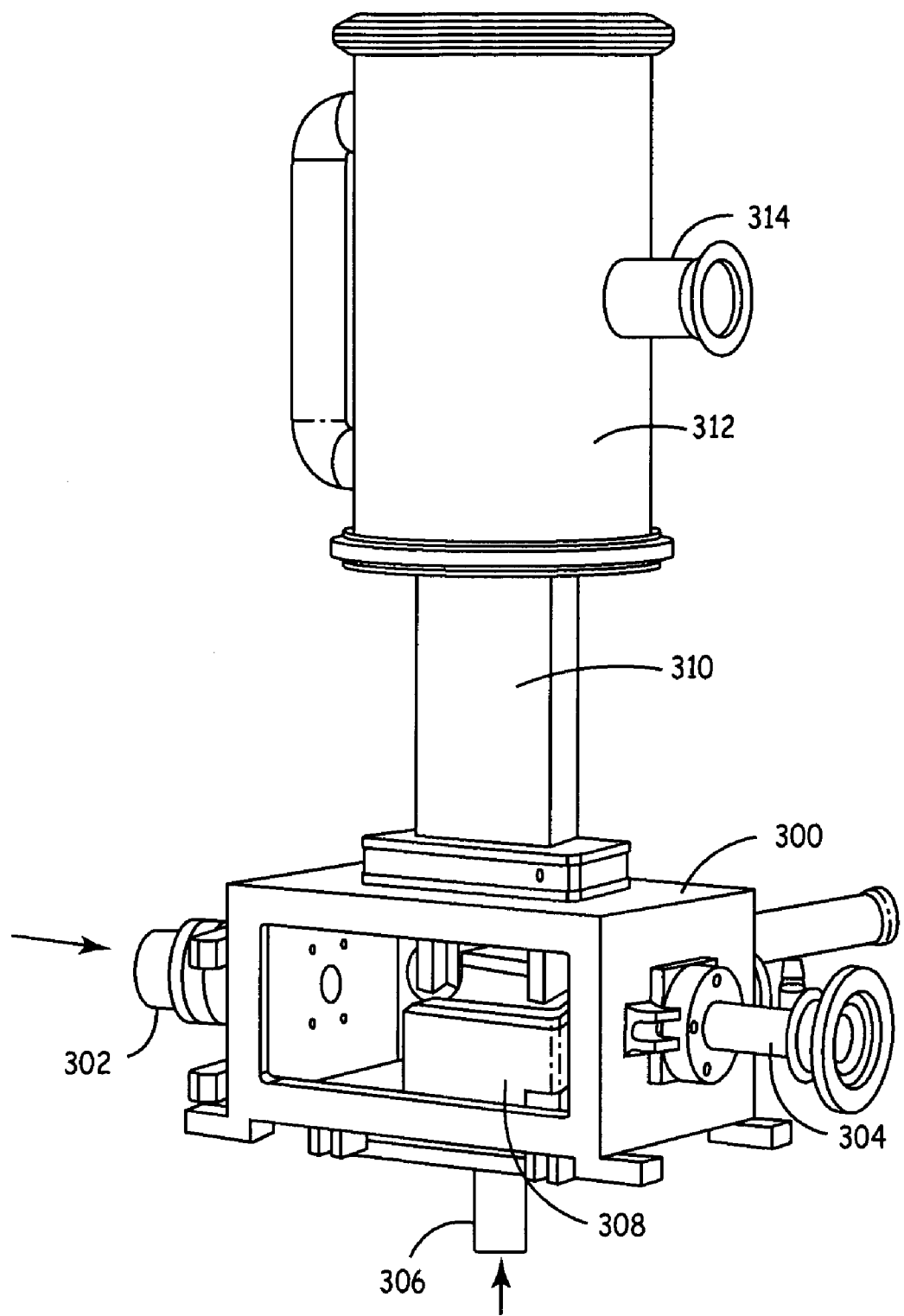
FIG. 9 is a perspective view of an embodiment of a reaction chamber for performing light reactive dense deposition.
Figure 10:
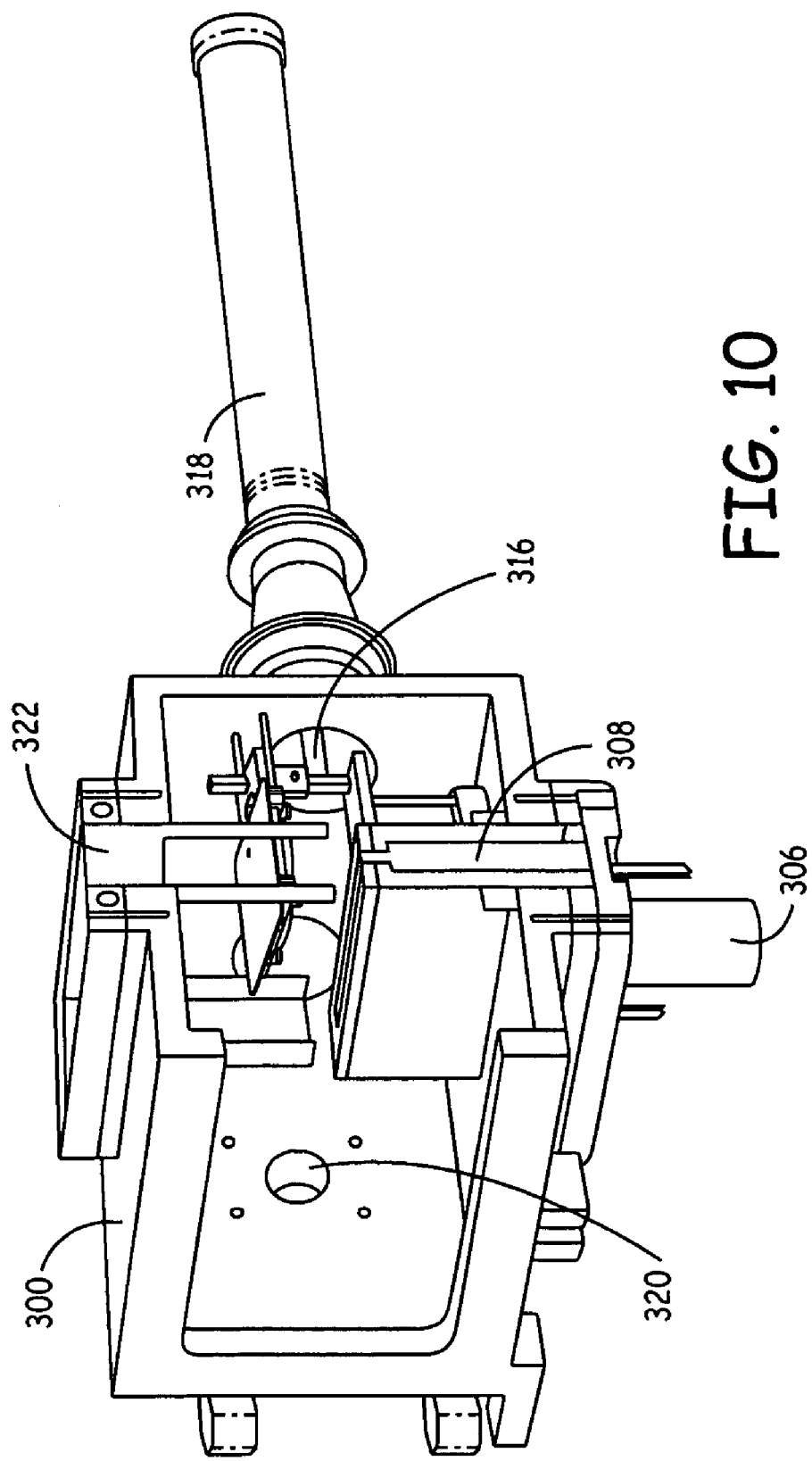
FIG. 10 is an expanded view of the reaction chamber of the light reactive deposition chamber of FIG. 9.
Figure 11:
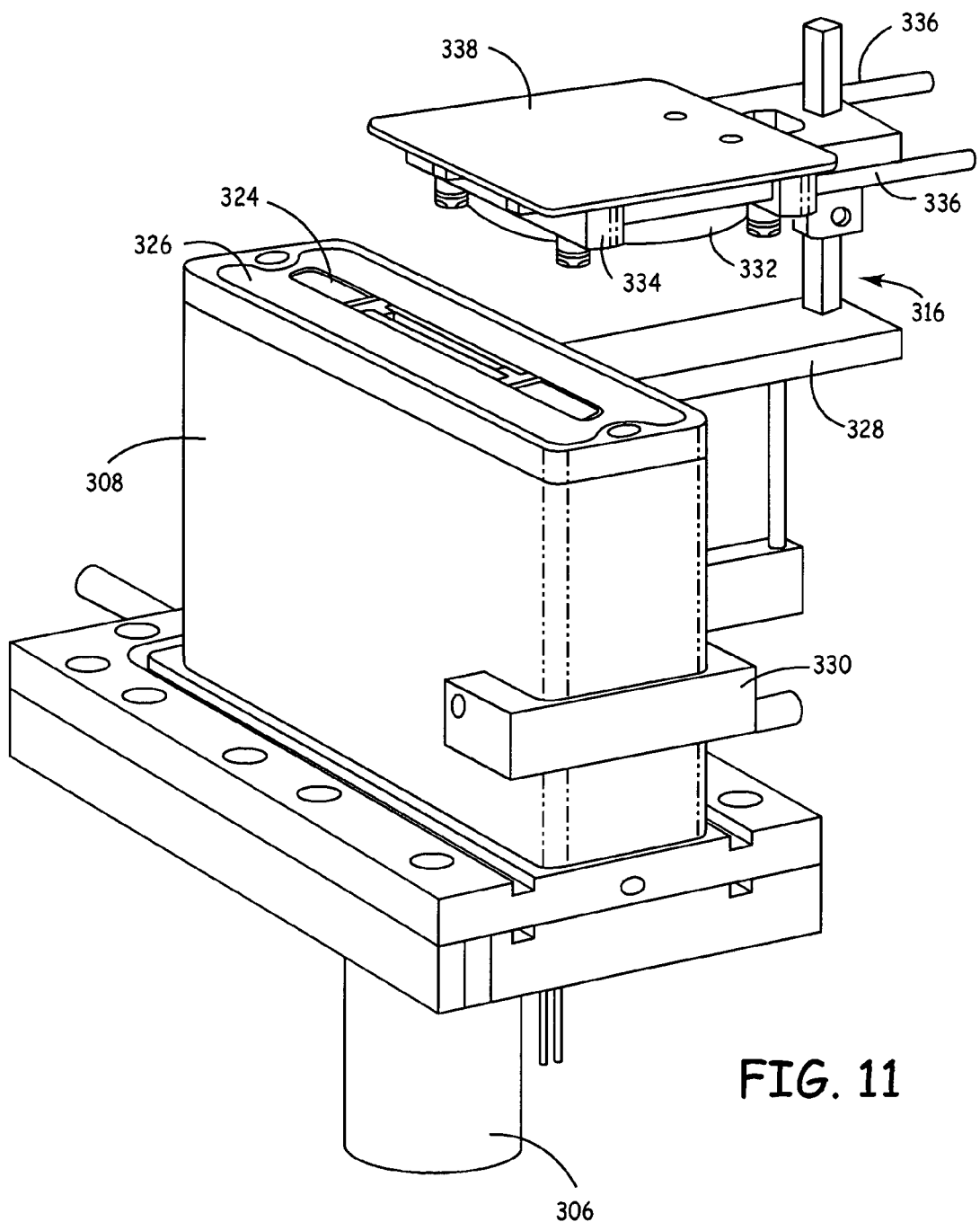
FIG. 11 is an expanded view of the substrate support of the reaction chamber of FIG. 9.

A particular embodiment of a light reactive dense deposition apparatus is shown in FIGS. 9-11. Referring to FIG. 9, process chamber 300 includes a light tube 302 connected to a $CO_2$ laser and a light tube 304 connected to a beam dump (not shown). An inlet tube 306 connects with a precursor delivery system that delivers vapor reactants and carrier gases. Inlet tube 306 leads to process nozzle 308. An exhaust transport tube 310 connects to process chamber 300 along the flow direction from process nozzle 308. Exhaust transport tube 310 leads to a product filtration chamber 312. Product filtration chamber 312 connects to a pump at pump connector 314.

An expanded view of process chamber 300 is shown in FIG. 10. A substrate carrier 316 supports a substrate above process nozzle 308. Substrate carrier 316 is connected with an arm 318, which translates the substrate carrier to move the substrate through the product stream emanating from the reaction zone where the light beam intersects the precursor stream from process nozzle 308. Arm 318 includes a linear translator that is shielded with a tube. A light entry port 320 is used to direct a light beam between process nozzle 308 and the substrate. In this embodiment, unobstructed flow from process nozzle would proceed directly to exhaust nozzle 322, which leads to exhaust transport tube 310.

An expanded view of substrate carrier 316 and process nozzle 308 is shown in FIG. 11. The end of process nozzle 308 has an opening for precursor delivery 324 and a shielding gas opening 326 around precursor opening to confine the spread of precursor and product flow. Substrate carrier 316 includes a support 328 that connects to process nozzle 308 with a bracket 330. A circular wafer 332 can be held in a mount 334 such that wafer 332 slides within mount 334 along tracks 336 to move wafer 332 into the flow from the reaction zone. Backside shield 338 prevents uncontrolled deposition of product composition on the back of wafer 332. Tracks 336 connect to arm 318.

For any of the coating configurations, the intersection of the flow with the substrate deflects the trajectory of the flow. Thus, it may be desirable to alter the position of the reaction chamber outlet to account for the change in direction of the flow due to the substrate. For example, it may be desirable to alter the chamber design to direct the reflected flow to the outlet and/or to change the position of the outlet accordingly. One particular example of an alternative flow configuration is shown in the embodiment below.

Figure 12:
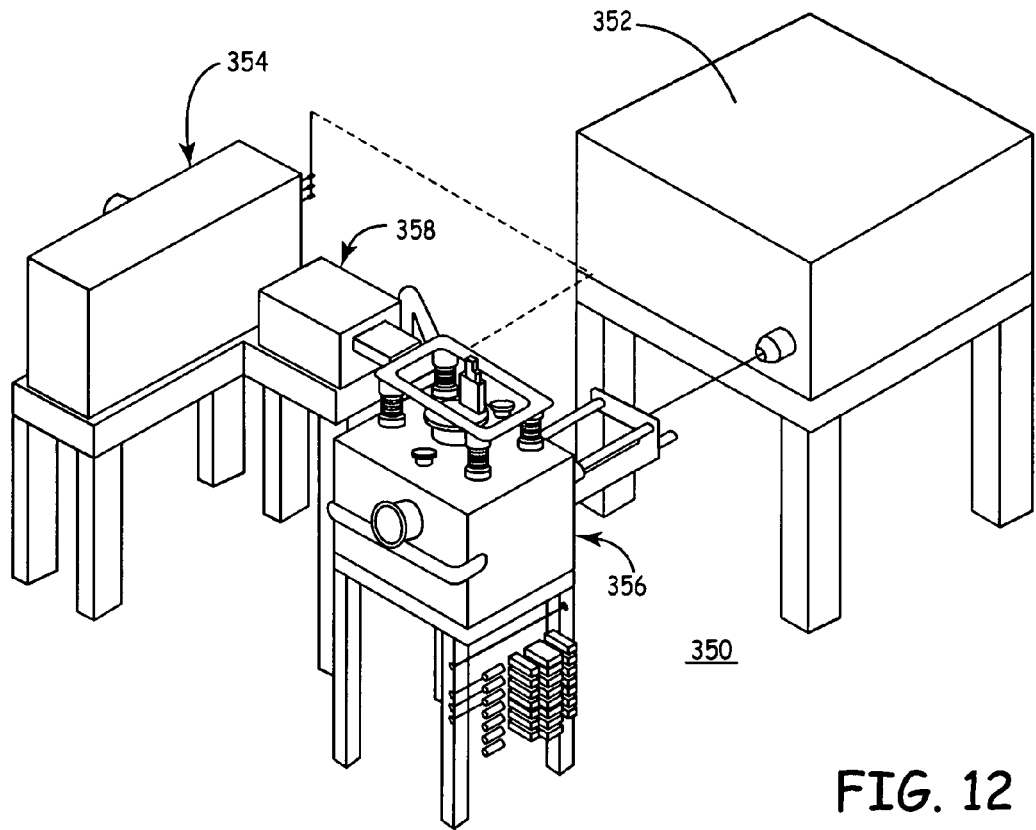
FIG. 12 is a perspective view of an alternative embodiment of an apparatus for performing light reactive dense deposition.
Figure 13:
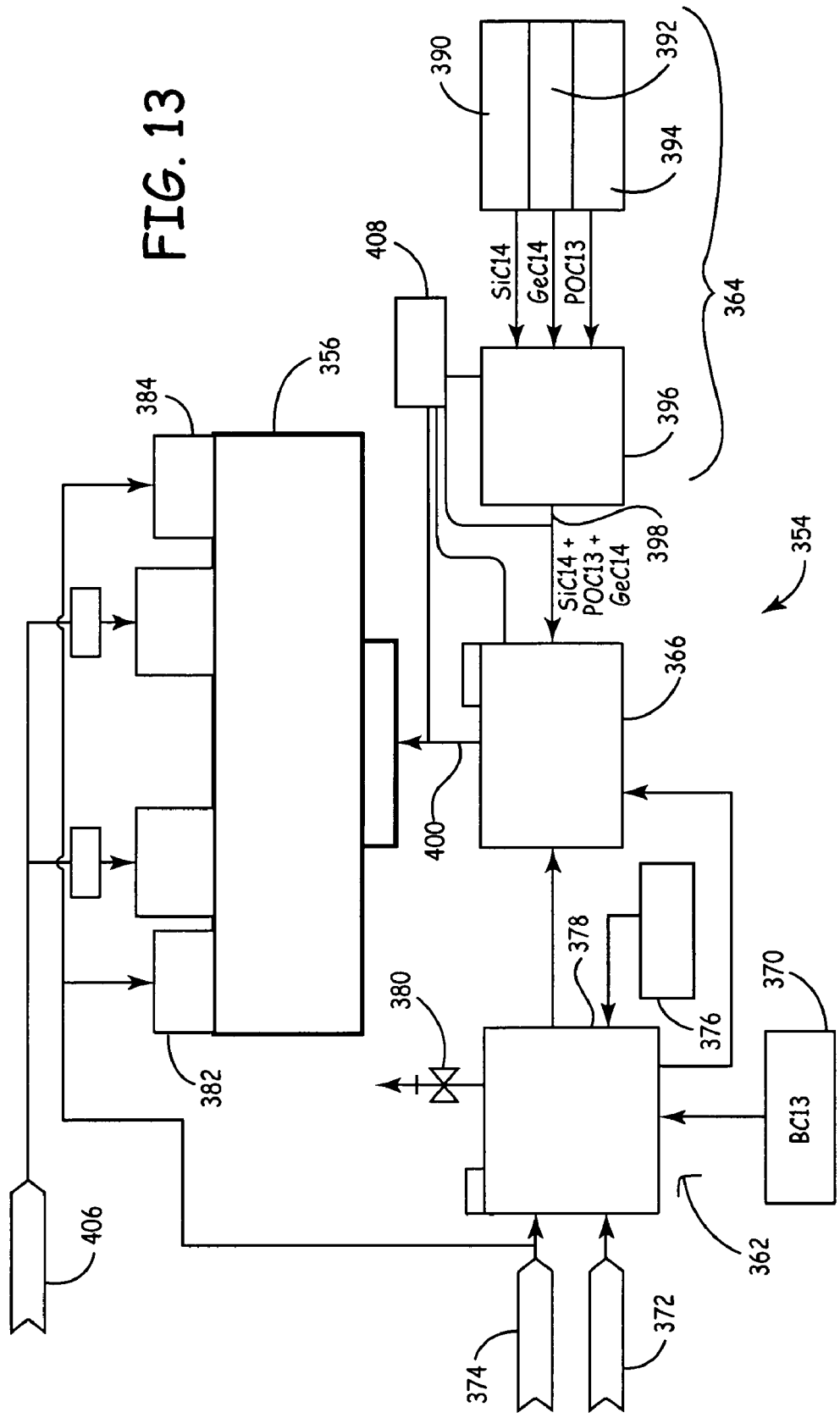
FIG. 13 is schematic diagram of the reactant delivery system of the apparatus in FIG. 12.

Another specific embodiment of a light reactive dense deposition apparatus is shown in FIG. 12. Apparatus 350 comprises a $CO_2$ laser light source 352, a reactant delivery system 354, a reaction chamber 356, and exhaust system 358. Referring to FIG. 13, a schematic diagram is shown with some specific reactants for forming doped silica glasses, although other reactants can be further included or substituted based on the disclosure herein.

Reactant delivery system 354 is shown schematically in FIG. 13. As shown in FIG. 13, reactant delivery system 354 comprises a gas delivery subsystem 362 and a vapor delivery subsystem 364 that join a mixing subsystem 366. Gas delivery subsystem 362 can comprise one or more gas sources, such as a gas cylinder or the like for the delivery of gases into the reaction chamber. As shown in FIG. 13, gas delivery subsystem 362 comprises boron precursor source 370, an oxygen source precursor 372, an inert gas source 374, and a light absorbing gas source 376. The gases combine in a gas manifold 378 where the gases can mix. Gas manifold can have a pressure relief valve 380 for safety. Inert gas source 374 can be also used to supply inert gas within the chamber adjacent the windows/lenses 382, 384 used to direct light from an external light source into chamber 356.

Vapor delivery subsystem 364 comprises a plurality of flash evaporators 390, 392, 394. Each flash evaporator can be connected to a liquid reservoir to supply liquid precursor in suitable quantities. Suitable flash evaporators are available from, for example, MKS Equipment or can be produced from readily available components. As shown in FIG. 13, flash evaporators 390, 392, 394 respectively supply a silicon precursor, a germanium precursor and a phosphorous precursor. The flash evaporators can be programmed to deliver a selected partial pressure of the particular precursor. The vapors from the flash evaporator are directed to a manifold 396 that directs the vapors to a common feed line 398. The vapor precursors mix within common feed line 398.

The gas components from gas delivery subsystem 362 and vapor components from vapor delivery subsystem 364 are combined within mixing subsystem 366. Mixing subsystem 366 can be a manifold that combines the flow from gas delivery subsystem 362 and vapor delivery subsystem 364. In the mixing subsystem 366, the inputs can be oriented to improve mixing of the combined flows of different vapors and gases at different pressures. The mixing block has a slanted termination to reduce backflow into lower pressure sources. A conduit 400 leads from mixing subsystem 366 to reaction chamber 356.

A separate shielding gas system 406 can be used to delivery inert shielding gas to a moving nozzle assembly in reaction chamber 356, although inert gas source 374 can be used to supply inert gas to an external section of the moving nozzle. The shielding gas from the external sections of the nozzle serve as a guide for the reactant precursor stream into the light reaction zone.

A heat controller 408 can be used to control the heat through conduction heaters or the like throughout the vapor delivery subsystem, mixing system 366 and conduit 400 to reduce or eliminate any condensation of precursor vapors. A suitable heat controller is model CN132 from Omega Engineering (Stamford, Conn.). Overall precursor flow can be controlled/monitored by a DX5 controller from United Instruments (Westbury, N.Y.). The DX5 instrument can be interfaced with mass flow controllers (Mykrolis Corp., Billerica, Mass.) controlling the flow of one or more vapor/gas precursors. The automation of the system can be integrated with a controller from Brooks-PRI Automation (Chelmsford, Mass.).

Figures 14, 19:
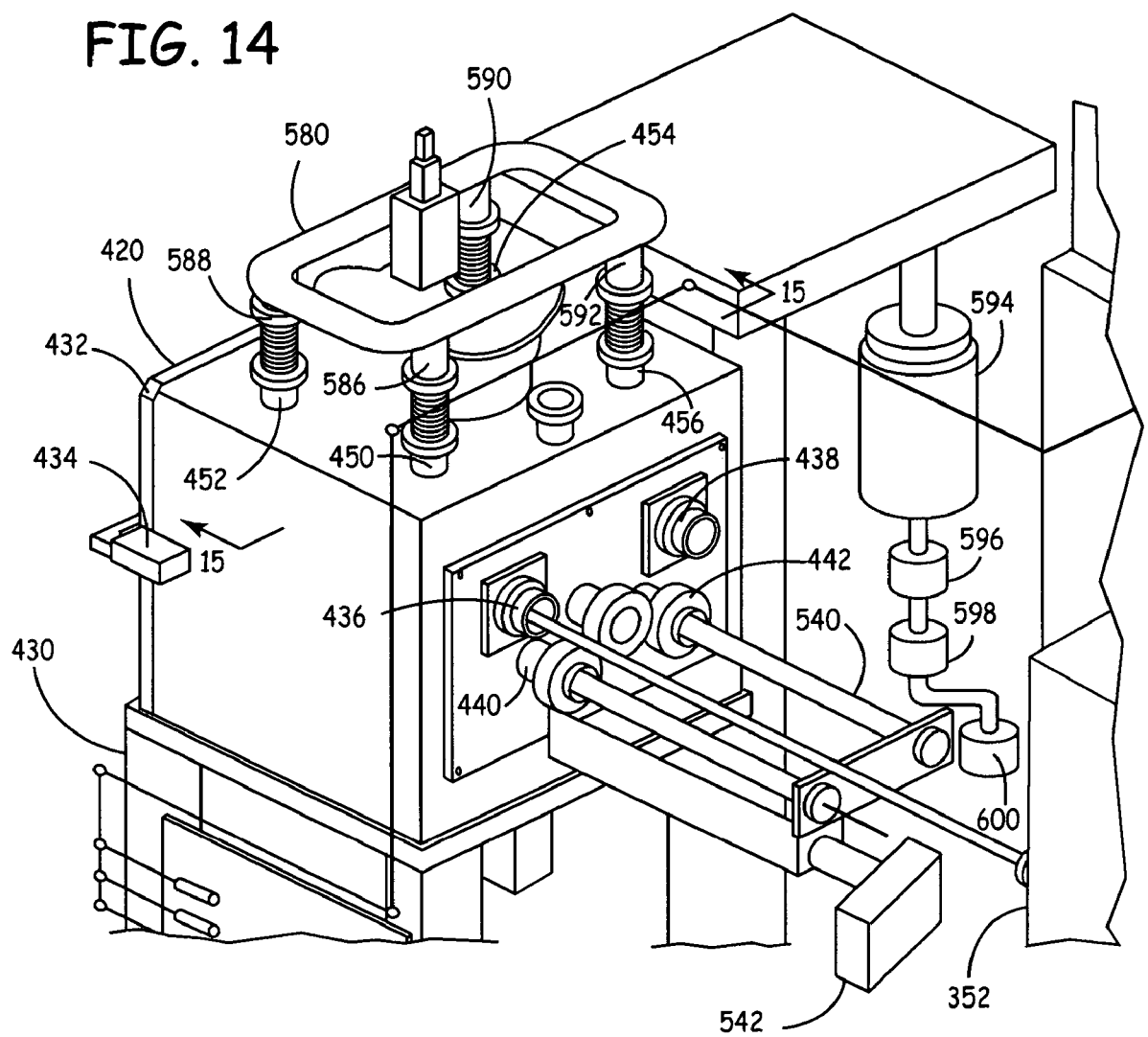
FIG. 14 is an expanded view of the reaction chamber of the apparatus of FIG. 12.
FIG. 19 is a top view of the reactant inlet nozzle for the reaction chamber of FIG. 14.
Figure 15:
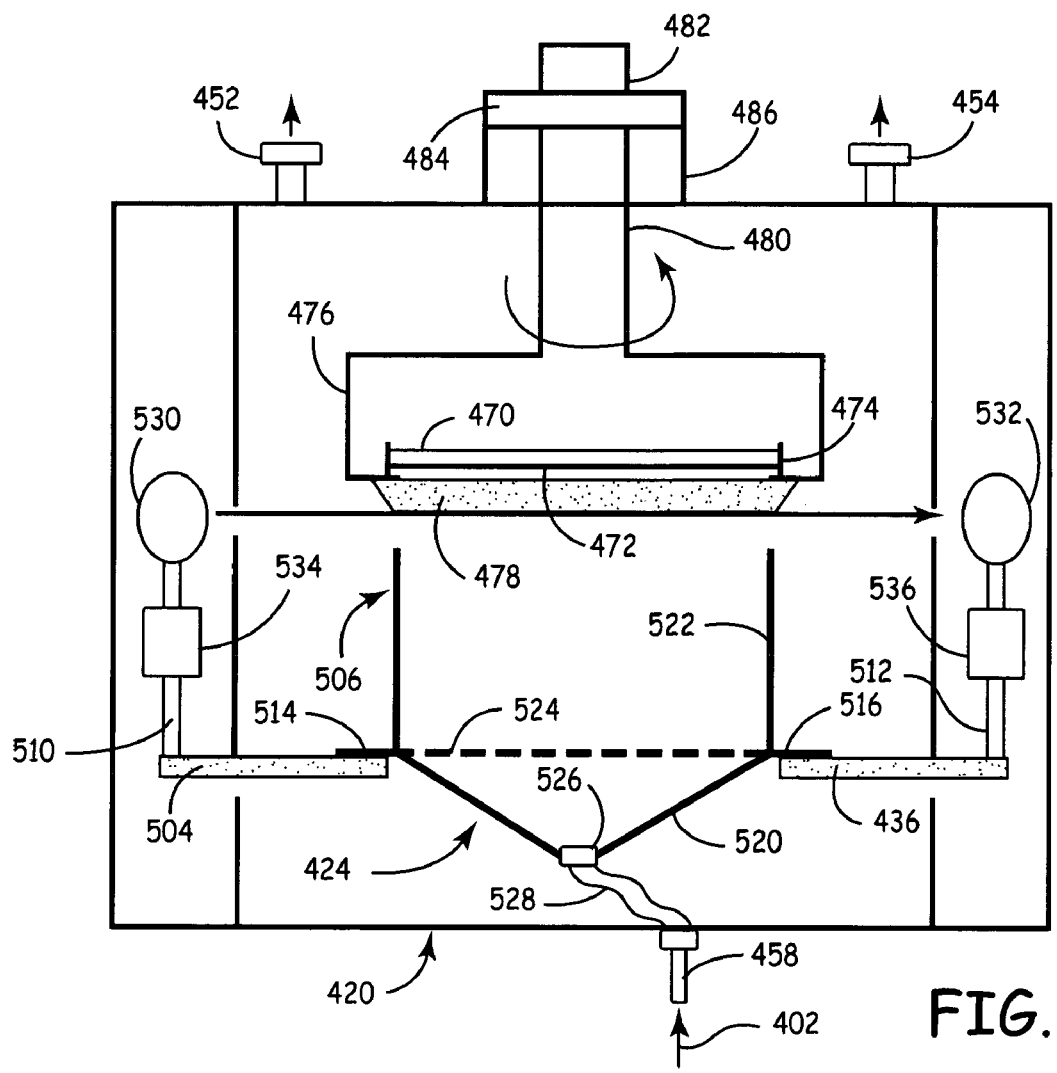
FIG. 15 is sectional view of the reaction chamber of FIG. 14 taken along line 15-15 of FIG. 14.
Figure 16:
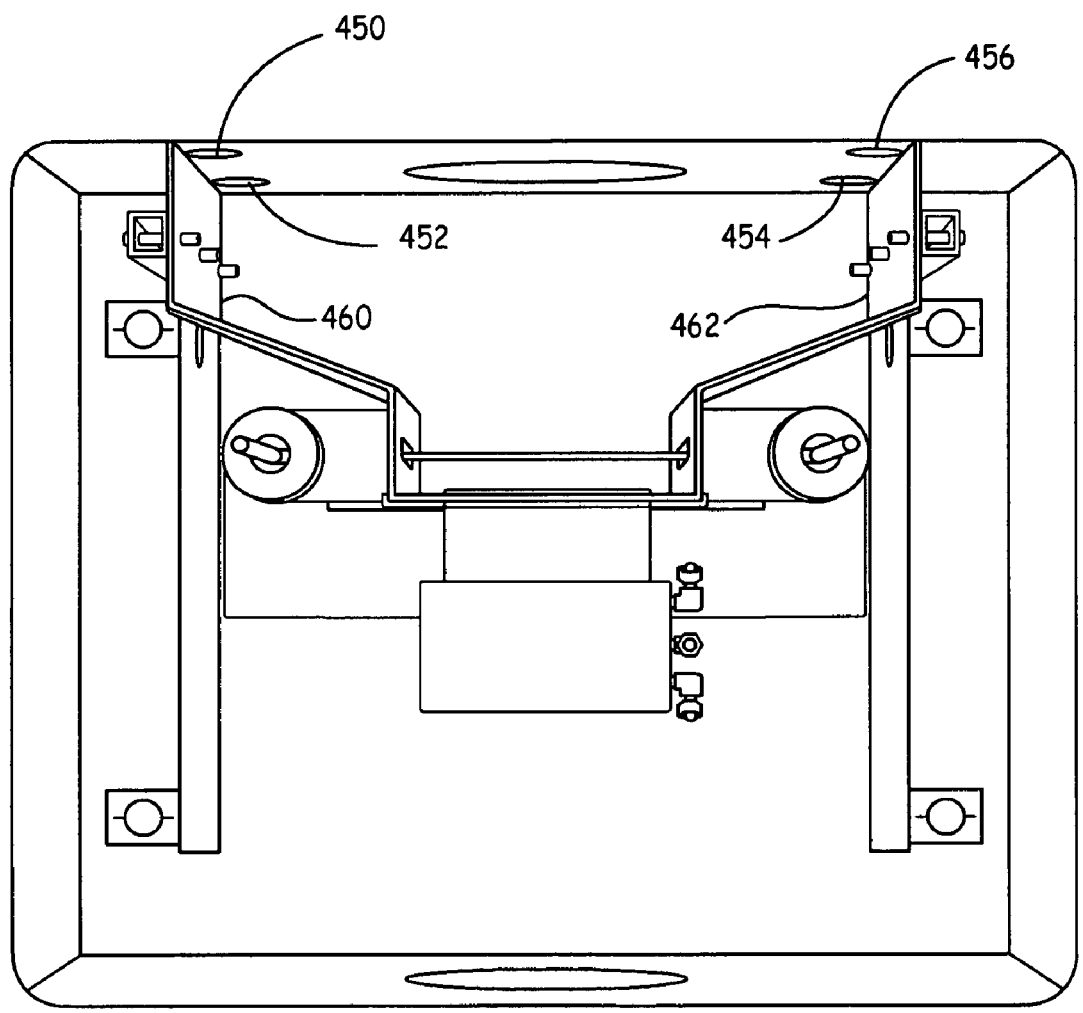
FIG. 16 is an alternative sectional view of the reaction chamber of FIG. 14 with the substrate holder portions removed and the baffle system visible.

Reaction chamber 356 comprises a chamber structure 420, a wafer mount 422 and a moving nozzle system 424. Referring to FIG. 14, chamber structure 420 rests on a stand 430. Chamber structure 420 comprises a hatch 432 that secures closed with a latch 434. Chamber structure 420 also comprises a window 436 that is positioned to receive light from laser 352, and a window 438 for exiting light, which can be connected to a power meter (not shown). Window 436 can include a lens, such as a cylindrical lens. Chamber structure 420 interfaces with moving nozzle system 424 through sealed ports 440, 442. Chamber structure 420 interfaces with exhaust system 356 through four vents 450, 452, 454, 456. Referring to FIG. 15, chamber structure 320 further comprises a reactant port 458 that connects reactant delivery system 352 at conduit 402 with moving nozzle system 424. Referring to FIG. 16, baffles 460, 462 guide flow to vents 450, 452, 454, 456.

Figure 17:
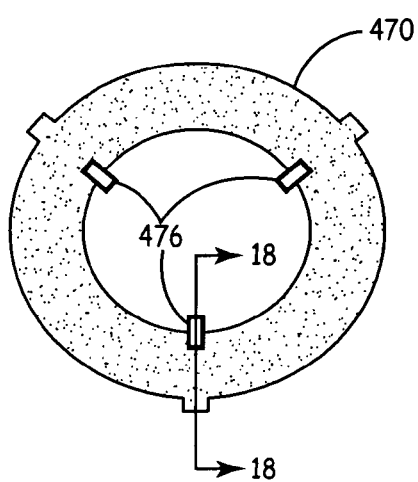
FIG. 17 is a top view of a substrate holder.
Figure 18:
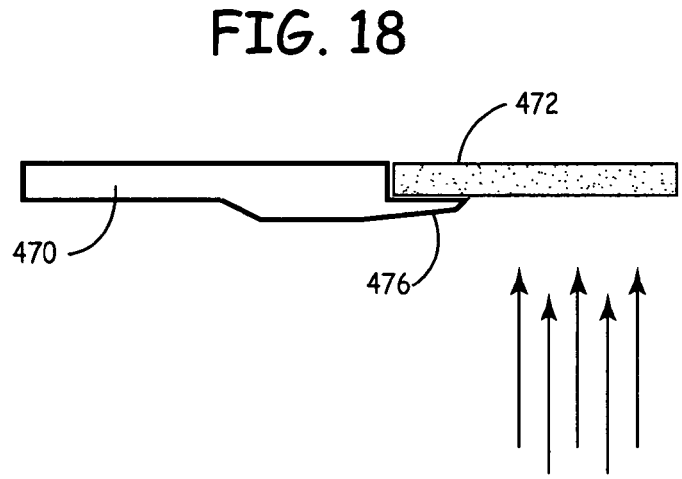
FIG. 18 is a sectional view of the substrate holder of FIG. 17 with a wafer with the section taken along line 18-18 of FIG. 17.

Wafer mount 422 comprises a wafer holder 470 that is supported with wafer 472 in brackets 474 within aluminum wafer mount 476. Referring to FIG. 17, wafer holder 470 is shown separated from the apparatus. Wafer holder 470 includes three pins 476 to hold the wafer, although a different number of pins can be used as desired. A sectional view is shown in FIG. 18 depicting the support of a wafer/substrate 472 by a pin 476. The flow of product during the coating process is shown with arrows. Away from pins 476, wafer holder 470 and wafer 472 form an approximately flat continuous surface with a small gap such that edge effects of the coating deposition along the edge of the wafer are reduced or eliminated. Suitable materials for the formation of the wafer holder include, for example, aluminum oxide or molybdenum.

Referring to FIG. 15, two-position shutter 478 can be selectively opened and closed to expose (open) or shield (closed) wafer 472. Aluminum wafer mount 476 comprises a shaft 480 that connects to a DC motor 482 through an o-ring seal 484 that is supported by mount 486 connected to chamber structure 420. With this structure, wafer 472 can be rotated. For example, the wafer can be rotated, e.g., 90 degrees or 180 degrees, between coating runs, or if desired within a coating run, or continuously throughout a coating run. In some embodiments, suitable motors are capable of rotating the wafer at a rate of about several hundreds of revolutions per minute.

Referring to FIGS. 14-16. moving nozzle system 424 comprises a moving mount 500 and drive system 502 Moving mount 500 comprises a mounting bracket 504, 506, nozzle 508 and mirror mounts 5100, 512. Mounting brackets 504, 506 connect nozzle 508 and mirror mounts 510, 512. Nozzle 508 connects with mounting brackets 504, 506 at flanges 514, 516. Nozzle 508 also comprises funnel section 520 and rectangular section 522 with a metal grid 524. Funnel section expands from an orifice 526 to rectangular section 522. A flexible tube 528 connects orifice 526 with reactant port 458, such that the nozzle remains connected to the reactant delivery system as the nozzle moves. In a particular embodiment, rectangular section has a rectangular cross section with dimensions of 0.08 inches × 4.65 inches as shown schematically a top view in FIG. 19, although other ratios of lengths or widths can be used. Metal grid 524 divides the flow from funnel section 520 to provide a more uniform flow in rectangular section 522. Nozzle designs for flowing reactors are described further in copending and commonly assigned U.S. patent application Ser. No. 10/119,645, now U.S. Pat. No. 6,919,054 to Gardner et al., entitled "Reactant Nozzles Within Flowing Reactors," incorporated herein by reference. Referring to FIG. 15, mirror mounts 510, 512 extend respectively from mounting brackets 504, 506. Mirror mounts 510, 512 also comprise respectively mirrors 530, 532, which can be, for example, parabolic or cylindrically focusing copper mirrors. The mirrors can be water cooled. The light path between mirrors 530, 532 is shown with an arrow in FIG. 15. Mirror mounts 510, 512 connect with drive system 502 at support brackets 534, 536.

Figure 20:
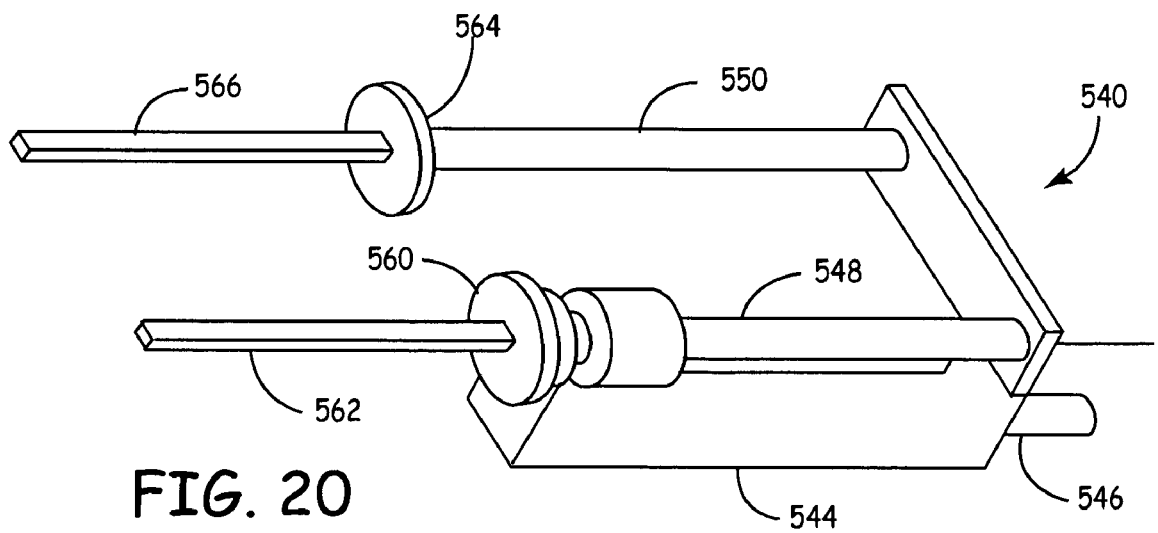
FIG. 20 is a perspective view of a dual linear manipulator, which is part of the drive system for the nozzle of the reaction chamber of FIG. 14, where the dual linear manipulator is separated from the reaction chamber for separate viewing.

Referring to FIG. 14, drive system 502 comprises a dual linear manipulator 540 and a motor 542. In one embodiment, the motor moves a magnet that couples to the manipulator arm such that it controls the movement of the manipulator arm. The movement of the manipulator arm results in the movement of the bracket/nozzle system. The velocity and acceleration throughout the motion can be precisely controlled. A suitable motor is a model P22NRXB-LNN-NF-00 from Pacific Scientific (Rockford, Ill.). Dual linear manipulator 540 comprises a motor interface bracket 544 with a motor interface rod 546. Motor interface bracket connects with a first shaft 548 and a second shaft 550, a shown in FIG. 20. First shaft 548 comprises stop 560 and a first support shaft 562, and second shaft 550 comprises a stop 564 and a second support shaft 566. Stops 560, 564 limit the motion of dual linear manipulator 540 when stops 560, 564 contact ports 440, 442. Support shafts 562, 566 slide through ports 440, 442, respectively, which are sealed with an o-ring. Furthermore, inert gas can be flowed from the back of the translator arm to purge the chamber and to keep the arms cleaner with respect to product compositions. Support shafts 562, 566 connect with moving nozzle system 424 at support brackets 534, 536, respectively, as shown in FIG. 15.

Support shafts support moving nozzle system 424. Furthermore, chamber 420 can comprise a support track to help support the moving nozzle system. For example, a guide rail can be included on each side of the chamber. The guide rails help to ensure uniformity during translation. In some embodiments, the arm comprises a flanged rulon bearing that rolls over the guiding rail.

In one embodiment, exhaust system 358 comprises a conduit 580, as shown schematically in FIG. 14. Conduit 580 comprises channels 586, 588, 590, 592 that connect respectively with vents 450, 452, 454, 456. Exhaust system 358 further comprises a filter 594, two in-fine Sodasorb® (W. R. Grace) chlorine traps 596, 598 and a pump 600. Conduit 580 connects with filter 594, and Sodasorb® traps 596, 598 are placed between filter 594 and pump 600 to prevent chlorine from damaging the pump. The line from second chlorine trap 598 can go directly to the pump. A suitable pump is a dry rotary pump from Edwards, such as model QDP80.

The temperature of the substrate during the deposition process can be adjusted to achieve particular objectives. For example, the substrate can be cooled during the deposition process since a relatively cool substrate can condense the product composition on its surface. However, in some embodiments, the substrate is heated, for example to about 500° C., during the deposition process.

Many of the apparatus features for the performance of light reactive deposition can be adapted for the performance of light reactive dense deposition based on the disclosure herein. Apparatuses for the formation of coatings by light reactive deposition, silicon glass deposition and optical devices in general are described further in copending U.S. patent application Ser. No. 09/715,935 to Bi et al., entitled "Coating Formation By Reactive Deposition," incorporated herein by reference, and in copending U.S. patent application Ser. No. 10/414,443 to Bi et al., entitled "Coating Formation By Reactive Deposition," incorporated herein by reference.

The well-defined reactant stream as a sheet of flow leading into the reaction zone tends to spread after the reaction zone due to heat from the reaction. If the substrate is swept relative to the reaction zone near the reaction zone, the spreading of the flow should not be significant. A general description of ranges of distances of the wafer from the radiation beam is given above.

The composition of the coating material can be changed incrementally or discretely to produce layers with varying composition, which can involve a gradual change in composition between two compositions or discrete layers with discrete composition differences. The resulting transition material can have a step-wise change in composition from a first composition to a second composition. Generally, the first composition and second composition are the compositions of the adjacent layers (or adjacent compositions in the same layer) such that the transition material provides a gradual transition in composition between the two adjacent layers. While a transition material can have two layers, the transition material generally has at least three layers, in other embodiments at least 4 layers and in further embodiments in the range(s) from 5 layers to 100 layers. A person of ordinary skill in the art will recognize that additional range(s) within these specific ranges are contemplated and are within the present disclosure. The total thickness can be selected as desired. For some embodiments of interest, each layer within the step-wise transition material generally has a thickness less than about 100 microns, in other embodiments less than about 25 microns, in further embodiments in the range(s) from about 500 nm to about 20 microns and in additional embodiments in the range(s) from about 1 micron to about 10 microns. A person of ordinary skill in the art will recognize that additional ranges within the specific ranges of layer numbers and layer thickness are contemplated and are within the present disclosure. The layers within the step-wise transition material may or may not have approximately equal thickness. Similarly, the step-wise change in composition may or may not take equivalent steps between layers of the transition material.

For the production of discrete devices or other patterned structures on a substrate surface, the composition of the material generally is different at different locations within the optical structure. To introduce the composition variation, the deposition process itself can be manipulated to produce specific structures. Alternatively, various patterning approaches can be used following the deposition for the formation of selected structures. Patterning following deposition of one or more coating layers is described further below.

Using the deposition approaches described herein, the composition of product deposited on the substrate can be changed during the deposition process to deposit coating material with a particular composition at selected locations on the substrate to vary the resulting composition of the coating material along the x-y plane. For example, if the product compositions are changed while sweeping the substrate through the product stream, stripes or grids can be formed on the substrate surface with different coating compositions in different stripes or grid locations. Using light reactive dense deposition, the product composition can be varied by adjusting the reactants that react to form the product compositions or by varying the reaction conditions. In some embodiments, the reactant flow can comprise vapor and/or aerosol reactants, which can be varied to alter the composition of the products. Similarly, dopant concentrations can be selected by varying the composition and/or quantity of dopant elements in the flow. The reaction conditions can also affect the resulting product properties. For example, the reaction chamber pressure, flow rates, radiation intensity, radiation energy/wavelength, concentration of inert diluent gas in the reaction stream, temperature of the reactant flow can affect the composition and other properties of the product materials.

While product composition changes can be introduced by changing the reactant flow composition or the reaction conditions while sweeping a substrate through the product stream, it may be desirable, especially when more significant compositional changes are imposed, to stop the deposition between the different deposition steps involving the different compositions. For example, to coat one portion of a substrate with a first composition and the remaining portions with another composition, the substrate can be swept through the product stream to deposit the first composition to a specified point at which the deposition is terminated. The substrate is then translated the remaining distance without any coating being performed. The composition of the product is then changed, by changing the reactant flow or reaction conditions, and the substrate is swept, after a short period of time for the product flow to stabilize, in the opposite direction to coat the second composition in a complementary pattern to the first composition.

The deposition process can be generalized for the deposition of more than two compositions and/or more elaborate patterns on the substrate. In the more elaborate processes, a shutter can be used to block deposition while the product flow is stabilized and/or while the substrate is being positioned. A precision controlled stage/conveyor can precisely position and sweep the substrate for the deposition of a particular composition. The shutter can be rapidly opened and closed to control the deposition. Gaps may or may not be used to space the different location of the compositions within the pattern. Specifically, voids can be left in the dense coating such that troughs or voids can be integrally a part of the layer structure, if desired. This capability of directly forming a dense high quality coating with selected voids would be a unique feature of the light reactive dense deposition.

In other embodiments, a discrete mask is used to control the deposition of product composition. A discrete mask can provide an efficient and precise approach for the patterning of coating material. With chemical vapor deposition and physical vapor deposition, a layer of material is built up from an atomic or molecular level, which can involve intimate binding of the mask to the underlying substrate at an atomic or molecular level to prevent migration of the material being deposited under the mask to blocked regions. Thus, the coated masks are a coating on the surface without an independent, self-supporting structure corresponding to the mask, and the coated mask is chemically or physically bonded to the surface with atomic level contact along the coated mask. In contrast, with product deposition as described herein, the product is directly flowed to the substrate surface at a high rate such that a mask with a flat surface placed against another flat surface provides sufficient contact to prevent significant product migration past the mask over the time frame of the deposition process. While coated masks can be effectively used in light reactive dense deposition, physical masks provide an efficient alternative to coated masks for patterning a surface using light reactive dense deposition. The physical masks have an intact self-supporting structure that is not bonded to the surface such that the mask can be removed intact from the surface that is coated. Therefore, the discrete mask approach herein is different from previous masking approaches adapted from photolithography for vapor deposition approaches.

In these embodiments, the formation of the dense coating correspondingly involves directing a product stream at the substrate shielded with the discrete mask. The discrete mask has a surface, generally a planar surface, with openings at selected locations. The discrete mask blocks the surface except at the openings such that product composition from the flow can deposit on the surface through the openings. Thus, the mask provides for patterning compositions on the surface by the selected placement of the openings. In some embodiments, suitable discrete masks comprise a mask with a slit that is narrower than the product flow such that the deposition process can be very precisely controlled. Movement of the slit can form a desired, precisely controlled pattern with one or more compositions. After use of a discrete mask, it can be removed and reused.

In some embodiments, a plurality of masks can be used to deposit coating material along a single layer. For example, following deposition of a pattern through a first mask, a second complementary mask can be used to deposit material over at least a portion of the surface left uncovered during deposition with the first mask. Further complementary masks can be used to form complex patterns while completing a single layer or portion thereof with a coating having varying chemical composition over the layer. Selected voids can be left as desired following the use of the plurality of physical masks.

Thus, using light reactive dense deposition, a range of effective approaches are available to vary the chemical composition of coating materials within layers and in different layers to form three-dimensional structures with selected compositions are selected locations within the material. In other words, the properties, such as optical, electromagnetic and/or physical properties, and/or chemical composition of the coating materials can be varied along all three axes, x, y and z, within the three-dimensional structure to form the desired assembly. The patterning of compositions of materials, particularly optical materials, during a light reactive deposition process is described further in copending and commonly assigned U.S. patent application Ser. No. 10/027,906, now U.S. Pat. No. 6,952,504 to Bi et al., entitled "Three Dimensional Engineering of Optical Structures," incorporated herein by reference, and these approaches can be further adapted for light reactive dense deposition using the teachings herein.

Composition of Coatings

The performance of light reactive dense deposition can be used to produce dense coatings with comparable compositions as the particles that can be produced by laser pyrolysis, which span a broad range of compositions. Specifically, the compositions can comprise one or more metal/metalloid elements forming a crystalline or amorphous material with an optional dopant or additive composition. In addition, dopant(s)/additive(s) can be used to alter the optical, chemical and/or physical properties of the particles. Incorporation of the dopant(s)/additive(s) into the reactant flow results in a distribution of the dopant(s)/additive(s) through the dense coating material.

In general, the dense coating material can generally be characterized as comprising a composition including a number of different elements and present in varying relative proportions, where the number and the relative proportions can be selected as a function of the application for the particles. Typical numbers of different elements include, for example, numbers in the range(s) from about 2 elements to about 15 elements, with numbers of 1, 2, 3, 4, 5, 6, 7, 8, 9, 10, 11, 12, 13, 14, and 15 being contemplated. In some embodiments, some or all of the elements can be a metal/metalloid element. General numbers of relative proportions include, for example, values in the range(s) from about 1 to about 1,000,000, with numbers of about 1, 10, 100, 1000, 10000, 100000, 1000000, and suitable sums thereof being contemplated. In addition, elemental materials are contemplated in which the element is in its elemental, un-ionized form, such as a metal/metalloid element, i.e., $M^o$.

Alternatively or additionally, such submicron/nanoscale particles can be characterized as having the following formula:

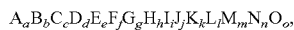

$$A_a B_b C_c D_d E_e F_f G_g H_h I_i J_j K_k L_l M_m N_n O_o,$$

where each A, B, C, D, E, F, G, H, I, J, K, L, M, N, and O is independently present or absent and at least one of A, B, C, D, E, F, G, H, I, J, K, L, M, N, and O is present and is independently selected from the group consisting of elements of the periodic table of elements comprising Group 1A elements, Group 2A elements, Group 3B elements (including the lanthanide family of elements and the actinide family of elements), Group 4B elements, Group 5B elements, Group 6B elements, Group 7B elements, Group 8B elements, Group 1B elements, Group 2B elements, Group 3A elements, Group 4A elements, Group 5A elements, Group 6A elements, and Group 7A elements; and each a, b, c, d, e, f, g, h, i, j, k, l, m, n, and o is independently selected and stoichiometrically feasible from a value in the range(s) from about 1 to about 1,000,000, with numbers of about 1, 10, 100, 1000, 10000, 100000, 1000000, and suitable sums thereof being contemplated. The materials can be crystalline, amorphous or combinations thereof. In other words, the elements can be any element from the periodic table other than the noble gases. As described herein, all inorganic compositions are contemplated, as well as all subsets of inorganic compounds as distinct inventive groupings, such as all inorganic compounds or combinations thereof except for any particular composition, group of compositions, genus, subgenus, alone or together and the like.

While some compositions are described with respect to particular stoichiometries/compositions, stoichiometries generally are only approximate quantities. In particular, materials can have contaminants, defects and the like. Similarly, some amorphous materials can comprise essentially blends such that the relative amounts of different components are continuously adjustable over ranges in which the materials are miscible. In other embodiments, phase separated amorphous materials can be formed with differing compositions at different domains due to immiscibility of the materials at the average composition. Furthermore, for amorphous and crystalline materials in which elements of a corresponding compound has a plurality of oxidation states, the materials can comprise a plurality of oxidation states. Thus, when stoichiometries are described herein, the actual materials may comprise minor amounts of other stoichiometries of the same elements also, such as $SiO_2$ also include some SiO and the like.

In some embodiments, coating materials can comprise, for example, silicon, elemental metal, and metal/metalloid compositions, such as, metal/metalloid oxides, metal/metalloid carbides, metal/metalloid nitrides, metal/metalloid phosphides, metal/metalloid sulfides, metal/metalloid tellurides, metal/metalloid selenides, metal/metalloid arsinides and mixtures and combinations thereof Especially in amorphous materials, great varieties of elemental compositions are possible within a particular material. While light reactive dense deposition is versatile with respect to the production of dense coatings with a wide range of compositions, in one embodiment, certain host materials for the introduction of dopant(s)/additive(s) are desirable because of their particular properties. For optical materials, some materials of particular interest comprise, for example, silicon oxide (silica), phosphate glasses, germanium oxide, aluminum oxide, indium phosphide, lithium niobate, lithium tantallte, telluride glasses, aluminum oxide, titanium oxide, gallium arsenide, combinations thereof and doped versions thereof Some metal/metalloid oxides are particularly desirable for optical applications and/or for their ability to consolidate into uniform glass layers. Suitable glass forming host oxides for doping include, for example, $TiO_2$, $SiO_2$, $GeO_2$, $Al_2O_3$, $P_2O_5$, $B_2O_3$, $TeO_2$, $CaO$—$Al_2O_3$, $V_2O_5$, $BiO_2$, $Sb_2O_5$ and combinations and mixtures thereof. Other metal/metalloid oxides have desirable optical properties in crystalline form, such as $LiNbO_3$, $LiTaO_3$, $Y_3Al_5O_{12}$ (YAG) and rare earth, especially Nd, doped YAG. The approaches described herein for dense coating formation are particularly suitable for formation of metalmetalloid oxide particles with or without dopant(s)/additive(s). Similarly, light reactive dense deposition is a suitable approach for dense coatings for the non-oxide materials, as described further below.

Furthermore, light reactive dense deposition can be effective for the deposition of dielectric materials for a range of applications. The nature of the dielectric materials depends on the particular applications. Traditional dielectric materials for semiconductor fabrication include, for, example, silicon dioxide ($SiO_2$, dielectric constant about 3.6) and silicon nitride (dielectric constant around 7). To form smaller integrated devices, lower dielectric materials are desired. To form some functional devices, higher dielectric materials are desired. With respect to low dielectric materials, silicon oxide can be deposited using light reactive dense deposition with selected degrees of porosity. The porous silicon oxide has air within the pores, which results in an effectively smaller dielectric constant while having controlled mechanical properties of the dense layer. The application of high dielectric materials is described further below. Compositions of interest for the formation of high dielectric materials include, for example, $Al_2O_3$, doped aluminum oxides (for example, doped with Zr, Si, Ti and/or Hf), $Ta_2O_5$, lead zirconate titanate, zirconium oxynitride, BaTiO3, La-doped $BaTiO_3$, $CaCu_3T_4O_{12}$, elemental silver, elemental platinum and the like.

In other embodiments of particular interest, light reactive dense deposition can be used for dense coatings applicable to fuel cell applications. While light reactive dense deposition can be used for a range of fuel cell products, it is of particular interest for the formation of fuel cells with ceramic layers. Fuel cell structures generally involve a stack of electrolytic cells with each cell comprising an anode and a cathode separated by a separator/electrolyte. The cells are stacked in series with an electrical interconnect or bipolar plate providing an electrical connection between adjacent cells in the stack. For appropriate fuel cell types, light reactive dense deposition can be used to form the anode, cathode, electrolyte and/or the interconnect as well as portions thereof The fuel cell may also have inactive support materials, which may be formed with light reactive dense deposition. For the formation of catalyst layers for electrodes, some limited porosity can be introduced in a controlled way using light reactive dense deposition to provide for appropriate penetration of the reactants, i.e., fuel or oxidizing agent, into the catalytic layer. However, electrolyte layers are generally non-porous or selectively porous to provide for selective conduction of ions without conducting other reactants. Similarly, the interconnect layers are electrically conductive but nonporous with respect to any reactant, although these materials are generally contoured to provide flow channels for fuel/oxidizing agents to get into the cell and byproducts to be removed from the cell.

For use in molten carbonate fuel cells, the anode catalyst can be nickel and/or cobalt doped-nickel. Similarly, for the cathode in a molten carbonate fuel cell the catalyst can be nickel oxide or lithium nickel oxide. For solid oxide fuel cells, various materials are suitable for anode catalysts. In particular, composites with yttrium stabilized zirconia (YSZ) can be used in which the YSZ functions as an ion conductor within the electrode. Titania-doped yttria stabilized zirconia can function as an ion conductor and an electrical conductor. Specific suitable composites include, for example, YSZ with Ni or doped nickel with cobalt, molybdenum, iron and/or titanium or YSZ with copper and cerium oxide. Suitable catalytic metal oxides for use in solid oxide fuel cells include, for example, ceria, $La_{1-x}M'_xCr_{1-y}M''_yO_3$, where M' is strontium, yttrium or combinations there of and M" is nickel, lanthanum, manganese, titanium, vanadium or combinations thereof, $La_{1-x}M'_xTi_{1-y}M''_yO_3$, where M' is strontium, yttrium or combinations there of and M" is nickel lanthanum, manganese, chromium, or combinations thereof, $La_{1-x}M'_xNi_{1-y}M''_yO_3$, where M' is strontium, yttrium or combinations there of and M" is titanium, lanthanum, manganese, chromium, or combinations thereof, $La_{1-x}M'_xCu_{1-y}M''_yO_3$, where M' is strontium, yttrium or combinations there of and M" is nickel lanthanum, manganese, chromium, or combinations thereof, or $La_{1-x}M'_xFe_{1-y}M''_yO_3$, where M' is strontium, yttrium or combinations there of and M" is molybdenum, nickel lanthanum, manganese, chromium, or combinations thereof For a molten carbonate fuel cell metal carbonate electrolytes can be deposited using appropriate precursors and reaction conditions. In particular, alkali carbonate can be codeposited with metal oxides. In particular a mixture of alkali carbonate and $LiAlO_2$ can be deposited using precursors of $LiNO_3$, $KNO_3$ and $Al(NO_3)_2$ in an oxygen environment with the lithium concentration selected to get the carbonate eutectic point. For a solid oxide fuel cell the electrolyte generally is yttrium stabilized zirconia. Suitable yttrium precursors for light reactive deposition using aerosol delivery include, for example, yttrium chloride ($YCl_3$), yttrium nitrate ($Y(NO_3)_3$) and the like and combinations of any two or more thereof Suitable zirconium precursors for aerosol delivery comprise, for example, zirconyl chloride ($ZrOCl_2$), zirconyl nitrate ($ZrO(NO_3)_2$), and the like, and combinations of any two or more thereof.

Electrically conductive elements can comprise elemental metals, conductive carbons, conductive metal compounds or a combination thereof. In particular, elemental metal particles, such as elemental copper, silver or gold, can be codeposited within an electrode to increase electrical conductivity. Similarly, graphitic carbon or other conductive carbon can be deposited by light reactive dense deposition to impart electrical conductivity. These carbon materials can be heated during the subsequent processing as long as no oxygen or other oxidizing agent is present. Furthermore, metal compositions such as doped lanthanum chromite can be used to impart electrical conductivity. Doped lanthanum chromite has been used in solid oxide fuel cell interconnects. Similarly, these materials can be used in interconnects/bipolar plates as coatings or layers with appropriate flow channels. A soluble compound can be coated to form flow channels following subsequent dissolving of the compound. For example, a metal chloride or metal nitrate can be deposited using an aerosol without any further reactants. The compound can be patterned as described above.

In addition, dense coating materials can comprise one or more dopants/additives within an amorphous material and/or a crystalline material. Dopant(s)/additive(s), which can be complex blends of dopant/additive composition(s), generally are included in non-stoichiometric amounts. A dopant/additive is generally a metal or metalloid element, although other dopant(s)/additive(s) of interest include fluorine, chlorine, nitrogen and/or carbon, which substitute for oxygen in oxides or other anions relative to metal/metalloid components. Since these anion dopant(s)/additive(s), like some cation dopants, tend to disrupt the oxygen bonded network of oxides, these tend to lower the flow temperature of oxide glasses, and these dopant(s)/additive(s) tend to lower the index-of-refraction and the dielectric constant. The dopant(s)/additive(s) generally can, for example, replace other constituents within the material in order to maintain overall electrical neutrality. Dopant(s)/additive(s) can impart desirable properties to the resulting materials. The amount of dopant(s)/additive(s) can be selected to yield desired properties while maintaining appropriate chemical stability to the material. In crystalline materials, dopant/additive element(s) can replace host elements at lattice sites, dopant/additive element(s) can reside at previously unoccupied lattice sites and/or dopant/additive element(s) can be located at interstitial sites. Unlike dopant(s)/additive(s) within crystalline materials in which the crystal structure influences incorporation of the dopant(s)/additive(s), dopant(s)/additive(s) within amorphous materials can behave more as a composition dissolved within the host material to form a solid mixture. Thus, the overall composition of the material influences the chemical properties, including the processing parameters and stability, of the resulting combined materials. Solubility of dopant(s)/additive(s) within a host amorphous material can influence the amount of a particular dopant/additive that can be homogeneously integrated into the dense coating material.

A dopant, such as a rare earth dopant, generally comprises in the range(s) less than about 15 mole percent of the metal/metalloid in the composition, in further embodiments in the range(s) less than about 10 mole percent, in some embodiments in the range(s) from about 0.001 mole percent to about 5 mole percent, and in other embodiments in the range(s) from about 0.025 to about 1 mole percent of the metalmetalloid in the composition. A person of ordinary skill in the art will recognize that the present disclosure similarly covers ranges within these specific ranges. Additive compositions are similar to dopant compositions except that they generally are included at higher amounts while still being a minority component of the composition, i.e., in the range(s) less than about 50 mole percent of the composition with any and all cut offs within this range being contemplated. For amorphous materials, additive(s) can be modifiers or intermediate compositions between glass formers and modifiers. Modifiers can disrupt the oxygen network within an oxide glass to modify the glass properties, such as flow temperature, coefficient of thermal expansion, chemical durability and the index-of-refraction. Thus, additive(s) can be useful for many of the same purposes as dopant(s). Doped and doping, for convenience, can refer to materials with dopants and/or additives and the process of incorporating dopants and/or additives, respectively. Suitable dopant(s)/additive(s) include, for example, rare earth metal(s) among other suitable element(s). Rare earth dopants can impart desirable modifications of properties, such as index-of-refraction, photosensitivity, fluorescence and paramagnetism.

In some embodiments, dense coatings can be formed with complex compositions comprising, for example, one or more metal/metalloid elements in a host material and, optionally, one or more selected dopants/additives in the amorphous host material. Similarly, crystalline materials can be formed with dopant(s)/additive(s) within a crystalline host material. The doped materials can be formed by directly depositing particles to form a powder coating using light reactive dense deposition and subsequently consolidating the powder coating into a uniform layer of a glass, polycrystalline or crystalline material. Alternatively, any dopant(s)/additive(s) can be introduced to a powder coating following its formation for incorporation into a consolidated uniform material, as described further below.

A dense coating can be produced with complex compositions using light reactive dense deposition. Materials can be formed with desired compositions by appropriately introducing a reactant composition to form the desired host material. The elements that modify the composition, such as elements introduced in approximately stoichiometric amounts as well as dopant(s)/additive(s), can be introduced into an appropriate host material during the formation of the host material. Specifically, selected elements can be introduced at desired amounts by varying the composition of the reactant stream. The conditions in the reactor can also be selected to produce the desired materials.

With respect to amorphous coating, e.g., glasses, while a variety of materials are of interest, silica ($SiO_2$)-based glasses are of interest due to their existing commercial applications. Other glass forming materials that are suitable for combining with silica to form amorphous host materials include, for example, $Al_2O_3$, $Na_2O$, $B_2O_3$, $P_2O_3$, $GeO_2$, and the like and combinations thereof. Thus, a plurality of glass forming compositions can be combined to form a blended glass host composition with desired properties, such as index-of-refraction. The blended glass host materials can be doped with further materials to further adjust the properties of the material. Some non-silica glasses are also very suitable for optical applications, such as germinates, phosphates, aluminocalcinates and tellurides. Some crystalline materials also have desirable optical properties.

Dopant(s)/additive(s) can be introduced to vary properties, such as optical properties and physical properties, of the dense coating. For example, dopant(s)/additive(s) can be introduced to change the index-of-refraction of the material as well as influencing the emission/gain bandwidth, and the absorption efficiency of other dopants. For optical applications, the index-of-refraction can be varied to form specific optical devices that operate with light of a selected frequency range. Dopant(s)/additive(s) can also be introduced to alter the processing properties of the material. Dopant(s)/additive(s) can also alter the physical properties of a resultant glass such as the thermal expansion coefficient and/or chemical durability. Dopants/additives can also interact within the materials. For example, some dopant(s)/additive(s), such as $P_2O_5$ and $Al_2O_3$, are introduced to increase the solubility of other dopant(s)/additive(s). Doped materials are useful in the production of optical devices. Using the techniques described herein, the doped materials can be formulated into planar optical devices, electrical devices, electrochemical cell components as well as other devices and components.

In one embodiment, materials of interest comprise amorphous compositions that form optical glasses with a plurality of dopants/additives. In some embodiments, the one or plurality of dopants/additives comprise rare earth metals. Rare earth metals can be desirable because of their modification of optical and electrical properties of the materials. In addition, the rare earth dopant(s)/additive(s) can influence the optical emission properties that can alter the application of the materials for the production of optical amplifiers and other optical devices. Rare earth metals comprise the transition metals of the group IIIb of the periodic table. Specifically, the rare earth elements comprise Sc, Y and the Lanthanide series. Other suitable dopant(s)/additive(s) include elements of the actinide series. For optical glasses, the rare earth metals of interest as dopants/additives comprise Er, Yb, Nd, La, Ce, Th, Dy, Ho, Sm, Eu, Gd, Pr, Tm, Sc, Y, and the like and combinations thereof Suitable non-rare earth metal dopants/additives include, for example, Al, Ga, Mg, Sr, Zn, Bi Sb, Zr, Pb, Li, Na, K, Ba, W, Si, Ge, P, B, Te, Ca, Rb, Sn, In, Ti, Au, Ag, Ta, Mo, Nb, and the like and combinations thereof Also, certain first-row transition metals have optical emission properties in the visible or infrared regions of the spectrum. Suitable first-row transition element having desirable optical properties as dopants/additives include, for example, V, Cr, Mn, Fe, Co, Ni and Cu. The wavelength of the optical emission depends on the oxidation-state of the transition-metal. This oxidation state generally can be controlled by adjusting the oxygen partial-pressure during the deposition process.

Various materials have been formed as submicron/nanoscale particles using laser pyrolysis. Some of these materials are described in the following description. Using light reactive dense deposition, these materials can be formed directly as dense coatings. Based on the description herein, a range of additional materials can be produced by light reactive dense deposition.

For example, the production of silicon oxide submicron/nanoscale particles is described in U.S. Pat. No. 6,726,990 to Kumar et al., entitled "Silicon Oxide Particles," incorporated herein by reference. This patent application describes the production of amorphous $SiO_2$. The production of titanium oxide submicron/nanoscale particles and crystalline silicon dioxide submicron/nanoscale particles is described in U.S. Pat. No. 6,387,531 to Bi et al., entitled "Metal (Silicon) Oxide/Carbon Composites," incorporated herein by reference. In particular, this application describes the production of anatase and rutile $TiO_2$.

In addition, submicron/nanoscale manganese oxide particles have been formed. The production of these particles is described U.S. Pat. No. 6,506,493 to Kumar et al., entitled "Metal Oxide Particles," incorporated herein by reference. This application describes the production of MnO, $Mn_2O_3$, $Mn_3O_4$ and $Mn_5O_8$.

Also, the production of vanadium oxide submicron/nanoscale particles is described in U.S. Pat. No. 6,106,798 to Bi et al., entitled "Vanadium Oxide Nanoparticles," incorporated herein by reference. Similarly, silver vanadium oxide submicron/nanoscale particles have been produced, as described in U.S. Pat. No. 6,225,007 to Horne et al., and U.S. Pat. No. 6,394,494 to Reitz et al., both entitled "Metal Vanadium Oxide Particles," and U.S. Pat. No. 6,503,646 to Ghantous et al., entitled "High Rate Batteries," all three of which are incorporated herein by reference.

Furthermore, lithium manganese oxide submicron/nanoscale particles have been produced by laser pyrolysis along with or without subsequent heat processing, as described in U.S. Pat. No. 6,607,706 to Kumar et al., entitled "Composite Metal Oxide Particles," U.S. Pat. No. 6,482,374 to Kumar et al., entitled "Reaction Methods for Producing Lithium Metal Oxide Particles," and U.S. Pat. No. 6,136,287 to Home et al., entitled "Lithium Manganese Oxides and Batteries," all three of which are incorporated herein by reference. The production of lithium cobalt oxide, lithium nickel oxide, lithium cobalt nickel oxide, lithium titanium oxide and other lithium metal oxides is described in U.S. Pat. No. 6,749,648 to Kumar et al., entitled "Lithium Metal Oxides," incorporated herein by reference.

The production of aluminum oxide submicron/nanoscale particles is described in copending and commonly assigned, U.S. patent application Ser. No. 09/136,483 to Kumar et al., entitled "Aluminum Oxide Particles," incorporated herein by reference. In particular, this application discloses the production of $\gamma$-$A_2O_3$. The formation of delta-$Al_2O_3$ and theta-$Al_2O_3$ by laser pyrolysis/light reactive deposition along with doped-crystalline and amorphous alumina is described in copending and commonly assigned U.S. patent application Ser. No. 09/969,025 to Chiruvolu et al., entitled "Aluminum Oxide Powders," incorporated herein by reference.

Amorphous aluminum oxide materials can be combined with other glass formers, such as $SiO_2$ and/or $P_2O_5$. For example, suitable metal oxide dopant(s)/additive(s) for aluminum oxide for optical glass formation comprise cesium oxide ($Cs_2O$), rubidium oxide ($Rb_2O$), thallium oxide ($Tl_2O$), lithium oxide ($Li_2O$), sodium oxide ($Na_2O$), potassium oxide ($K_2O$), beryllium oxide (BeO), magnesium oxide (MgO), calcium oxide (CaO), strontium oxide (SrO), barium oxide (BaO), and the like and combinations of any two or more thereof Glass dopant(s)/additive(s) can affect, for example, the index-of-refraction and/or the porosity of the glass. Suitable metal oxide dopants/additives for infrared emitters comprise, for example, cobalt oxide ($Co_3O_4$), $Er_2O_3$, $CrO_2$, $Tm_2O_3$, $Nd_2O_3$, $Yb_2O_3$, $Pr_2O_3$, $Dy_2O_3$, $Ho_2O_3$, and the like, and combinations of any two or more thereof In addition, tin oxide submicron/nanoscale particles have been produced by laser pyrolysis, as described in U.S. Pat. No. 6,200,674 to Kumar et al., entitled "Tin Oxide Particles," incorporated herein by reference. The production of zinc oxide submicron/nanoscale particles is described in copending and commonly assigned U.S. patent application Ser. No. 09/266,202 to Reitz, entitled "Zinc Oxide Particles," incorporated herein by reference. In particular, the production of ZnO submicron/nanoscale particles is described.

Submicron/nanoscale particles and corresponding coatings of rare earth metal oxide particles, rare earth doped metal/metalloid oxide particles, rare earth metal/metalloid sulfides and rare earth doped metal/metalloid sulfides are described in U.S. Pat. No. 6,692,660 to Kumar et al entitled "High Luminescence Phosphor Particles," incorporated herein by reference. Suitable host materials for the formation of phosphors comprise ZnO, ZnS, $Zn_2SiO_4$, SrS, $YBO_3$, $Y_2O_3$, $Al_2O_3$, $Y_3Al_5O_{12}$ and $BaMgAl_{14}O_{23}$, and combinations of any two or more thereof Exemplary non-rare earth metals for activating phosphor particles as dopant(s)/additive(s) include, for example, manganese, silver, lead, and the like and combinations thereof Exemplary rare earth metals for forming metal oxide phosphors include, for example, europium, cerium, terbium, erbium and the like and combinations thereof. Generally, heavy metal ions or rare earth ions are used as activators in phosphors. For phosphor applications, the particles are generally crystalline.

The production of iron, iron oxide and iron carbide is described in a publication by Bi et al., entitled "Nanocrystalline $\alpha$-Fe, $Fe_3C$, and $Fe_7C_3$ produced by $CO_2$ laser pyrolysis," J. Mater. Res. Vol. 8, No. 7 1666-1674 (July 1993), incorporated herein by reference. The production of submicron/nanoscale particles of silver metal is described in U.S. Pat. No. 6,394,494 to Reitz et al., entitled "Metal Vanadium Oxide Particles," incorporated herein by reference. Submicron/nanoscale carbon particles produced by laser pyrolysis is described in a reference by Bi et al., entitled "Nanoscale carbon blacks produced by $CO_2$ laser pyrolysis," J. Mater. Res. Vol. 10, No. 11, 2875-2884 (November 1995), incorporated herein by reference.

The production of iron sulfide ($Fe_{1-x}S$) submicron/nanoscale particles by low rate laser pyrolysis is described in Bi et al., Material Research Society Symposium Proceedings, vol. 286, p. 161-166 (1993), incorporated herein by reference. Precursors for laser pyrolysis production of iron sulfide were iron pentacarbonyl ($Fe(CO)_5$) and hydrogen sulfide ($H_2S$). Other suitable gaseous sulfur precursors for vapor delivery comprise, for example, pyrosulfuryl chloride ($S_2O_5Cl_2$), sulfur chloride ($S_2Cl_2$), sulfuryl chloride ($SO_2Cl_2$), thionyl chloride ($SOCl_2$), and the like, and combinations of any two or more thereof. Suitable sulfur precursors for aerosol delivery comprise, for example, ammonium sulfate ($(NH_4)_2S$), sulfuric acid ($H_2SO_4$), and the like, and any combinations thereof, which are soluble in water. Other metal/metalloid sulfide materials can be similarly produced.

Metal borates can be similarly formed using one or more metal precursors and a boron precursor. As a specific example, $TiB_2$ has potential utility in battery applications. Suitable titanium precursors include, for example, titanium tetrachloride ($TiCl_4$), titanium isopropoxide ($Ti[OCH(CH_3)_2]_4$), and the like, and combinations of any two or more thereof. Suitable boron precursors comprise, for example, boron trichloride ($BCl_3$), diborane ($B_2H_6$), $BH_3$, and the like, and combinations of any two or more thereof.

Cerium oxide can be produced using the laser pyrolysis apparatuses described above. Suitable precursors for aerosol delivery comprise, for example, cerous nitrate ($Ce(NO_3)_3$), cerous chloride ($CeCl_3$), cerous oxalate ($Ce_2(C_2O_4)_3$), and the like, and combinations of any two or more thereof. Similarly, zirconium oxide can be produced using the laser pyrolysis apparatuses described above. Suitable zirconium precursors for aerosol delivery comprise, for example, zirconyl chloride ($ZrOCl_2$), zirconyl nitrate ($ZrO(NO_3)_2$), and the like, and combinations of any two or more thereof The deposition of coatings of dielectric materials for chip capacitors is described in copending U.S. patent application Ser. No. 10/219,019. now U.S. Pat. No. 6,917,511 to Bryan, entitled "Reactive Deposition For The Formation Of Chip Capacitors," incorporated herein by reference. Suitable dielectric materials include a majority of barium titanate ($BaTiO_3$), optionally mixed with other metal oxides. Other dielectric oxides suitable for incorporation into ceramic chip capacitors with appropriate dopant(s)/additive(s) comprise, for example, $SrTiO_3$, $CaTiO_3$, $SrZrO_3$, $CaZrO_3$, $Nd_2O_3$-$2TiO_3$, $La_2O_3$-$2TiO_2$, and the like, and any two or more thereof.

The production of ternary submicron/nanoscale particles of aluminum silicate and aluminum titanate can be performed by laser pyrolysis following procedures similar to the production of silver vanadium oxide submicro/nanoscale particles described in U.S. Pat. No. 6,394,494 to Reitz et al., entitled "Metal Vanadium Oxide Particles," incorporated herein by reference. Suitable precursors for the production of aluminum silicate comprise, for vapor delivery, a mixture of aluminum chloride ($AlCl_3$), silicon tetrachloride ($SiCl_4$), and the like, and combinations thereof, and, for aerosol delivery, a mixture of tetra(N-butoxy) silane and aluminum isopropoxide ($Al(OCH(CH_3)_2)_3$), a mixture of tetraethoxysilane and aluminum nitrate, or tetraethoxysilane and aluminum chloride, or tetraethoxysilane and aluminum isopropoxide, and the like, and combinations of any two or more thereof. Similarly, suitable precursors for the production of aluminum titanate comprise, for aerosol delivery, a mixture of aluminum nitrate ($Al(NO_3)_3$) and titanium dioxide ($TiO_2$) powder dissolved in sulfuric acid, a mixture of aluminum isopropoxide and titanium isopropoxide ($Ti(OCH(CH_3)_2)_4$), and the like, and combinations of any two or more thereof.

The formation of submicron/nanoscale particles along with coatings of metal/metalloid compositions with complex anions is described in copending and commonly assigned U.S. patent application Ser. No. 09/845,985 to Chaloner-Gill et al., entitled "Phosphate Powder Compositions And Methods For Forming Particles With Complex Anions," incorporated herein by reference. Suitable polyatomic anions comprise, for example, phosphate ($PO_4^{-3}$), sulfate ($So_4^{-2}$), silicate ($SiO_4^{-4}$), and the like, and combinations of any two or more thereof Suitable phosphorous precursors for forming the phosphate anion, sulfur precursors for forming the sulfate anion and silicon precursors for forming the silicate anion are discussed above. Suitable cations comprise, for example, metal and metalloid cations. Phosphate glasses can be used in a variety of contexts. Phosphate compositions for glasses comprise, for example, aluminum phosphate ($AlPO_4$), calcium phosphate ($Ca_3(PO_4)_2$), and the like, and combinations of any two or more thereof. Suitable gaseous phosphate precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and combinations of any two or more thereof. Suitable phosphorous precursors for aerosol delivery comprise, for example, $(C_2H_5O)_3P$, $(C_2H_5O)_3PO$, ammonium phosphate (($NH_4)_3PO_4$), ammonium phosphate—dibasic (($NH_4)_2HPO_4$), ammonium phosphate—monobasic (($NH_4)H_2PO_4$), phosphoric acid ($H_3PO_4$), and the like, and combinations of any two or more thereof, which are all moderately soluble in water.

The synthesis by laser pyrolysis of silicon carbide and silicon nitride is described in copending and commonly assigned U.S. patent application Ser. No. 09/433,202 to Reitz et al., entitled "Particle Dispersions," incorporated herein by reference. Other metal/metalloid carbides and meta/metalloid nitrides can be similarly produced.

The formation of a powder coating comprising boron and phosphorous doped amorphous silica ($SiO_2$) is described in copending and commonly assigned U.S. patent application Ser. No. 09/715,935 to Bi et al. entitled "Coating Formation By Reactive Deposition," incorporated herein by reference. The doped silica powder coating was consolidated into a glass layer. Rare earth metal and other dopants for amorphous particles and powder coatings as well as complex glass compositions for powder coatings, and in particular, erbium doped aluminum silicate and aluminum-lanthanum-silicate powder coatings and glasses, are described in copending and commonly assigned U.S. patent application Ser. No. 10/099,597, now U.S. Pat. No. 6,849,334 to Home et al., filed on Mar. 15, 2002, entitled "Optical Materials And Optical Devices," incorporated herein by reference.

For some host glass forming materials and/or dopant(s)/additive(s) of particular interest for optical applications, suitable precursors can be described as a representative listing of precursor materials. Such a representative list follows.

Suitable silicon precursors for vapor delivery comprise, for example, silicon tetrachloride ($SiCl_4$), trichlorosilane ($Cl_3HSi$), trichloromethyl silane $CH_3SiCl_3$, tetraethoxysilane ($Si(OC_2H_5)_4$, also known as ethyl silane and tetraethyl silane), and the like, and combinations of any two or more thereof. Suitable boron precursors comprise, for example, boron trichloride ($BCl_3$), diborane ($B_2H_6$), $BH_3$, and the like, and combinations of any two or more thereof. Suitable phosphate precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and combinations of any two or more thereof. Suitable germanium precursors comprise, for example, $GeCl_4$, and the like, and combinations of any two or more thereof. Suitable titanium precursors comprise, for example, titanium tetrachloride ($TiCl_4$), titanium isopropoxide ($Ti[OCH(CH_3)_2]_4$), and the like, and combinations of any two or more thereof. Suitable liquid, aluminum precursors comprise, for example, aluminum s-butoxide ($Al(OC_4H_9)_3$), trimethyl aluminum ($Al(CH_3)_3$, trimethyl ammonia aluminum $Al(CH_3)_3NH_3$, and the like, and combinations of any two or more thereof A number of suitable solid, aluminum precursor compositions are available, such compositions comprising, for example, aluminum chloride ($AlCl_3$), aluminum ethoxide. ($Al(OC_2H_5)_3$), aluminum isopropoxide ($Al[OCH(CH_3)_2]_3$), and the like, and combinations of any two or more thereof. Suitable tellurium precursors comprise, for example, $Te(C_2H_5)_2$, $Te(CH_3)_2$, $Te(C_3H_7)_2$, $Te(C_4H_9)_2$, $Te(C_3H_4)_2$, $Te(CH_3C_3H_4)_2$, and the like, and combinations of any two or more thereof.

With respect to rare earth metal precursors, suitable precursors for vapor delivery include, for example, erbium heptafluorodimethyloctanedionate, $Er(C_{11}H_{19}O_2)_3$, $Yb(C_{11}H_{19}O_2)_3$, $Pr(C_{11}H_{19}O_2)_3$, $Nb(C_{11}H_{19}O_2)_3$, $Tm(C_{11}H_{19}O_2)_3$, and the like, and combinations of any two or more thereof. Some representative precursors for other desirable metal dopant(s)/additive(s) comprise, for example, liquid zinc precursor compositions, such as diethyl zinc ($Zn(C_2H_5)_2$), dimethyl zinc ($Zn(CH_3)_2$), and the like, and combinations of any two or more thereof. Suitable solid, zinc precursors with sufficient vapor pressure of gaseous delivery comprise, for example, zinc chloride ($ZnCl_2$), and the like, and combinations of any two or more thereof. Suitable lithium precursors for vapor delivery comprise, for example, solids, such as lithium acetate ($Li_2O_2CCH_3$), liquids, such as lithium amide ($LiNH_2$) dissolved in hexane, and the like, and combinations of any two or more thereof.

Suitable silicon precursors for aerosol production comprise, for example, silicon tetrachloride $Si(Cl_4)$, which is soluble in ether, trichlorosilane ($Cl_3HSi$), which is soluble in carbon tetrachloride, coilloidal silica, $Si(OC_2H_5)_4$, which is soluble in alcohol, $Si(OCH_3)_4$, $(CH_3)_3SiOSi(CH_3)_3$, and the like, and combinations of any two or more thereof. Similarly, suitable boron precursors for aerosol delivery include, for example, ammonium borate (($NH_4)_2B_4O_7$), which is soluble in water and various organic solvents, $B(OC_2H_5)_3$, $B(C_2H_5)_3$, and the like, and combinations of any two or more thereof. Suitable phosphorous precursors for aerosol delivery comprise, for example, ammonium phosphate (($NH_4)_3PO_4$), ammonium phosphate—dibasic (($NH_4)_2HPO_4$), ammonium phosphate—monobasic (($NH_4)H_2PO_4$) and phosphoric acid ($H_3PO_4$), which are all moderately soluble in water, as well as $OP(OC_2H_5)_3$, which is soluble in alcohol and ether, $P(OC_2H_5)_3$, $OP(OCH_3)_3$, and the like, and combinations of any two or more thereof. Suitable aluminum precursors for aerosol delivery comprise, for example, aluminum chloride ($AlCl_3.6H_2O$), which is soluble in many organic solvents, and aluminum nitrate ($Al(NO_3)_3.9H_2O$) and aluminum hydroxychloride ($Al_2(OH)_5Cl.2H_2O$), which are soluble in water, as well as $Al(C_2H_5)_3$, $Al(OC_4H_9)_3$, $Al(C_5H_7O_2)_3$, $Al(C_{18}H_{35}O_2)_3$, and the like, and combinations of any two or more thereof. Suitable titanium precursors for aerosol delivery comprise, for example, $Ti(N(CH_3)_2)_4)$, $TiO_2OH$, and the like, and combinations of any two or more thereof. Suitable germanium precursors for aerosol delivery comprise, for example, $Ge(OC_2H_5)_3$, $Ge(OCH_3)_4$, and the like, and combinations of any two or more thereof. Suitable tellurium precursors for aerosol delivery comprise, for example $TeCl_4$, which is soluble in alcohol, and the like, and combinations of any two or more thereof.

Similarly, rare earth dopant/additive precursor(s) can be supplied as an aerosol. Some representative rare earth precursors suitable for aerosol delivery are presented below with suitable solvents. Yttrium chloride ($YCl_3$) and yttrium nitrate ($Y(NO_3)_3$) are soluble in water. Lanthanum chloride ($LaCl_3$ and $LaCl_3.7H_2O$) and lanthanum nitrate hexahydrate ($La(NO_3)_3.6H_2O$) are soluble in water. Thulium chloride ($TmCl_3$ and $TmCl_3.7H_2O$) is soluble in water. Ytterbium chloride ($YbCl_3$ and $YbCl_3.6H_2O$) is soluble in water. Praseodymium chloride ($PrCl_3$ and $PrCl_3.7H_2O$) and praseodymium nitrate hexahydrate ($Pr(NO_3)_3.6H_2O$) are soluble in water. Neodymium chloride ($NdCl_3$ and $NdCl_3.6H_2O$) and neodymium nitrate hexahydrate ($Nd(NO_3)_3.6H_2O$) are soluble in water. Erbium chloride ($ErCl_3$ and $ErCl_3.6H_2O$) is soluble in water. Other suitable rare earth dopant(s)/additive(s) include, for example, $Er(NO_3)_3$, $CeCl_3$ and $Ce(NO_3)_3$.

Other non-rare earth metal dopant(s)/additive(s) also can be delivered by aerosol. For example, zinc chloride ($ZnCl_2$) and zinc nitrate ($Zn(NO_3)_2$) are soluble in water and some organic solvents, such as isopropyl alcohol. Suitable lithium precursors for aerosol delivery from solution comprise, for example, lithium acetate ($LiCH_3CO_2$) and lithium nitrate ($LiNO_3$), which are soluble in water and alcohol lithium chloride (LiCl), which is somewhat soluble in water, alcohol and some other organic solvents, lithium hydroxide (LiOH), which is somewhat soluble in water and alcohol, and the like, and combinations of any two or more thereof. Suitable bismuth precursors for aerosol delivery comprise, for example, bismuth nitrate ($Bi(NO_3)_3$), which is soluble in dilute aqueous acid solutions, and the like, and combinations of any two or more thereof. Antimony trichloride ($SbCl_3$) is soluble in alcohol. Barium azide ($Ba(N_3)_2$ and $Ba(N_3)_2.H_2O$) and barium chloride ($BaCl_2$) are soluble in water. Other barium compounds suitable for aerosol delivery include, for example, $Ba(C_2H_3O_2)_2$, $Ba(C_2H_3O_2)_2.H_2O$, $Ba(C_2H_3O_2)_2.H_2O$ and combinations thereof. Suitable antimony precursors comprise, for example, $Sb(C_2H_5)_3$, $Sb(OC_2H_5)_3$, $Sb_2(C_4H_4O_6)_3.6H_2O$ and combinations thereof.

As noted above, fluorine dopant(s)/additive(s) are of interest for some applications. For phosphate coating silica glasses, a fluoride precursor of particular interest comprises for example, phosphorus trifluoride ($PF_3$), which is a gas such that it is suitable for vapor delivery into a laser pyrolysis/light reactive deposition chamber. Other fluoride precursors for vapor and/or aerosol delivery comprises, for example, $(C_2H_5O)_3SiF$, $(C_2H_5O)_2SiF_2$, $(C_2H_5O)SiF_3$, $(C_2H_5)_2SiF_2$, $C_2H_5SiF_3$, $C_6H_5SiF_3$, $H_2SiF_6.xH_2O$, $SiF_4$, $Si_4F_3Cl$, $SiF_2Cl_2$, $SiFCl_3$, $HPO_2F_2$, $HPF_6.6H_2O$, $(i-C_3H_7O)_2POF$, $H_2PO_3F$, $CF_4$, $CF_3COCF_3H_2O$, $AlF_3$, $SnF_2$, $SnF_4$, $GeF_2$, $GeF_4$, $GeF_3Cl$, $GeF_2Cl_2$, $GeFCl_3$, $TiF_4$, $FCH_2CO_2H$, $C_2F_6$, $CCl_2F_2$, $BF_3.2H_2O$, $[(CH_3)2N]2BF$, $C_6H_5BF_2$, $(4-CH_3C_6H_4)BF_2$, $(4-CH_3C_6H_4)BF_2$, $HBF_4$, and the like, and combinations of any two or more thereof. Chlorine dopant(s)/additive(s) can be introduced as the chloride of a metal/metalloid element or in similar compounds as fluorine. Carbon and nitrogen dopant(s)/additive(s) can be introduced as elements associated with other precursors, and carbon can be supplied as ethylene or other hydrocarbon.

In general, the selection of the composition of coating materials is based on the intended use of the materials. Similarly, any dopants/additives are similarly selected. The resulting properties of the dense coating depend on the compositions, including any dopants/additives and the phase(s), e.g., crystallinity or amorphous character, of the coating as well as the coating thickness and spatial extent. Desirable properties for some applications are described above in some detail either with respect to specific compositions or more generally.

Coating Properties

Light reactive dense deposition is a versatile approach for the high rate formation of high quality dense coatings. While the coatings are formed relatively dense, the density in some embodiments can be less than the density of the fully dense bulk material. By controlling the density, some limited porosity can be introduced within the dense coating. However, since the coating is relatively dense, the coating generally has mechanical stability. This versatility for selecting some porosity within a mechanically stable layer can be useful, for example, for the formation of low dielectric materials as well as fuel cell electrodes. At the same time, the coatings can be formed with smooth surfaces and a high degree of uniformity both across a particular coating as well as between coating on different substrates performed under equivalent conditions.

The relative density of a dense coating is evaluated relative to the filly densified material of the same composition. In general, the relative density for a dense coating formed using light reactive dense deposition is in the range(s) of at least about 0.65, in other embodiments in the range(s) from about 0.7 to about 0.99, in some embodiments from about 0.75 to about 0.98 and in further embodiments in the range(s) from about 0.80 to about 0.95. A person of ordinary skill in the art will recognize that additional ranges within these specific ranges are contemplated and are within the present disclosure. Light reactive dense deposition can form a dense coating with approximately the same density as the fully densified material. The density of the dense coating can be evaluated by weighting the substrate before and after coating and dividing the weight by the volume of the coating. In general, for single crystalline materials or crystalline domains the density of the coating would be expected to be approximately the density of the bulk material although imperfections can alter this density. For polycrystalline and amorphous materials, the density can have greater variation. A decrease in density may or may not be associated with a measurable porosity of the surface.

In addition, the density of the material can be evaluated indirectly through an evaluation of the etch rates. A wide range of etching approaches are known in the art for corresponding materials. Examples of using etch rate for information relating to density are described, for example, in U.S. Pat. No. 3,850,687 to Kern, entitled "Method of Densifying Silicate Glasses," U.S. Pat. No. 5,766,976 to Majima et al., entitled "Method for Detetecting Crystal Defects in a Silicon Single Crystal Substrate," and U.S. Pat. No. 6,803,240 to Bedell et al., entitled "Method of Measuring Crystal Defects in thin Si/SiGe Bilayers," all three of which are incorporated herein by reference. In some embodiments, the etch rate can be compared with the etch rate of materials with comparable compositions and known densities.

To obtain particular objectives, the features of a coating can be varied with respect to composition of layers of the coating as well as location of materials on the substrate. Generally, to form a device the coating material can be localized to a particular location on the substrate. In addition, multiple layers of coating material can be deposited in a controlled fashion to form layers with different compositions. Similarly, the coating can be made a uniform thickness, or different portions of the substrate can be coated with different thicknesses of coating material. Different coating thicknesses can be applied such as by varying the sweep speed of the substrate relative to the particle nozzle, by making multiple sweeps of portions of the substrate that receive a thicker coating or by patterning the layer, for example, with a mask. Approaches for the selective deposition of coating material are described above. Alternatively or additionally, a layer can be contoured by etching or the like following deposition.

Thus, layers of materials, as described herein, may comprise particular layers that do not have the same planar extent as other layers. For example, some layers may cover the entire substrate surface or a large fraction thereof while other layers cover a smaller fraction of the substrate surface. In this way, the layers can form one or more localized devices. At any particular point along the planar substrate, a sectional view through the structures may reveal a different number of identifiable layers than at another point along the surface. Light reactive dense deposition can be used to form thick coatings. However, the approach has advantages for forming high quality coatings for applications in which an appropriate coating thickness is generally moderate or small, and very thin coatings can be formed as appropriate. Thickness is measured perpendicular to the projection plane in which the structure has a maximum surface area. For some applications, the dense coatings have a thickness in the range(s) of no more than about 2000 microns, in other embodiments, in the range(s) of no more than about 500 microns, in additional embodiments in the range(s) from about 50 nanometers to about 100 microns and in further embodiments in the range(s) from about 100 nanometers to about 50 microns. A person of ordinary skill in the art will recognize that additional range(s) within these explicit ranges and subranges are contemplated and are encompassed within the present disclosure.

The approaches described herein provide for the formation of dense coating layers that have very high uniformity within a layer and between layers formed under equivalent conditions. Thicknesses of a dense coating layer can be measured, for example, with a scanning electron microscope (SEM) with the examination of a cross section, such as SEM instuments available from Hitachi, a spectrophotometry-based film analysis apparatus, such as a FilmTek™ 4000 (Scientific Computing International, Carlsbad, Calif.), or a prism coupling-based apparatus, such as a 2010 Prism Coupler (Metricon Corp., Pennington, N.J.). To measure the thickness variation across a layer of dense coating material, the thickness can be measured, for example, using a Metricon Prism Coupler at nine points across the film. Additionally or alternatively, an SEM analysis can be performed on a cross section, for example, at about 10 points along a first direction and about 10 points across the perpendicular direction. With the FilmTek™ spectrophotometry apparatus, the instrument can be automated to take measurements at the number of points desired, generally nine or more, and in further embodiments 10, 20, 30 or more points. The average and standard deviation can be obtained from these measurements. Some of, these measurement apparatuses are only suitable for use with optical glass materials. In evaluating thickness and thickness uniformity of a coating layer, a one centimeter band along the edge is excluded. In some embodiments, one standard deviation of the thickness on a substrate with an area of at least about 25 square centimeters can be in the range(s) of less than about 0.5 microns, in other embodiments less than about 0.35 microns and in further embodiments from about 0.075 to about 0.25 microns. In addition, the standard deviation of the average thickness between a plurality of substrates coated under equivalent conditions can be less than about 0.1 microns, in other embodiments less than about 0.08 microns and in further embodiments from about 0.04 to about 0.06 microns. A person of ordinary skill in the art will recognize that additional deviations in thickness within a layer and between layers of different wafers within the explicit ranges above are contemplated and are within the present disclosure.

Furthermore, very low surface roughness for a dense coating on a substrate can be achieved. Surface roughness is evaluated generally with respect to a specific area of the surface for comparison. Different techniques may be particularly suited for the evaluation of surface roughness over particular areas due to time and resolution issues. For example, atomic force microscopy (AFM) can be used to evaluate a root mean square surface roughness over an approximate 20 micron by 20 micron area of a substrate, which is referred to herein as $R_{AFM}$. A suitable AFM instrument includes, for example, a Digital Instruments (Santa Barbara, Calif.) Model Nanoscope® 4. Using the techniques described herein, $R_{AFM}$ values and similarly average roughness values ($R_a$) can be obtained in the ranges of no more than about 0.5 nanometers (nm), and in other embodiments in the ranges from about 0.1 nm to about 0.3 nm. Interferometry can be used to obtain surface roughness measurements over larger areas, such as 480 microns×736 microns. An interferometric profiler is an optical non-contact technique that can measure surface roughness from sub-nanometer to millimeter scales. A suitable interferometric profiler using digital signal processing to obtain surface profile measurement is a Wyko series profiler from Veeco Instruments Inc. (Woodbury, N.Y.). Using light reactive dense deposition, root mean square surface roughness ($R_{rms}$) values and similarly the average surface roughness ($R_a$) over 480 microns×736 microns can be obtained in the ranges of no more than about 10 nm and in further embodiments from about 1 nm to about 5 nm. A person of ordinary skill in the art will recognize that additional ranges of surface roughness within the explicit ranges are contemplated and are within the present disclosure.

Additional Processing of Dense Coating Materials

While the dense coatings can be essentially deposited in a form selected for an intended use, some additional process can be needed or desirable. For example, some processing can further improve the quality of the coating, for example with respect to crystallinity or purity. Other processing can modify the composition of the material or add additional compositions to the coating. Some additional processing can involve the application of heat, although the processing temperatures generally are significantly less than temperatures used for consolidation of powder coatings into a dense coating. For the addition of another composition to the dense coating, such processes may or may not involve the application of heat.

Since the coating is formed dense, sintering or other major compaction of the coating generally is not needed. Thus, the dense coating generally is not heated up to a flow temperature, such as a melting point or glass transition temperature. However, the material can be heated to anneal the material to improve the uniformity. This heating can result in some compaction of the material, with a corresponding increase in the density. The annealing temperature generally is no more than about 60 percent of the flow temperature, and in other embodiments no more than about 50 percent of the flow temperature in centigrade units. Such heating can remove some impurities, such as carbon impurities if the heating is performed in an oxidizing atmosphere. Generally, heating the dense coating under these conditions does not alter the structure of the material, i.e., amorphous, polycrystalline or crystalline. Suitable processing temperatures and times generally depend on the composition of the dense coating.

Following deposition of the dense layer, the precursors can be shut off such that the reactant stream only comprises a fuel and an oxygen source that reacts to form gaseous/vapor products without condensable materials. The flame resulting from the reaction of the fuel and oxygen source can be used to heat the coated substrate without depositing any additional materials on the substrate. A flame heating step can be performed between coating steps or after deposition of several layer, in which each coating layer may or may not have the same composition as other layers. An additional heating step can also be performed after removing the substrate from the reactor, as described in the following.

Heat treatments can be performed in a suitable oven. It may be desirable to control the atmosphere in the oven with respect to pressure and/or the composition of the gases. Suitable ovens comprise, for example, an induction furnace, a box furnace or a tube furnace with gas(es) flowing through the space containing the coated substrate. The heat treatment can be performed following removal of the coated substrates from the coating chamber. In alternative embodiments, the heat treatment is integrated into the coating process such that the processing steps can be performed sequentially in the apparatus in an automated fashion.

For many applications, it is desirable to apply multiple dense coatings with different compositions. In general these multiple dense coatings can be arranged adjacent to each other across the x-y plane of the substrate being coated (e.g., perpendicular to the direction of motion of the substrate relative to the product stream), or stacked one on top of the other across the z plane of the substrate being coated, or in any suitable combination of adjacent domains and stacked layers. Each coating can be applied to a desired thickness.

For some embodiments, different compositions can be deposited adjacent to each other within a layer and/or in adjacent layers. Similarly, distinct layers of different compositions can be deposited in alternating layers. Specifically, two layers with different compositions can be deposited with one on top of the other, and or additionally or alternatively, with one next to the other, such as layer A and layer B formed as AB. In other embodiments, more than two layers each with different compositions can be deposited, such as layer A, layer B and layer C deposited as three sequential (e.g., stacked one on top of the other, or adjacent to the other, or adjacent and stacked) layers ABC. Similarly, alternating sequences of layers with different compositions can be formed, such as ABABAB . . . or ABCABCABC . . . . Other combinations of layers with specific compositions and/or optical properties can be formed as desired.

The material with multiple particle coatings can be heat treated after the deposition of each layer or following the deposition of multiple layers or some combination of the two approaches. Generally, however, it may be desirable to heat treat a plurality of layers simultaneously. Specifically, heat-treating multiple layers simultaneously can reduce the time and complexity of the manufacturing process and, thus, reduce manufacturing costs. If the heating temperatures are picked at reasonable values, none of the coating materials are heated to points near their flow temperatures such that the layers or boundaries within a layer do not merge at the interface. To form patterned structures following deposition, patterning approaches, such as lithography and photolithography, along with etching, such as chemical etching, dry etching or radiation-based etching, can be used to form desired patterns in one or more layers. This patterning generally is performed on a structure prior to deposition of additional material.

While the compositions can be selected during deposition by appropriately introducing elements into the reactant stream for dense coating production, alternatively or additionally, the powder coating composition can be modified in its entirety or selected areas thereof following formation of the dense coating. This modification of the compositions can be particularly effective for porous dense coatings, although for thin enough coatings these approaches can be performed for fully dense coatings. The composition modifications of dense coatings may involve introduction of approximately stoichiometric amounts of element(s) and/or dopant(s)/additive(s). One or more additional elements can be incorporated into the dense coating by a gentle heating at an annealing temperature, such as the mild heating temperatures discussed above. The additional element(s) can be applied to the dense coating within the reaction chamber or following removal from the reaction/coating chamber. If the element(s) is applied to the dense coating following removal of the coated substrate from the reaction chamber, the additional element(s) can be applied to dense coating directly or using electro-migration deposition.

Generally, one or more modifying element is applied as a composition comprising the desired element. Any remaining elements in the compositions generally would volatilize during the heating process, although it is possible that oxygen or other non-metal/metalloid elements from the compositions may also incorporate into the dense coating. For example, metal/metalloid nitrates during the heat treatment can involve the incorporation of the metal/metalloid element into the host material and the removal of nitrogen oxides to remove the counter-ions of the composition. The composition can be applied to the dense coating as a solution, an aerosol, and/or as a powder. In general, the use of a solution can facilitate the even spread of the composition along the dense coating by the flow of the solution over and into the dense coating. The concentration of a solution can be selected to contribute to more even distribution of the composition at desired amounts of modification element through the use of a volume of liquid that appropriately wets the powder coating. Surfactants and/or choice of solvent can be used to reduce surface tension and facilitate substantially even spread of the solution. The solvent can be evaporated prior to and/or during the heat processing of the dense coating to incorporate the modification element into the dense coating. Any surfactants can be selected to volatize, for example by decomposition, during a heating step.

The reactant delivery system of the reaction chamber can be used to apply a composition to a dense coating within a reaction chamber. In particular, the composition comprising the modifying element can be applied within the coating apparatus by spraying a solution of the composition through the reactant inlet such that the composition is applied to all or selected portions of the substrate. The composition comprising the modifying element can be applied, for example, as an aerosol using an aerosol delivery system. The radiation beam can be either turned off during spraying of the composition or turned to a very low power to evaporate a portion of the solvent without reacting the composition. The reactant delivery systems described above can be adapted for the delivery of the unreacted composition. The coating process can be used to apply an approximately even coating onto the dense coating, e.g., by sweeping the substrate through a delivery stream of the solution with the modifying element at a constant rate.

Alternatively, the modifying element can be applied to the dense coating following removal of the structure from the reaction chamber. The modifying element can be applied, generally in the form of a composition, as a liquid, aerosol and/or a powder, to the dense coating, for example, by spraying, brushing, dipping or the like. As with solutions applied within the reaction chamber, the concentration and other properties of the solution can be selected to obtain even distribution of the modifying element along the dense coating and/or consolidated material. Dip coating of the dense coating can be a convenient approach for obtaining uniform distribution of composition over the dense coating.

Rather than allowing natural migration of the composition with the modifying element over and through the dense coating, an electric field can be used to drive ions of the modifying element(s) into the host matrix. Specifically, modifying element(s) can be introduced into material using electrophoretic or electro-migration deposition. In this approach, an electric field is used to drive ions into the host matrix of the dense coating. A solution containing the host ions is contacted with the dense coating. Generally, an electrode is placed behind the substrate coating while a counter electrode is placed within the solution such that ions driven toward the electrode behind the substrate are driven into the dense coating. More than one electrode of each type can be used, if desired. In addition, multiple modifying elements can be simultaneously or sequentially introduced into the dense coating by electro-migration deposition. Electro-migration deposition into a coating is described further in copending and commonly assigned U.S. patent application Ser. No. 10/195,851, entitled "Nanoparticle Production And Corresponding Structures," incorporated herein by reference.

The modifying element, e.g., a dopant(s)/additive(s), can be introduced into a selected portion of the dense coating by selectively contacting the solution with only a portion of the dense coating using solution barriers. Alternatively or additionally, a portion of the dense coating can be covered with a mask, such as conventional resist used in electronic processing, to block migration of the modifying element into the masked regions. Multiple modifying elements can be sequentially applied to the same and/or different, although optionally overlapping, portions of a coated substrate by altering the masking between electro-migration deposition of the different modifying elements.

Uses of Dense Coatings

The dense coating techniques described herein can be used effectively in a wide range of applications. To give some particular examples of different types, applications for solar cells, photocatalytic, protective hard coatings, transparent electrodes, thermal barrier coatings, dielectric films, superconductor layers, metal coatings, fuel cells, optical applications and electrical applications are discussed, as well as a general description of complex structures. In some of these applications, a dense coating can be applied across a substrate surface. For example, a single dense coating layer or portion thereof can provide the desired function possibly as a coating over or otherwise in combination with other materials. However, for some applications, one or more layers are patterned to form localized structures that can function as devices. Selected patterning can range from simple to complex and the size of devices can be selected as appropriate for particular applications.

In some applications, the coatings essentially cover substrate surface to provide desired properties. Some simple patterning can be desired to leave a portion of the surface uncoated or to provide access to the substrate from outside of the coating. However, in other applications more complex patterning is desired to form more sophisticated integrated structures.

Figure 21:
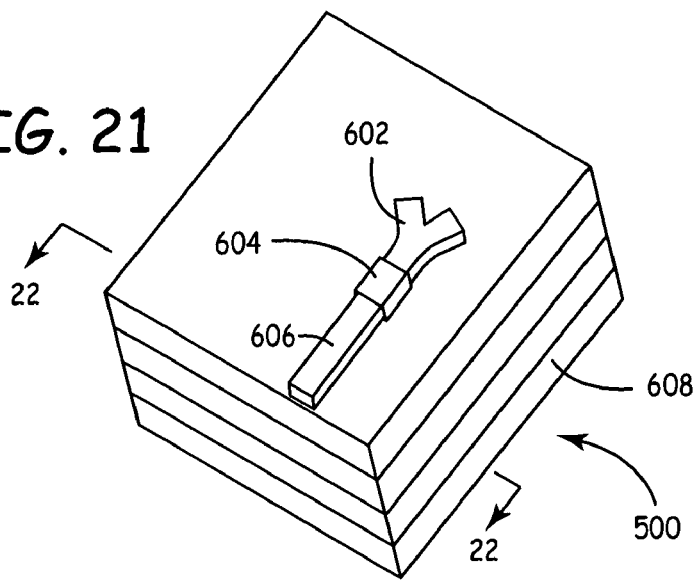
FIG. 21 is a perspective view of stacked coating layers patterned within a layer.
Figure 22:
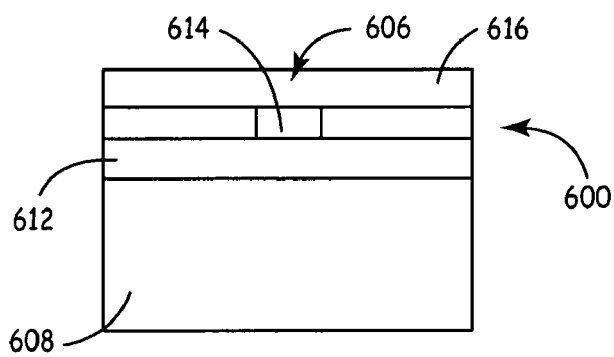
FIG. 22 is a sectional view of the patterned of FIG. 21 taken along line 22-22.

With respect to more complex patterning of materials, a patterned layer, which can be part of, for example, an electrical circuit, an optical circuit or other structure, on a substrate is shown schematically in FIGS. 21 and 22. As shown in FIG. 21, circuit 600 comprises devices 602, 604, 606 on substrate 608. A sectional view comprising device 602 is shown in FIG. 22. Device 602 comprises an under-layer material 612, a core material 614 and an over-layer material 616. In some embodiments, the under-layer and/or the over-layer may not be used. In general core material 614 can be different from under-layer material 612 and over-layer material 616 in a significant property, which may be the result of, for example, a compositional difference, a density difference, or a crystal structure difference. Under-layer material 612 may or may not be different from over-layer material 616 in composition and/or properties. In some embodiments, substrate 608 can be formed, for example, from silicon, alumina or other convenient flat materials. Common substrates are round wafers, although substrates that are square or other shapes can be used. Also, non-flat substrates can be coated, which can be particularly desirable for certain fuel cell embodiments.

Figure 23:
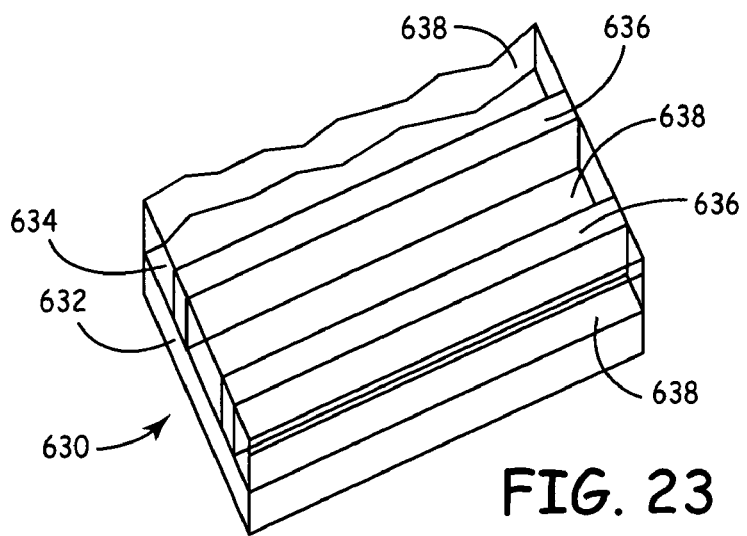
FIG. 23 is a perspective view of an alternative embodiment of a patterned layer of coating material.
Figure 24:
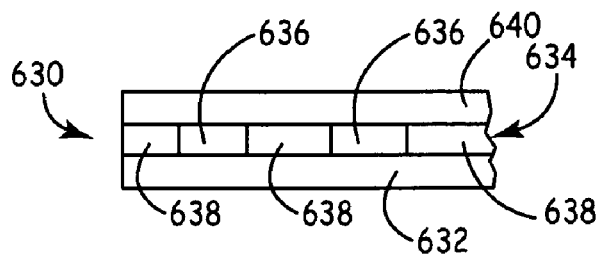
FIG. 24 is a side view of the material of FIG. 23.

In another example, with the formation of two or more layers, controlled deposition or an etching step can be performed to create a structure shown schematically in FIG. 23. The layers can be deposited using light reactive dense deposition. Contoured structure 630 comprises one or more support layers 632 adjacent the remaining portions of the structure, and one or more contoured layers 634 on support layers 632. Contoured layer 634 comprises functional structures 636 with interspersed spacing material 638. An additional over-layer material 640 can optionally be generally placed over contoured layer 634, as shown in FIG. 24. Heat treatments can be performed at appropriate points comprising before and/or after patterning. Additional planarization, such as chemical-mechanical polishing, can be performed also after the formation of one or more layers.

Figure 25:
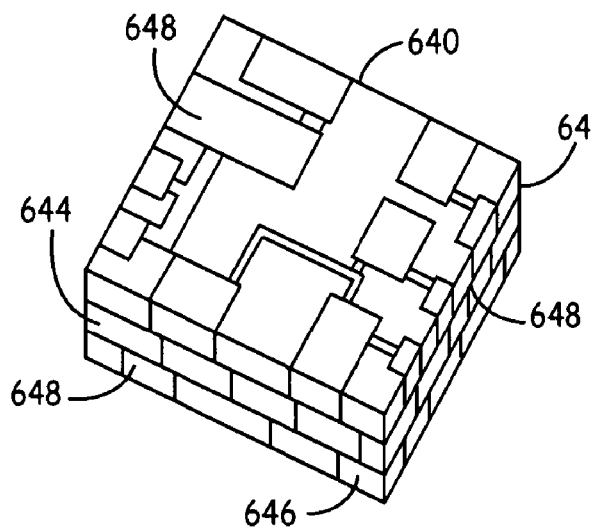
FIG. 25 is a schematic prospective view of a multiple layer integrated electrical circuit formed from contoured coating layers.
Figure 26:
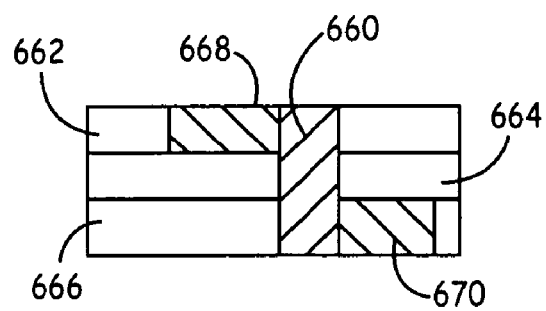
FIG. 26 is a side view of an embodiment of a patterned three coating layers.

The patterned structure can be a stacked structure comprising several vertically integrated layers, as shown in FIG. 25. Referring to FIG. 25, integrated superstructure or superlattice 650 includes three layers 652, 654, 656. Each layer generally includes a plurality of integrated devices 658. In addition, patterned structures can be used for form interconnects between layers. Referring to FIG. 26, an interlayer interconnect 660 formed with light reactive dense deposition spans three layers 662, 664, 666 and connects devices 668, 670. Interlayer interconnect 660 can be an electrical conductor, an optical material or it can have other functional characteristics.

Thin layers of titanium oxide have been shown to have photocatalytic activity in response to ultraviolet light. Appropriately thin layers of photocatalytic materials, such as crystalline titanium oxide, can provide photocatalytic layers that are transparent ot visible light, while photocatalytic activity upon exposure to ultraviolet light. Such photocatalytic activity can be exploited for the formation of self-cleaning surfaces. These self cleaning surfaces have already found significant commercial applications, such as for self-cleaning window glass. The use of embedded particles for the formation of photocatalytic surfaces is described further in U.S. Pat. No. 6,099,798 to Kambe et al., entitled Ultraviolet Light Block and Photocatalytic Materials," incorporated herein by reference. Approaches for the formation of photocatalytic coatings onto sheet glass are described further, for example, in U.S. Pat. No. 6,238,738 to McCurdy, entitled "Method for Depositing Titanium Oxide Coatings on Flat Glass," and U.S. Pat. No. 6,413,581 to Greenberg et al., entitled "Photocatalytically-Activated Self-Cleaning Article and Method of Making Same," both of which are incorporated by reference. Light reactive dense deposition is an efficient alternative approach for forming photocatalytic self-cleaning surfaces on window glass and other substrates.

Solar cells provide significant alternatives for the production of electricity. Solar cells have the basic structure of a substrate electrode, an electron donating layer, an electron accepting layer and a transparent electrode. In some solar cells structures, the electron donating and electron accepting materials are formed from appropriately doped semiconductor materials. Light reactive dense deposition is a suitable approach for the deposition of layers of doped silicon. Other materials can be used, such as carbon materials as electron acceptors. To increase the surface area, the formation of a corrugated surface has been described in U.S. Pat. No. 5,986,206 to Kambe et al., entitled "Solar Cell," incorporated herein by reference. The '206 patent describes the use of particulate electron accepting is materials using in combination with a photoconducting polymer. With light reactive dense deposition, continuous layers can be formed onto a flexible substrate. The flexible substrate than subsequently be corrugated to form a corrugated solar cell surface. Alternatively, the flexible substrate can be corrugated prior to the deposition process with the dense deposition being directly onto the corrugated substrate surface. Light reactive dense deposition can be used for the deposition of the electron accepting layer, the electron donating layer, the underlying electrode layer and/or the transparent electrode.

Transparent electrodes are important in a variety of applications, such as the solar cell application above and various display applications. Display applications that use transparent electrodes include, for example, liquid crystal displays. See, for example, U.S. Pat. No. 6,710,837 to Song et al., entitled "Liquid Crystal Displays Having Multiple Domains and a Manufacturing Method Thereof," incorporated herein by reference. Transparent electrodes provide transmission of visible light through the electrode either into the device or out from the device, while providing for electrical conduction. Generally, the transparent electrode is a counter electrode to another electrode within the device. The transparent electrode can be formed, for example, from thin layers of tin oxide, indium tin oxide (ITO), silver, gold or the like. These thin electrode coatings can be formed using light reactive dense deposition, as described above.

Dense coatings can also be used to form protective coatings, such as hard coatings. For example, aluminum oxide can for a useful hard coating to serve as a protective layer in various applications, such as semiconductor applications. The use of an aluminum oxide layer as a hard coating for an electrical circuit is described further, for example, in U.S. Pat. No. 5,055,967 to Sukonnik et al., entitled "Substrate for an Electrical Circuit System and a Circuit Using That Substrate," incorporated herein by reference.

Dense coatings can also be used as thermal barrier layers. Thermal barier coatings can be useful in a range of applications to protect the materials from high heat. Suitable structures for protection from heat include, for example, turbine blades and combustor components. Thermal barrier coatings can be formed, for example, from yttria-stabilized zirconia (zirconium oxide), lanthanum oxide, lanthanum chromate, chromium oxide, lanthanum chromate or combinations thereof Thermal barrier coatings are described further in U.S. Pat. No. 6,821,641 to Bruce et al., entitled "Article Protected by Thermal Barrier Coating Having a Sintering Inhibitor, and its Fabrication," incorporated herein by reference.

Optical devices of interest comprise, for example, optical waveguide devices, such as optical couplers, splitters, arrayed waveguide grating (AWG) and the like. Waveguides manufactured on a substrate surface are referred to as planar waveguides. Planar waveguides are useful in the production of integrated optical circuits for optical communication and other opto-electronics applications. Other optical devices of interest comprise, for example, three dimensional optical memory device, Bragg grating, optical attenuator, optical splitter/coupler, optical filter, optical switch, laser, modulator, interconnect, optical isolator, optical add-drop multiplexer (OADM), optical amplifier, optical polarizer, optical circulator, phase shifter, optical mirror/reflector, optical phase-retarder, and optical detector.

Other devices of particular interest comprise photonic crystals. Photonic crystals are ordered arrays of crystalline domains having a unit cell size of the photonic crystal ranging from about one quarter to about one optical wavelength. For example, visible light has a wavelength of about 380 nm to about 780 nm. Generally, photonic crystals of interest have size from about 100 nm to about 1000 nm. The appropriate domains can be patterned using the approaches described herein. The photonic crystals can be integrated into circuits with other optical devices. The photonic crystals can be formed from an ordered array of crystalline domains of, for example, silica, titania, zinc oxide and doped versions thereof Due to the size of the ordered arrays, the photonic crystals can have a photonic band gap that prevents propagation of light in any direction. Thus, photonic crystals can be used for control of spontaneous emission and for very sharp bending of light.

Various functional materials can be incorporated into electrical circuits or the like. Suitable functional materials include, for example, electrically conductive materials for interconnects, superconducting materials, such as yttrium barium copper oxide (YBCO), low dielectric materials for insulating adjacent functional components, high dielectric materials, semi-conducting materials and other appropriate materials. Appropriate materials can be deposited as dense coatings and patterned as described above.

Another application of particular interest related to the formation of electrochemical stacks or components thereof While suitable electrochemical cells can be batteries, fuel cells, electrolyzers or the like, fuel cells are described further as specific examples. For batteries, light reactive deposition can be used to deposit a current collector, an electroactive electrode, a separator, or a combination thereof A fuel cell generally comprises a stack with a series of individual cells. Each individual cell comprises an anode, a cathode and electrolyte separating the anode and cathode. An electrical interconnect or bipolar plate connects adjacent cells in series and can provide flow channels for reactants to the respective electrodes. The stack is generally in a suitable container that mediates flow of fuel, oxygen/oxidizing agent, heat and waste products, such as water and carbon dioxide. Current collectors at the end of the stack connect the stack to an outside circuit for power delivery. Appropriate control systems can be used to control reactant flow and other features of the fuel cell system.

Figure 27:
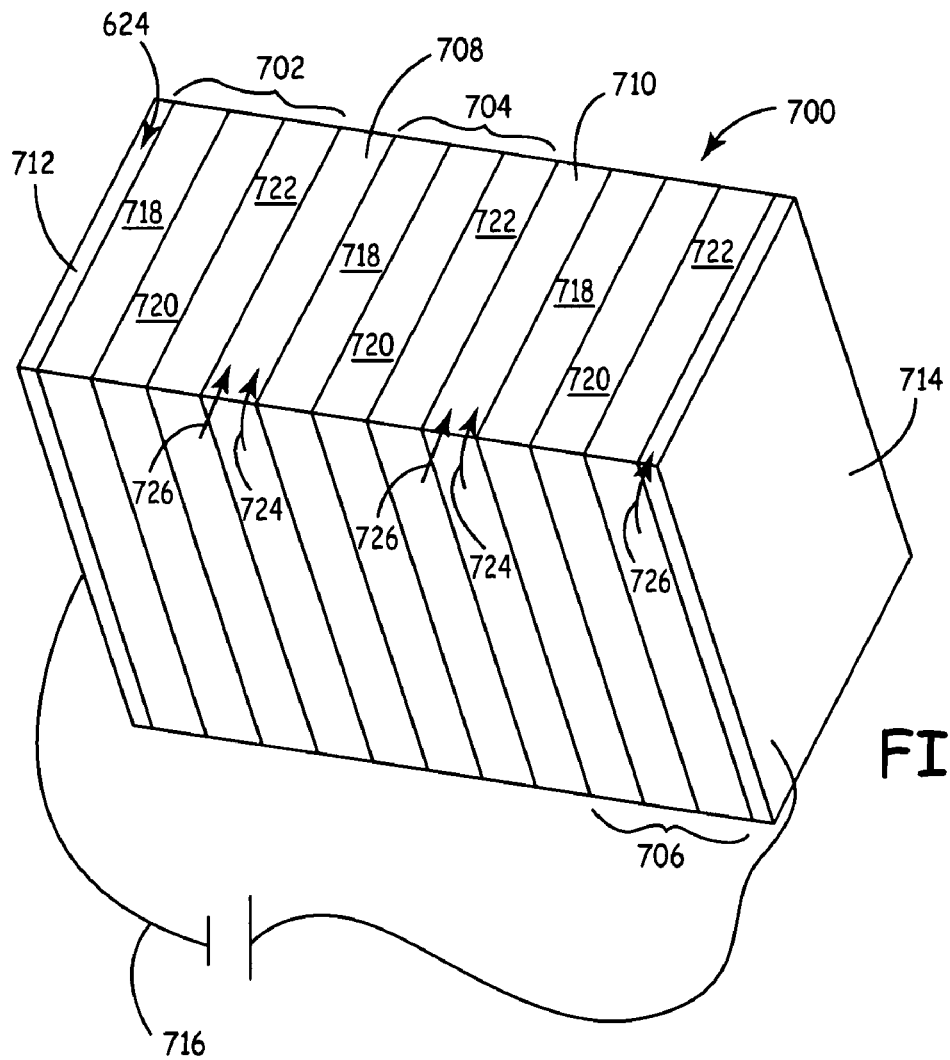
FIG. 27 is a schematic perspective view of a fuel cell stack.

Referring to FIG. 27, stack 700 has three individual cells 702, 704, 706 separated by interconnects/bipolar plates 708, 710. Current collectors 712, 714 connect to an external circuit 716. Cells 702, 704, 706 each comprise an anode 718, a cathode 720 and electrolyte 722. Interconnects/bipolar plates 708, 710 have distinct flow channels on the front and back surfaces for separate delivery of fuel to an adjacent anode and oxygen/oxidizing agent to an adjacent cathode. In some embodiments, flow channels on opposite sides of an interconnect/bipolar plate are perpendicular (cross-flow) to each other to facilitate connection to a manifold within the fuel cell container, although other structures can be adopted. In co-flow configuration, the two reactant flows are directed in the same direction through the cells, and in counter flow configurations, the reactants flow in opposite directions through the cells to reduce hot spots. Similarly, current collectors 712, 714 each provide for the delivery of a reactant to the adjacent electrode. Delivery of fuel to anodes is indicated schematically with flow lines 724, and delivery of oxygen to a cathode is indicated schematically with flow lines 726.

The bipolar plate separating the membrane electrode assemblies can be formed from stainless steel or graphite. However, stainless steel can corrode over time with a resulting loss of fuel cell performance. In addition, graphite can be hard to machine with respect to flow channels and can be relatively expensive. Thus, it can be desirable to coat a stainless steel or other inexpensive metal conductor with a corrosion resistant coating. Suitable coatings include, for example, silver, gold, platinum, palladium, copper, as well as electrically conductive metal compounds, such as TiN. Another suitable coating material is, for example, doped lanthanum chromate, where the dopant can be, for example, Sr, Ca, Mg, Y or combinations thereof. Feedstocks can comprise the metal nitrates. Multiple layers with graded compositions can be deposited to tailor the coating for desirable thermal, chemical, mechanical and electrical performance with respect to properties such as electronic conductivity, thermal expansion coefficient, adhesion, Cr vapor impermeability and chemical compatibility with the base metal as well as anode and cathode layers. The deposition of oriented films of lanthanum metal oxides by spray combustion flame pyrolysis is described in Ichinose et al., Jpn. J. App. Phys. Vol 33, pp 5907-5910 (1994), entitled "Deposition of LaMO$_3$ (M-Ni, Co, Cr, Al)-Oriented Films by Spray Combustion Flame Technique," incorporated herein by reference.

Furthermore, as noted above, the bipolar plate can be also deposited by light reactive dense deposition of suitable electrically conductive materials. The electrically conductive material can be patterned with a soluble material that is dissolved to expose flow channels within the bipolar plate. If desired an entire cell or even a stack of cells can be deposited by light reactive dense deposition.

In molten carbonate fuel cells, the oxygen is delivered along with carbon dioxide, and the fuel can be hydrogen and/or carbon monoxide. The half reactions are:

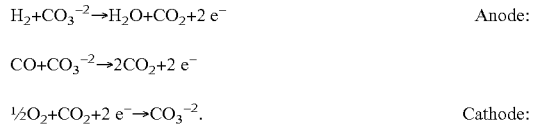

The electrolyte is a molten carbonate, such as lithium carbonate, potassium carbonate, or a mixture thereof. The electrolyte can be suspended in an electrically insulating, chemically inert ceramic matrix. The electrolyte and ceramic matrix can be codeposited by light reactive dense deposition. Due to the higher operating temperatures, the catalyst material can be nickel or a nickel-aluminum alloy for the anode and nickel oxide or other transition metal oxide doped with lithium for the cathode. The porous anode and cathode materials can be deposited as porous dense coatings using light reactive dense deposition. Molten carbonate fuel cells are described further, for example, in published U.S. Patent application 2003/0072989A to Lee et al., entitled "Molten Carbonate Fuel Cell," incorporated herein by reference.

Solid oxide fuel cells present particular opportunities and challenges. These fuel cells use a ceramic, solid electrolyte that reduces corrosion issues and eliminates electrolyte management issues associated with the use of a liquid electrolyte. Generally, oxygen is reduced at the cathode, based on the following reaction. At the anode, hydrogen, carbon monoxide or methane can be oxidized according to the reactions:

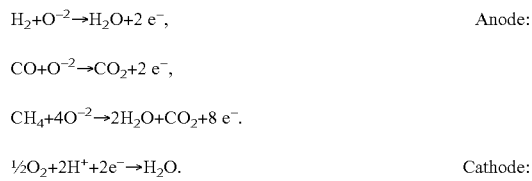

A solid oxide fuel cell uses an electrolyte that transports oxide ions O$^{-2}$ for ion transport. The electrolyte comprises oxide materials that can effectively transport oxide ions. Suitable electrolyte materials include, for example, yttria stabilized zirconia (with generally at least about 3 mole percent yttria), wherein the yttria stabilizes the cubic phase at room temperature and partially yttria stabilized zirconia having lesser amounts of yttria with a stabilized tetragonal phase. Other suitable oxide materials are described above. The interconnects can be formed from suitable materials that are conductive and stable at the cell operating temperatures. Solid oxide fuel cells generally are described further in U.S. Pat. No. 6,558,831 to Doshi et al., entitled "Solid Oxide Fuel Cell," incorporated herein by reference.

In general, fuel cell electrodes have generally been planar except for certain solid oxide fuel cells. However, the surface area can be increased by making depositing the components along a curved platen, such as a corrugated platen. The corrugated platen increases the surface area per unit length. The platen can be metal or other substrate material that is incorporated into the cell or later removed. The electrolyte/separator material can have a larger expanse such that a seal can be contacted with the electrolyte/separator. This rim can be coated with a sealant material, such as a glass or a multiple metal oxide ceramic brazing material, that is subsequently fused. In this and other embodiments with a sealing rim, the seal material can be deposited with a mask or with a nozzle sized and positioned to deposit specifically along the rim. Similarly, the material deposited on the face within the rim can be deposited with a mask or with an appropriately sized and shaped nozzle.

Solid oxide fuel cells can be formed with rod shaped electrodes with circular or oval cross sections. Components for these cells can have non-planar shapes. These components can be anodes, cathodes, such as cathodes of porous doped lanthanum manganite, or inert materials onto which an anode or cathode is placed. With a circular electrode, the electrolyte can be placed around the electrode and more complex interconnect configurations can be used to connect the cells in series. Considerations for the formation of the components is cost, strength, durability and conductivity. With a oval electrode, an interconnect can be placed along one side of the oval and an electrolyte and counter electrode can be placed along the opposite side of the oval, such that the cells can be stacked in series similar to structures with planar electrodes. Tubular electrodes for solid oxide fuel cells are described further, for example, in U.S. Pat. No. 6,379,485 to Borgium, entitled "Method of Making Closed End Ceramic Fuel Cell Tubes," incorporated herein by reference.

In some embodiments, electrolyte layers can be from about 0.1 microns to about 200 microns and electrodes can be from about 0.5 microns to about 750 microns. The thinner values can in particular be suitable for the formation of micro fuel cells. The electrodes generally are gas porous. To achieve this porosity, the electrode can have an average density from about 65 to about 85 percent of a fully densified material and in other embodiments from about 70 to about 80 percent of the fully densified material. The electrolyte and interconnects/bipolar plates generally are fully densified to prevent flow of gas through them. Thus, the gaseous reactants do not mix. A person of ordinary skill in the art will recognize that additional ranges of thickness and density are contemplated and are within the present disclosure. The formation of electrochemical cell components using a coating process is described further in copending U.S. patent application Ser. No. 10/854,931 to Home et al., entitled "Reactive Deposition for Electrochemical Cell Production," incorporated herein by reference.

As utilized herein, the term "in the range(s)" or "between" comprises the range defined by the values listed after the term "in the range(s)" or "between", as well as any and all sub-ranges contained within such range, where each such sub-range is defined as having as a first endpoint any value in such range, and as a second endpoint any value in such range that is greater than the first endpoint and that is in such range.

The embodiments described above are intended to be illustrative and not limiting. Additional embodiments are within the claims below. Although the present invention has been described with reference to specific embodiments, workers skilled in the art will recognize that changes may be made in form and detail without departing from the spirit and scope of the invention. In addition, the terms including, comprising and having as used herein are intended to have broad non-limiting scope.

What is claimed is:

1. A method for coating a substrate, the method comprising:
    reacting a flowing reactant stream initiated as a flow from a reactant nozzle by directing a radiation beam at the reactant stream to produce a product stream downstream from the radiation beam, wherein the reaction is driven by photon energy from the radiation beam wherein the reactant stream comprises a metal species or a metalloid species, wherein the radiation beam is directed to pass adjacent the substrate and wherein a concentration of product is selected to be sufficiently low to result in the deposition of coating compositions that have not coalesced into stable particulates to form a selected coating density; and
    directing the product stream at a substrate selectively positioned in the flow to coat the substrate with a coating material from the product stream at a density of at least about 65 percent of the density of the fully densified coating material wherein the depositing of the coating material comprises moving the substrate relative to the flow of the product stream.

2. The method of claim 1 wherein the flowing reactant stream comprises reactants exclusively in a vapor phase.

3. The method of claim 1 wherein the flowing reactant stream comprises aerosol reactants.

4. The method of claim 1 wherein the reactant stream comprises a compound with a plurality of metal species or metalloid species.

5. The method of claim 1 wherein the reactant stream is confined within shielding gas.

6. The method of claim 1 wherein the substrate is mounted on a conveyor and is moved relative to a reaction chamber.

7. The method of claim 1 wherein the reactant nozzle and corresponding optics are mounted on a drive with the corresponding optics oriented to direct a beam to intersect flow from the reactant nozzle and wherein the product flow is swept relative to the substrate by moving the reactant nozzle and optics.

8. The method of claim 1 wherein the density of the coating material is at least about 75 percent of the density of the fully densified coating material.

9. The method of claim 1 wherein the densily of the coating material is at least about 90 percent of the density of the fully densified coating material.

10. The method of claim 1 wherein the density of the coating material is approximately the density of the fully densified coating material.

11. The method of claim 1 wherein the substrate has a non-planar surface onto which the coating is applied.

12. The method of claim 1 wherein the coating material is non-porous.

13. The method of claim 1 wherein the coating material is amorphous.

14. The method of claim 1 wherein the coating material is crystalline.

15. The method of claim 1 wherein the coating material is single crystalline.

16. The method of claim 1 wherein the substrate is non-porous.

17. The method of claim 1 wherein reactant nozzle inlet is elongated and wherein the elongated product flow coats the substrate in one pass through the reactant flow.

18. A method for coating a substrate, the method comprising:
    depositing a non-porous coating by directing flow of a product stream to a suitably positioned substrate to deposit the coating on the substrate, wherein the product stream is formed by reacting within the flow a reactant stream that comprises a metal species or metalloid species to form the product stream, with the reactant stream being initiated from a reactant nozzle, the reaction being driven with photon energy absorbed from a radiation beam that is configured to pass adjacent the substrate, wherein the product stream is formed downstream from the radiation beam with the flow passing through the radiation beam, wherein the depositing of the coating material comprises moving the substrate relative to the flow of the product stream and wherein a concentration of product is selected to be sufficiently low to result in the deposition of coating compositions that have not coalesced into stable particulate to form a selected coating density.

19. The method of claim 18 wherein the reactant stream is generated from a reactant nozzle inlet that is elongated and wherein the elongated product flow coats the substrate in one pass through the reactant flow.

20. A method for coating a substrate, the method comprising:
    depositing a coating material to form a coating having a density of at least about 65 percent of the density of the fully densified coating material, wherein the coating is deposited from a product composition in a reactor, wherein product composition is within a product stream that is formed by reacting a reactant stream that comprises a metal species or metalloid species, with the reactant stream being initiated from a reactant nozzle, in which the reaction is driven with photon energy absorbed from a radiation beam that is configured to pass adjacent the substrate, wherein the product stream is formed downstream from the radiation beam with the flow passing through the radiation beam, wherein the depositing of the coating comprises moving the product stream relative to the substrate, wherein the depositing of the coating material comprises moving the substrate relative to the flow of the product stream and wherein a concentration of product is selected to be sufficiently low to result in the deposition of coating compositions that have not coalesced into stable particulates to form a selected coating density.

21. The method of claim 20 wherein the depositing of the coating material comprises directing the product stream at the substrate that is suitably positioned.

22. The method of claim 20 wherein the substrate is mounted on a conveyor and is moved relative to a reaction chamber.

23. The method of claim 20 wherein the reactant nozzle and corresponding optics are mounted on a mount with the corresponding optics oriented to direct a beam to intersect flow from the reactant nozzle and wherein the product flow is swept relative to the substrate by moving the reactant nozzle and optics.

24. The method of claim 20 wherein reactant nozzle inlet is elongated and wherein the elongated product flow coats the substrate in one pass through the reactant flow.

* * * * *